US012581735B2

(12) United States Patent
Park et al.

(10) Patent No.: US 12,581,735 B2
(45) Date of Patent: Mar. 17, 2026

(54) DISPLAY DEVICE AND MANUFACTURING METHOD OF THE SAME

(71) Applicant: Samsung Display Co., LTD., Yongin-si (KR)

(72) Inventors: Jeong Su Park, Asan-si (KR); Jin Taek Kim, Yongin-si (KR); Hyun Kim, Seoul (KR); Sung Jin Lee, Yongin-si (KR); Jong Chan Lee, Suwon-si (KR); Woong Hee Jeong, Seoul (KR); Jung Eun Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 689 days.

(21) Appl. No.: 17/955,813

(22) Filed: Sep. 29, 2022

(65) Prior Publication Data

US 2023/0253412 A1     Aug. 10, 2023

(30) Foreign Application Priority Data

Feb. 7, 2022     (KR) ........................ 10-2022-0015297

(51) Int. Cl.
H10D 86/60          (2025.01)
H01L 23/00          (2006.01)
          (Continued)

(52) U.S. Cl.
CPC ............. H10D 86/60 (2025.01); H01L 24/03 (2013.01); H01L 24/05 (2013.01); H01L 24/06 (2013.01);
          (Continued)

(58) Field of Classification Search
CPC .. H10D 86/60; H10D 86/0231; H10D 86/451; H10D 86/441; H10D 86/423; H10D 89/931; H10D 86/443; H10D 86/411; H01L 24/05; H01L 25/167; H01L 25/0753; H01L 24/06; H01L 24/03; H01L 23/544; H01L 2224/05082; H01L 2224/0518; H01L 2924/0549; H01L 2224/05083;
          (Continued)

(56) References Cited

U.S. PATENT DOCUMENTS

| | | | |
|---|---|---|---|
| 11,943,976 B2 | 3/2024 | Son et al. | |
| 2010/0149473 A1* | 6/2010 | Guo ...................... | G02F 1/1345 349/122 |

(Continued)

FOREIGN PATENT DOCUMENTS

| | | |
|---|---|---|
| KR | 10-2021-0008768 | 1/2021 |
| KR | 10-2021-0035357 A | 4/2021 |

(Continued)

*Primary Examiner* — Mouloucoulaye Inoussa
(74) *Attorney, Agent, or Firm* — Womble Bond Dickinson (US) LLP

(57) ABSTRACT

A display device includes a substrate including a display area and a pad area; a first conductive layer including a first pad electrode in the pad area; and a second conductive layer the second conductive layer includes a second pad electrode on the first pad electrode in the pad area; the first pad electrode and the second pad electrode overlap in a first direction that is a thickness direction, and do not overlap in a second direction perpendicular to the first direction.

20 Claims, 42 Drawing Sheets

(51) Int. Cl.
| | |
|---|---|
| *H01L 25/16* | (2023.01) |
| *H10D 86/01* | (2025.01) |
| *H10D 86/40* | (2025.01) |
| *H10H 20/831* | (2025.01) |
| *H10H 20/01* | (2025.01) |

(52) U.S. Cl.
CPC ....... *H01L 25/167* (2013.01); *H10D 86/0231* (2025.01); *H10D 86/441* (2025.01); *H10D 86/451* (2025.01); *H10H 20/831* (2025.01); *H01L 2224/03019* (2013.01); *H01L 2224/0362* (2013.01); *H01L 2224/05018* (2013.01); *H01L 2224/05022* (2013.01); *H01L 2224/05082* (2013.01); *H01L 2224/05083* (2013.01); *H01L 2224/05124* (2013.01); *H01L 2224/05138* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/0518* (2013.01); *H01L 2224/05553* (2013.01); *H01L 2224/05558* (2013.01); *H01L 2224/05566* (2013.01); *H01L 2224/05573* (2013.01); *H01L 2224/05624* (2013.01); *H01L 2224/05686* (2013.01); *H01L 2224/0603* (2013.01); *H01L 2924/0106* (2013.01); *H01L 2924/0549* (2013.01); *H10H 20/032* (2025.01)

(58) Field of Classification Search
CPC . H01L 2224/05022; H01L 2224/05147; H01L 2224/05138; H01L 2224/05553; H01L 2224/05566; H01L 2224/0362; H01L 2224/05171; H01L 2224/05166; H01L 2224/05144; H01L 2224/05558; H01L 2224/05124; H01L 2224/05686; H01L 2224/05018; H01L 2224/03019; H01L 2924/0106; H01L 2224/05624; H01L 2224/0603; H01L 2224/05573; H01L 2224/05155; H01L 2223/54426; H10H 20/831; H10H 20/032; H10H 20/857; G02F 1/1345; G02F 1/136204; G02F 1/136286; G02F 1/1368; H10K 59/1213; H10K 59/123; H10K 50/814; H10K 59/126; H10K 71/00; H10K 50/824; H10K 50/80; H10K 59/80522; H10K 59/131; H10K 59/1201; H10K 59/122
See application file for complete search history.

(56) References Cited

U.S. PATENT DOCUMENTS

| | | | | |
|---|---|---|---|---|
| 2015/0008432 A1* | 1/2015 | Kim | ..................... | H10D 86/441 |
| | | | | 257/48 |
| 2015/0162351 A1* | 6/2015 | Hiwatashi | .............. | H10D 99/00 |
| | | | | 257/43 |
| 2017/0186831 A1* | 6/2017 | Nam | .................. | H10K 59/1213 |
| 2018/0031894 A1* | 2/2018 | Kim | ..................... | H10D 30/6723 |
| 2019/0097171 A1* | 3/2019 | Park | ..................... | H10K 59/40 |
| 2019/0229177 A1* | 7/2019 | Kim | ..................... | H10D 86/60 |
| 2019/0279544 A1* | 9/2019 | Shin | ..................... | G09G 3/006 |
| 2020/0006452 A1* | 1/2020 | Lee | ..................... | H10K 59/1213 |
| 2020/0219960 A1* | 7/2020 | Park | ..................... | H10K 59/124 |
| 2020/0266260 A1* | 8/2020 | Park | ..................... | H10D 30/6734 |
| 2020/0363466 A1* | 11/2020 | Cheon | .................. | H10K 59/131 |
| 2021/0082343 A1* | 3/2021 | Lee | ..................... | H10K 59/131 |
| 2021/0202890 A1* | 7/2021 | Kim | ..................... | H10N 30/857 |
| 2021/0215985 A1* | 7/2021 | Shin | .................. | G02F 1/136263 |
| 2021/0313498 A1* | 10/2021 | Kim | .................. | H01L 25/0753 |
| 2021/0343811 A1* | 11/2021 | Kim | ..................... | H10K 59/124 |
| 2022/0139970 A1* | 5/2022 | Kim | ..................... | H10D 86/451 |
| | | | | 257/72 |
| 2022/0173198 A1* | 6/2022 | Kim | .................. | H10K 59/1213 |
| 2022/0208901 A1* | 6/2022 | Cha | ..................... | H10K 59/131 |
| 2023/0317882 A1 | 10/2023 | Lee et al. | | |

FOREIGN PATENT DOCUMENTS

| | | |
|---|---|---|
| KR | 10-2021-0054117 | 5/2021 |
| KR | 10-2023-0141985 | 10/2023 |

* cited by examiner

PAD: S-PAD, I-PAD, D-PAD, VL1-PAD, VL2-PAD

DR3

DR1

DR2

RME: RME1, RME2
CNE: CNE1, CNE2
BP: BP1, BP2

100: BML, VL1, VL2, PE1
200: ACT
300: GE, SE, DE, CDP1, PE2
RME: RME1, RME2
CNE: CNE1, CNE2, PE3
PAD: PE1, PE2, PE3

100: DL, SL, DLT, SLT
CTP: CTP1, CTP2
PAD: D-PAD, S-PAD

100: SL, PE1
300: PE2
CNE: PE3
D-PAD: PE1, PE2, PE3

100: PE1
300: PE2
CNE: PE3
D-PAD: PE1, PE2, PE3

1

PE3
PE2
GI
BL
PE1
SUB

X3

X3'

DR3
DR2
DR1

100: PE1
300: PE2
CNE: PE3
D-PAD: PE1, PE2, PE3

100: PE1, DLT
300: PE2
CNE: PE3
S-PAD: PE1, PE2, PE3

100: BML, VL1, VL2, PE1

100: DL, SL, DLT, PE1, SLT

DR3

100: BML, VL1, VL2, PE1
200: ACT

DR3

100: BML, VL1, VL2, PE1
200: ACT
300: GE, SE, DE, CDP1, PE2

100: BML, VL1, VL2, PE1
200: ACT
300: GE, SE, DE, CDP1, PE2

1

DA | PDA

VIA'
PVX
BL
SUB

CNT12
CNT11 GE CNT11    CNT12    CTP
PVX
BL

SE  GI  BML    ACT    VL1  DE    VL2  GI CDP1    GI PE2  PE1

DR3

100: BML, VL1, VL2, PE1
200: ACT
300: GE, SE, DE, CDP1, PE2

100: BML, VL1, VL2, PE1
200: ACT
300: GE, SE, DE, CDP1, PE2

100: PE1, DLT
300: PE2
CNE: PE3
D-PAD: PE1, PE2, PE3

100: BML, VL1, VL2, PE1
200: ACT
300: GE, SE, DE, CDP1, PE2

100: BML, VL1, VL2, PE1
200: ACT
300: GE, SE, DE, CDP1, PE2
RME: RME1, RME2

100: BML, VL1, VL2, PE1
200: ACT
300: GE, SE, DE, CDP1, PE2
RME: RME1, RME2

100: BML, VL1, VL2, PE1
200: ACT
300: GE, SE, DE, CDP1, PE2
RME: RME1, RME2

100: BML, VL1, VL2, PE1
200: ACT
300: GE, SE, DE, CDP1, PE2
RME: RME1, RME2

100: BML, VL1, VL2, PE1
200: ACT
300: GE, SE, DE, CDP1, PE2
RME: RME1, RME2

1_1

101: SL, DL, DLT, PE1_1
300: PE2
D-PAD_1: PE1_1, PE2

101: PE1_1
300: PE2
CNE: PE3
D-PAD_1: PE1_1, PE2, PE3

102: SL, DL, DLT, PE1_2
300: PE2
D-PAD_2: PE1_2, PE2

102: PE1_2
300: PE2
CNE: PE3
D-PAD_2: PE1_2, PE2, PE3

DISPLAY DEVICE AND MANUFACTURING METHOD OF THE SAME

CROSS-REFERENCE TO RELATED APPLICATION(S)

This application claims priority to and benefits of Korean Patent Application No. 10-2022-0015297 under 35 U.S.C. § 119 filed on Feb. 7, 2022 in the Korean Intellectual Property Office, the entire contents of which are incorporated herein by reference.

BACKGROUND

1. Technical Field

The disclosure relates to a display device and a manufacturing method of the same.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, for example, light emitting diodes (LED), and examples of the light emitting diode may include an organic light emitting diode (OLED) using an organic material as a fluorescent material and an inorganic light emitting diode using an inorganic material as a fluorescent material.

An inorganic light emitting diode using an inorganic semiconductor as a fluorescent material has an advantage in that it has durability even in a high temperature environment, and has higher efficiency of blue light than an organic light emitting diode.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device with improved lighting efficiency of pixels.

Aspects of the disclosure also provide a method of manufacturing a display device with improved lighting efficiency of pixels.

However, aspects of the disclosure are not limited to those set forth herein. The above and other aspects of the disclosure will become more apparent to one of ordinary skill in the art to which the disclosure pertains by referencing the detailed description of the disclosure given below.

According to an embodiment of the disclosure, a display device may include, a substrate including a display area and a pad area; a first conductive layer disposed on the substrate, the first conductive layer including a first signal line disposed in the display area and a first pad electrode disposed in the pad area; a buffer layer disposed on the first conductive layer; a semiconductor layer disposed on the buffer layer in the display area; a gate insulating layer disposed on the semiconductor layer; and a second conductive layer disposed on the gate insulating layer; the second conductive layer may include a gate electrode overlapping the semiconductor layer in the display area; a first electrode overlapping on a side of the semiconductor layer in the display area and electrically connected to the first signal line through a contact hole penetrating the buffer layer and the gate insulating layer; a second electrode disposed on another side of the semiconductor layer in the display area; and a second pad electrode disposed on the first pad electrode in the pad area; the first pad electrode and the second pad electrode may overlap in a first direction that is a thickness direction, and may not overlap in a second direction perpendicular to the first direction.

In an embodiment, a width of the first pad electrode in the second direction may be substantially the same as a width of the second pad electrode in the second direction.

In an embodiment, an area of the first pad electrode and an area of the second pad electrode may be substantially the same in a plan view.

In an embodiment, a width of the first pad electrode in the second direction may be greater than a width of the second pad electrode in the second direction.

In an embodiment, an area of the first pad electrode may be larger than an area of the second pad electrode in a plan view.

In an embodiment, the semiconductor layer, the gate electrode, the first electrode, and the second electrode may form a transistor, and the first pad electrode and the second pad electrode may form pads, the display device including a driver applying a data signal and a scan signal to the transistor, and the pads may include a data pad receiving the data signal from the driver and a scan pad receiving the scan signal from the driver.

In an embodiment, the first conductive layer may include a data line transmitting the data signal from the data pad and a scan line transmitting the scan signal from the scan pad, the data pads may be spaced apart from each other, the scan pads may be spaced apart from each other, and the scan line extends across a space between the data pads.

In an embodiment, the scan line and the first pad electrode of the data pad may be spaced apart from each other.

In an embodiment, the first conductive layer may include a data check line extending from the first pad electrode of the data pad, and the data check line extends across a space between the scan pads.

In an embodiment, the data check line and the first pad electrode of the scan pad may be spaced apart from each other.

In an embodiment, the buffer layer may be disposed between the first pad electrode and the second pad electrode in the pad area, the first pad electrode and the second pad electrode may be electrically connected through a pad contact hole penetrating the buffer layer.

In an embodiment, a display device may further include, a via insulating layer disposed on the second conductive layer in the display area; an electrode disposed on the via insulating layer in the display area; a first insulating layer disposed on the electrode; and a light emitting element disposed on the first insulating layer in the display area.

In an embodiment, a display device may further include, a connection electrode layer disposed on the light emitting element, the connection electrode layer including a connection electrode electrically connected to the light emitting element in the display area and a third pad electrode disposed on the second pad electrode in the pad area.

In an embodiment, the third pad electrode may be electrically connected to the second pad electrode.

In an embodiment, the pad contact hole may be provided in plural.

According to an embodiment of the disclosure, a manufacturing method of a display device, may include, preparing a substrate including a display area and a pad area; forming a first conductive layer disposed on the substrate, the first conductive layer including a first signal line disposed in the display area and a first pad electrode disposed in the pad area; forming a buffer layer disposed on the first conductive layer; forming a semiconductor layer disposed on the buffer layer in the display area; forming a gate insulating layer disposed on the semiconductor layer; and forming a second conductive layer disposed on the gate insulating layer, the second conductive layer may include a gate electrode overlapping the semiconductor layer in the display area; a first electrode overlapping on a side of the semiconductor layer in the display area and electrically connected to the first signal line through a contact hole penetrating the buffer layer and the gate insulating layer; a second electrode disposed on another side of the semiconductor layer in the display area; and a second pad electrode disposed on the first pad electrode in the pad area, the first pad electrode and the second pad electrode may overlap in a first direction that is a thickness direction, and may not overlap in a second direction perpendicular to the first direction.

In an embodiment, a width of the first pad electrode in the second direction may be substantially the same as a width of the second pad electrode in the second direction.

In an embodiment, an area of the first pad electrode and an area of the second pad electrode may be substantially the same in a plan view.

In an embodiment, a width of the first pad electrode in the second direction may be greater than a width of the second pad electrode in the second direction.

In an embodiment, wherein an area of the first pad electrode may be larger than an area of the second pad electrode in a plan view.

In a display device according to one embodiment, connection efficiency between a pad and a driver may be improved.

The method of manufacturing a display device according to one embodiment may provide a display device with improved connection efficiency between a pad and a driver.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
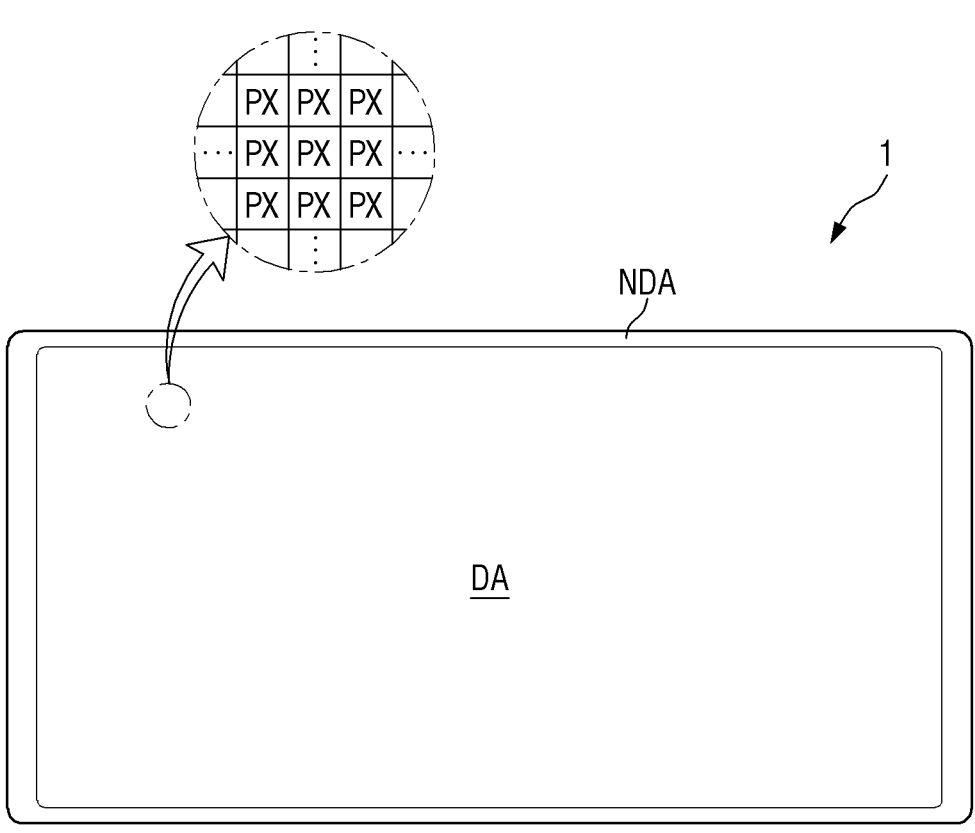
FIG. 1 is a schematic plan view of a display device according to one embodiment.
Figure 1:
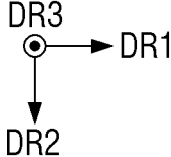

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers may indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Features of each of various embodiments of the disclosure may be partially or entirely combined with each other and may technically variously interwork with each other, and respective embodiments may be implemented independently of each other or may be implemented together in association with each other.

Hereinafter, illustrative embodiments will be described in detail with reference to the accompanying drawings.

FIG. 1 is a schematic plan view of a display device according to one embodiment.

A first direction DR1, a second direction DR2, and a third direction DR3 are defined as shown in FIG. 1. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an upward and downward direction (for example, a thickness direction) in the drawing. In the following specification, unless otherwise stated, "direction" may refer to both of directions extending along the direction. Further, in case that it is necessary to distinguish both "directions" extending in both sides, one side will be referred to as "one side in the direction" and the other side will be referred to as "the other side in the direction." Referring to FIG. 1, a direction in which an arrow is directed is referred to as one side or a side, and the opposite direction is referred to as the other side or another side.

Referring to FIG. 1, a display device 1 according to one embodiment displays a moving image or a still image. The display device 1 may refer to any electronic device providing a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 1 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but the disclosure is not limited thereto, and other display panels may be applied within the same scope of the disclosure.

The shape of the display device 1 may be variously modified. For example, the display device 1 may have a shape such as a rectangular shape elongated in a horizontal direction, a rectangular shape elongated in a vertical direction, a square shape, a quadrilateral shape with rounded corners (vertices), other polygonal shapes and a circular shape. The shape of a display area DA of the display device 1 may also be similar to the overall shape of the display device 1. FIG. 1 illustrates the display device 1 having a rectangular shape elongated in the second direction DR2. It is to be understood that the shapes disclosed herein may also include shapes substantial to the shapes disclosed herein.

The display device 1 may include the display area DA and a non-display area NDA. The display area DA is an area where a screen can be displayed, and the non-display area NDA is an area where a screen is not displayed. The display area DA may also be referred to as an active region, and the non-display area NDA may also be referred to as a non-active region. The display area DA may substantially occupy the center of the display device 1.

The display area DA may include pixels PX. The pixels PX may be arranged (or disposed) in a matrix. The shape of each pixel PX may be a rectangular or square shape in a plan view. However, the disclosure is not limited thereto, and it may be a rhombic shape in which each side is inclined with respect to one direction or a direction. The pixels PX may be arranged in a stripe type or an island type. Each of the pixels PX may include one or more light emitting elements ED that emit light of a given wavelength band to display a given color. In an embodiment, the pixels PX may include pixels PX that emit first color light, pixels PX that emit second color light, and pixels PX that emit third color light. The pixel PX that emits the first color may include a light emitting element ED that emits the first color, the pixel PX that emits the second color may include a light emitting element ED that emits the second color, and the pixel PX that emits the third color may include a light emitting element ED that emits the third color, but the disclosure is not limited thereto. The first color may be blue, the second color may be green, and the third color may be red. A detailed description of the light emitting element ED will be given later.

The non-display area NDA may be disposed around the display area DA. The non-display area NDA may completely or partially surround the display area DA. The display area DA may have a rectangular shape, and the non-display area NDA may be disposed adjacent to four sides of the display area DA. The non-display area NDA may form a bezel of the display device 1. Wires or circuit drivers included in the display device 1 may be disposed in the non-display area NDA, or external devices may be mounted thereon. Hereinafter, the arrangement of the wires of the display device 1 according to one embodiment will be described.

Figure 2:
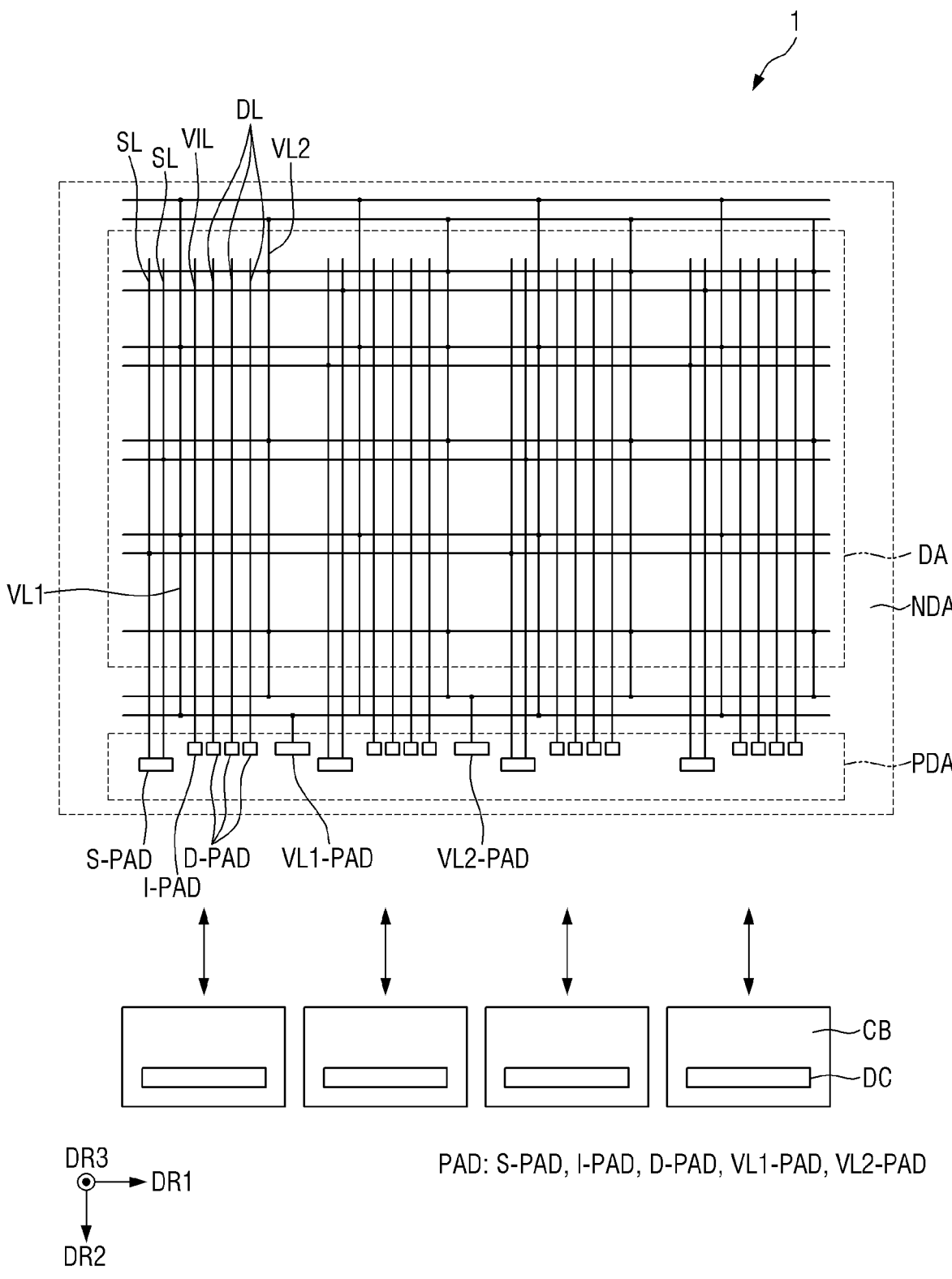
FIG. 2 is a schematic circuit diagram schematically illustrating a circuit structure of the display device according to the embodiment shown in FIG. 1.

FIG. 2 is a schematic circuit diagram schematically illustrating a circuit structure of the display device according to the embodiment shown in FIG. 1.

Referring to FIG. 2, the display device 1 may include wires. The wires may include a first voltage line VL1, a second voltage line VL2, a data line DL, a scan line SL, and an initialization voltage line VIL. Although not shown in the drawing, other wires may be further provided in the display device 1. The wires included in the display device 1 may be formed of a first conductive layer 100 or a second conductive layer 300 of a circuit element layer to be described later.

The wires may be connected to pads PAD disposed in a pad area PDA of the display device 1. For example, the first voltage line VL1 may be connected to a first voltage pad VL1-PAD, the second voltage line VL2 may be connected to a second voltage pad VL2-PAD, the data line DL may be connected to a data pad D-PAD, the scan line SL may be connected to a scan pad S-PAD, and the initialization voltage line VIL may be connected to an initialization voltage pad I-PAD.

As shown in FIG. 2, the pads PAD may be electrically connected to a driver including a circuit board CB and a driving circuit DC. For example, terminals for electrical contact may be formed in the driver, and the pads PAD of the display device 1 may be electrically connected to the terminals of the driver. The driver may apply a data signal or a scan signal to the pixel PX of the display device 1. In other words, the driver may include a scan driver that applies a scan signal and a data driver that applies a data signal.

The term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The scan line SL may be plural in number, and each of these scan lines SL may extend in the first direction DR1. Each of the scan lines SL may further include a portion extending in the second direction DR2. In an embodiment, the portion of the scan line SL extending in the first direction DR1 and the portion thereof extending in the second direction DR2 may be formed of conductive layers disposed in different layers, but are not limited thereto. One end or an end of each scan line SL extending in the second direction DR2 may be connected to the scan pad S-PAD which is connected to the scan driver. Each scan line SL may be disposed to extend from the pad area PDA disposed in the non-display area NDA to the display area DA.

The data line DL may be plural in number, and each of these data lines may extend in the second direction DR2. The data lines DL may be disposed adjacent to each other, and each of these data lines DL may be disposed to extend from the pad area PDA disposed in the non-display area NDA to the display area DA.

The initialization voltage line VIL may extend in the second direction DR2. The initialization voltage line VIL may be disposed to be spaced apart from the data line DL. The initialization voltage line VIL may be disposed to extend from the pad area PDA disposed in the non-display area NDA to the display area DA.

The first voltage line VL1 and the second voltage line VL2 may extend in the second direction DR2. The first voltage line VL1 and the second voltage line VL2 may further include a portion extending in the first direction DR1. In an embodiment, the portion of the first voltage line VL1 and the second voltage line VL2 extending in the first direction DR1 and the portion thereof extending in the second direction DR2 may be made of conductive layers disposed in different layers, but the disclosure is not limited thereto. In an embodiment, the first voltage line VL1 and the second voltage line VL2 may have a mesh structure, but the disclosure is not limited thereto.

The data line DL, the initialization voltage line VIL, the first voltage line VL1, and the second voltage line VL2 may be electrically connected to at least one pad PAD. Each pad PAD may be disposed in the pad area PDA included in the non-display area NDA. In an embodiment, the pad area PDA may be disposed in the non-display area NDA which is disposed adjacent to a first long side (long side on one side or a side in the second direction DR2 in FIG. 1) of the display device 1, but is not limited thereto.

The pad PAD may include the scan pad S-PAD connected to the scan line SL, the data pad D-PAD connected to the data line DL, the initialization voltage pad I-PAD connected to the initialization voltage line VIL, the first voltage pad VL1-PAD connected to the first voltage line VL1, and the second voltage pad VL2-PAD connected to the second voltage line VL2. For simplicity of description, the following description will focus on the scan line SL and the data line DL.

As described above, the aforementioned driver may be mounted on the pad PAD as an external device. The driver may be mounted on the pad PAD through an anisotropic conductive film, ultrasonic bonding, or the like within the spirit and the scope of the disclosure.

Each pixel PX of the display device 1 may include a pixel driving circuit. The above-described wires may pass through each pixel PX or the vicinity thereof to apply a driving signal to each pixel driving circuit. The pixel driving circuit may include transistors and capacitors. The number of the transistors and the capacitors of each pixel driving circuit may be variously modified. Further, FIG. 2 is a diagram illustrating the connection between the wires and the pads PAD, and the arrangement of the pads PAD in the pad area PDA shown in FIG. 2 may be different from actual arrangement.

Hereinafter, the structure of the pixel PX disposed in the display area DA of the display device 1 will be described.

Figure 3:
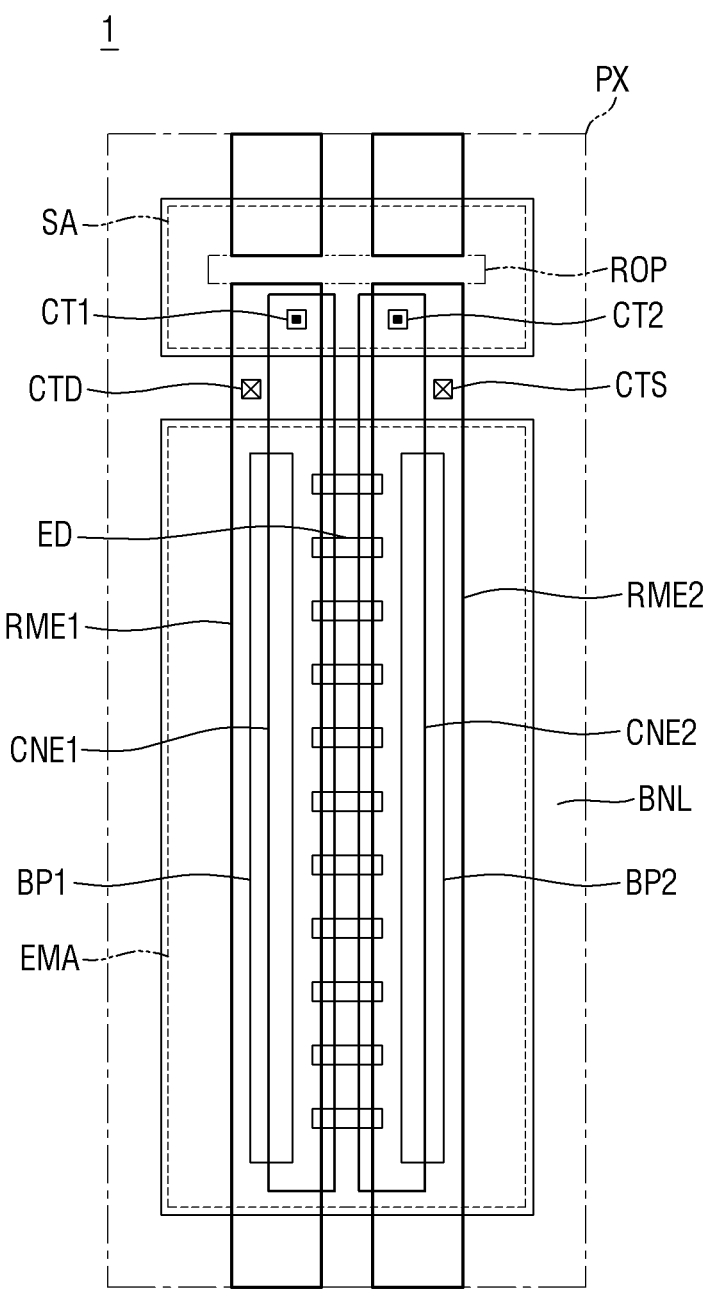
FIG. 3 is a plan diagram schematically illustrating the structure of a pixel of a display device according to the embodiment shown in FIG. 1.
Figure 3:
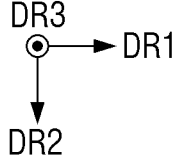

FIG. 3 is a plan diagram schematically illustrating the structure of a pixel of a display device according to the embodiment shown in FIG. 1.

Referring to FIG. 3, one pixel PX of the display device 1 according to one embodiment may include light emitting elements ED, an alignment electrode layer RME, a connection electrode layer CNE, an inner bank BP, and an outer bank BNL. The light emitting elements ED, the alignment electrode layer RME, the connection electrode layer CNE, the inner bank BP, and the outer bank BNL may be disposed for each pixel PX.

Each pixel PX of the display device 1 may include an emission area EMA and a non-emission area. The emission area EMA may be defined as an area in which light emitted from a light emitting element ED is emitted, and the non-emission area may be defined as an area in which light is not emitted because the light emitted from the light emitting element ED does not reach there.

The emission area EMA may include an area in which the light emitting element ED is disposed and an area adjacent thereto. The emission area EMA may further include a region in which the light emitted from the light emitting element ED is reflected or refracted by another member and emitted.

Each pixel PX may further include a sub-region SA disposed in the non-emission area. The light emitting element ED may not be provided in the sub-region SA. The sub-region SA may be disposed on one side or a side or the other side or another side of the emission area EMA in the second direction DR2 within one pixel PX in a plan view. For example, the sub-region SA may be disposed above the emission area EMA in one pixel PX in a plan view. The sub-region SA may be disposed between the emission areas EMA of the pixels PX adjacent to each other in the second direction DR2.

The sub-region SA may include a region in which a first alignment electrode RME1 and a second alignment electrode RME2 of the alignment electrode layer RME are respectively electrically connected to a first connection electrode CNE1 and a second connection electrode CNE2 of the connection electrode layer CNE through contact portions.

The sub-region SA may include a separation portion ROP. The separation portion ROP may be a region in which the alignment electrode layers RME included in the pixels PX adjacent to each other in the second direction DR2 are separated from each other.

The alignment electrode layer RME may be disposed over the emission area EMA and the sub-region SA. The alignment electrode layer RME may include electrodes extending in the second direction DR2 and spaced apart from each other in the first direction DR1. For example, the alignment electrode layer RME may include the first alignment electrode RME1 and the second alignment electrode RME2.

The first alignment electrode RME1 and the second alignment electrode RME2 may be disposed over the emission area EMA and the sub-region SA of each pixel PX, and in the separation portion ROP located or disposed in the sub-region SA, they may be respectively spaced apart from the first alignment electrode RME1 and the second alignment electrode RME2 belonging to the pixel PX neighboring in the second direction DR2.

The first alignment electrode RME1 and the second alignment electrode RME2 separated in the separation portion ROP of each pixel PX may generate an electric field using alignment lines extending in the second direction DR2 in a process of aligning the light emitting elements ED in a manufacturing process of the display device 1 to be described later, and the light emitting elements ED may be aligned by receiving a dielectrophoretic force due to the electric field generated on the alignment lines. After the alignment process for the light emitting elements ED is performed, the alignment lines may be separated in the separation portion ROP located or disposed in the sub-region SA of each pixel PX to form the first alignment electrode RME1 and the second alignment electrode RME2 separated in the separation portion ROP of each pixel PX, as shown in FIG. 3.

The first alignment electrode RME1 may be electrically connected to the circuit element layer to be described later through a first electrode contact hole CTD. The second alignment electrode RME2 may be electrically connected to the circuit element layer to be described later through a second electrode contact hole CTS.

As the first alignment electrode RME1 is electrically connected to the circuit element layer through the first electrode contact hole CTD and the second alignment electrode RME2 is electrically connected to the circuit element layer through the second electrode contact hole CTS, an electrical signal may be transmitted to both ends of the light emitting element ED via the first alignment electrode RME1 and the second alignment electrode RME2. In an embodiment, the first electrode contact hole CTD and the second electrode contact hole CTS may overlap the outer bank BNL to be described later in the third direction DR3, but are not limited thereto.

The outer bank BNL may be disposed over the boundary of each pixel PX to distinguish the neighboring pixels PX and distinguish the emission area EMA and the sub-region SA. The outer bank BNL may be disposed in a grid pattern in a plan view, including portions extending in the first direction DR1 and the second direction DR2 in a plan view.

The outer bank BNL may be formed to have a height larger than that of the inner bank BP to be described later so that ink in which the light emitting elements ED are dispersed may not be mixed into the adjacent pixel PX but be injected into the emission area EMA in an inkjet printing process for aligning the light emitting elements ED during the manufacturing process for the display device 1. For example, the outer bank BNL may be disposed to surround the sub-region SA and the emission area EMA to distinguish the sub-region SA and the emission area EMA, and may serve to guide the ink in which the light emitting elements ED are dispersed to be stably injected into the emission area EMA without being injected into the sub-region SA in the inkjet printing process for aligning the light emitting elements ED.

The inner bank BP may include a first inner bank BP1 and a second inner bank BP2 that are disposed in the emission area EMA enclosed by the outer bank BNL and are spaced apart from each other. Each of the first inner bank BP1 and the second inner bank BP2 may extend in the second direction DR2. The first inner bank BP1 and the second inner bank BP2 may be spaced apart from each other in the first direction DR1 in the emission area EMA.

The first inner bank BP1 may overlap the first alignment electrode RME1 in the third direction DR3 in the emission area EMA, and the second inner bank BP2 may overlap the second alignment electrode RME2 in the third direction DR3 in the emission area EMA.

The light emitting elements ED may be arranged in the emission area EMA. The light emitting elements ED may not be disposed in the sub-region SA. As stated above, by forming the outer bank BNL to enclose the sub-region SA of each pixel, the ink in which the light emitting elements ED are dispersed is injected only to the emission area EMA, and the light emitting elements ED may be disposed in the emission area EMA, but not in the sub-region SA.

The light emitting elements ED may be disposed between the first inner bank BP1 and the second inner bank BP2 in the emission area EMA. In an embodiment, each of the light emitting elements ED may have a shape extending in one direction or a direction, and the extension direction of each light emitting element ED may be substantially perpendicular to the extension direction of the first alignment electrode RME1 and the second alignment electrode RME2, but is not limited thereto. For example, the extension direction of the light emitting element ED may be oblique to the extension directions of the first alignment electrode RME1 and the second alignment electrode RME2. The light emitting element ED may be aligned such that at least one end or an end thereof is placed on the first alignment electrode RME1 or the second alignment electrode RME2 in a region where the first inner bank BP1 and the second inner bank BP2 face each other while being spaced apart from each other.

The light emitting elements ED may be spaced apart from each other. The light emitting elements ED may be disposed between the first inner bank BP1 and the second inner bank BP2 to be spaced apart from each other in the second direction DR2. The light emitting elements ED may be arranged in one row between the first inner bank BP1 and the second inner bank BP2, and the distance between the light emitting elements ED disposed adjacent to each other in the second direction DR2 may be random.

The connection electrode layer CNE may be disposed over the emission area EMA and the sub-region SA in the display area DA. The connection electrode layer CNE may include the first connection electrode CNE1 and the second connection electrode CNE2 in the display area DA. Each of the first connection electrode CNE1 and the second connection electrode CNE2 may extend in the second direction DR2, and may be spaced apart from each other in the first direction DR1. The connection electrode layer CNE may include a third pad electrode PE3 to be described later in the pad area PDA. A detailed description thereof will be given later.

The first connection electrode CNE1 may be disposed to overlap the first alignment electrode RME1 in the third direction DR3 in the emission area EMA and the sub-region SA of each pixel PX. The first connection electrode CNE1 may be disposed to overlap one end or ends of the light emitting elements ED in the emission area EMA.

The first connection electrode CNE1 may be in contact with the first alignment electrode RME1 through a first contact portion CT1 in the sub-region SA, and may be in contact with the one end or ends of the light emitting elements ED in the emission area EMA. As the first alignment electrode RME1 is in contact with one end or an end of the light emitting element ED and the first alignment electrode RME1, the one end or an end of the light emitting element ED and the first alignment electrode RME1 may be electrically connected via the first connection electrode CNE1. Although the first connection electrode CNE1 is illustrated in the drawing to be in contact with the first alignment electrode RME1 in the sub-region SA, the disclosure is not limited thereto. By way of example, the first connection electrode CNE1 may be in contact with the first alignment electrode RME1 in the emission area EMA of each pixel PX.

The second connection electrode CNE2 may be disposed to overlap the second alignment electrode RME2 in the third direction DR3 in the emission area EMA and the sub-region SA of each pixel PX. The second connection electrode CNE2 may be disposed to overlap the other ends of the light emitting elements ED in the emission area EMA.

The second connection electrode CNE2 may be in contact with the second alignment electrode RME2 through a second contact portion CT2 in the sub-region SA, and may be in contact with the other ends of the light emitting elements ED in the emission area EMA. As the second connection electrode CNE2 is in contact with the other end of the light emitting element ED and the second alignment electrode RME2, the other end of the light emitting element ED and the second alignment electrode RME2 may be electrically connected via the second connection electrode CNE2. In the drawing, although the second connection electrode CNE2 is illustrated in the drawing to be in contact with the second alignment electrode RME2 in the sub-region SA, the disclosure is not limited thereto. By way of example, the second connection electrode CNE2 may be in contact with the second alignment electrode RME2 in the emission area EMA of each pixel PX.

Hereinafter, the structure of the display device 1 will be discussed.

Figure 4:
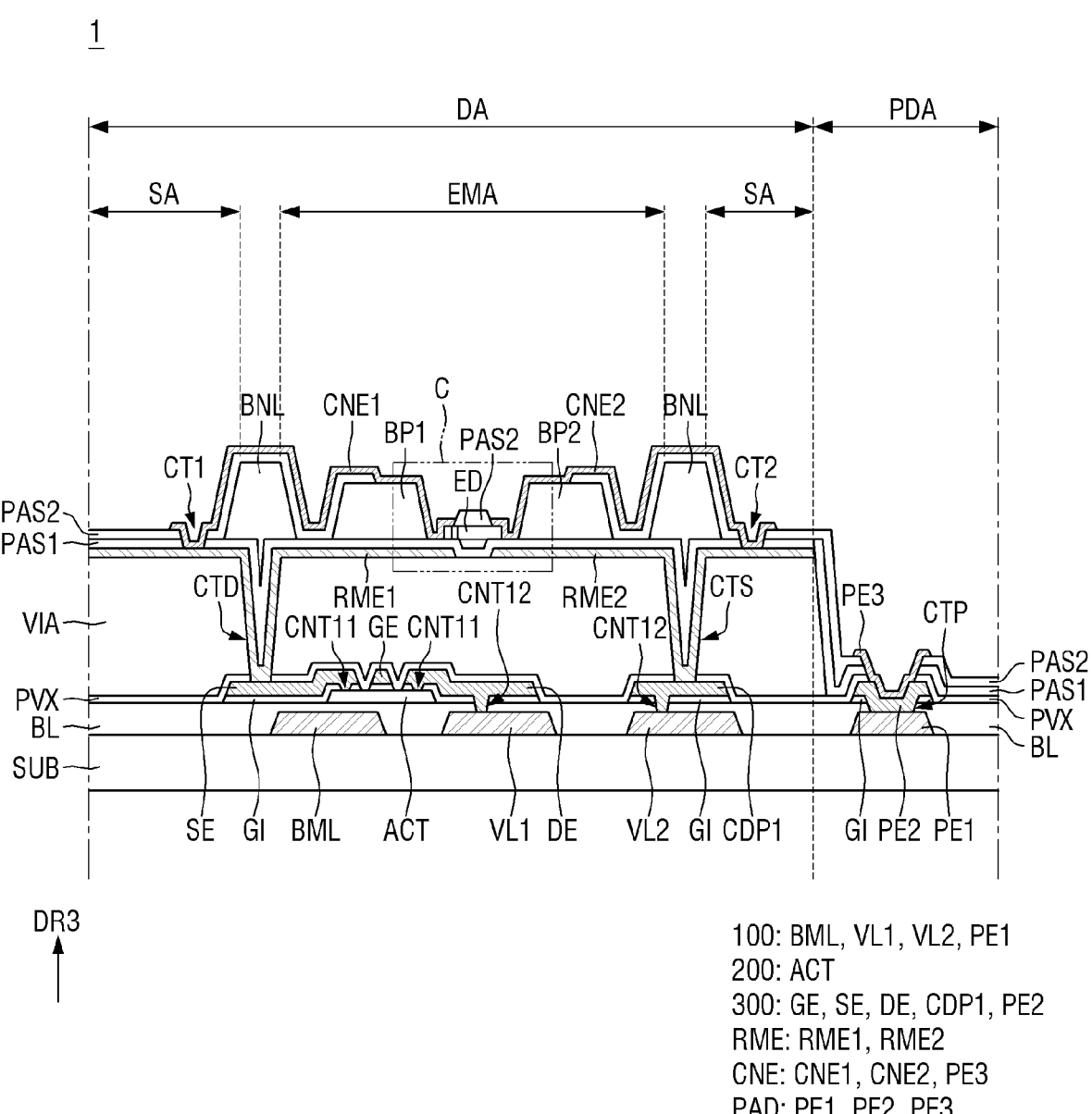
FIG. 4 is a structure diagram schematically illustrating the structure of the display device according to the embodiment of FIG. 1.
Figure 5:
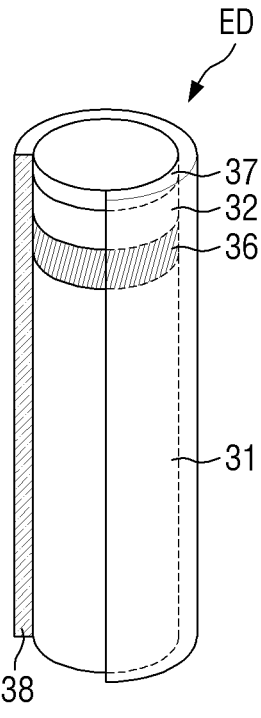
FIG. 5 is a structure diagram schematically illustrating the structure of the light emitting element of FIG. 4.
Figure 6:
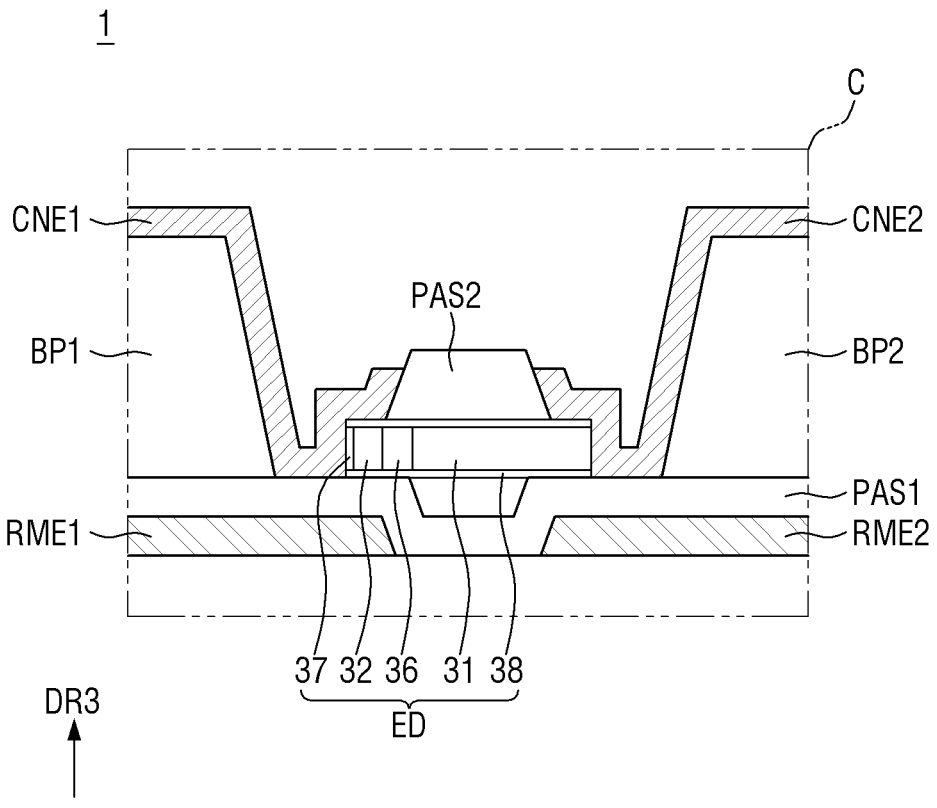
FIG. 6 is an enlarged view of area C of FIG. 4.

FIG. 4 is a structure diagram schematically illustrating the structure of the display device according to the embodiment of FIG. 1. FIG. 5 is a structure diagram schematically illustrating the structure of the light emitting element of FIG. 4. FIG. 6 is an enlarged view of area C of FIG. 4. FIG. 4 schematically illustrates a stacked structure of various elements forming the display device, including cross sections of a part of the display area and a part of the non-display area.

Referring to FIGS. 4 to 6, the display device 1 may include a substrate SUB, a semiconductor layer 200 disposed on the substrate SUB, conductive layers, and insulating layers. The semiconductor layer 200, the conductive layers, and the insulating layers may constitute the circuit element layer and a display element layer of the display device 1, respectively.

The substrate SUB may be a base substrate or a base member. The substrate SUB may be made of an insulating material such as glass, quartz, or polymer resin. Further, the substrate SUB may be a rigid substrate, but may also be a flexible substrate which can be bent, folded or rolled.

The circuit element layer may be disposed on the substrate SUB. The circuit element layer may include a first conductive layer 100, a buffer layer BL, the semiconductor layer 200, a gate insulating layer GI, a second conductive layer 300, a passivation layer PVX, and a via insulating layer VIA.

The first conductive layer 100 is disposed on the substrate SUB. The first conductive layer 100 may include the first voltage line VL1, the second voltage line VL2, a light blocking pattern BML, and a first pad electrode PE1. In other words, the first voltage line VL1, the second voltage line VL2, and the light blocking pattern BML disposed in the display area DA, and the first pad electrode PE1 disposed in the pad area PDA may be formed of the first conductive layer 100. The first conductive layer 100 may further include the data line DL, the initialization voltage line VIL, or the scan line SL extending in the second direction DR2 (see FIG. 2). A description thereof will be given later.

The first voltage line VL1 may overlap at least a part of a drain electrode DE of a transistor to be described later in a thickness direction of the substrate SUB. The first voltage line VL1 may be electrically connected to the drain electrode DE of the transistor through a second contact hole CNT12. A high potential voltage (or a first source voltage) to be supplied to the transistor may be applied to the first voltage line VL1.

The second voltage line VL2 may overlap at least a part of a first conductive pattern CDP1 in the thickness direction of the substrate SUB. The second voltage line VL2 may be electrically connected to the first conductive pattern CDP1 through a first contact hole CNT11. A low potential voltage (or a second source voltage) lower than the high potential voltage supplied to the first voltage line may be applied to the second voltage line VL2.

In other words, a high potential voltage supplied to the transistor may be applied to the first voltage line VL1, and a low potential voltage lower than a high potential voltage supplied to the first voltage line VL1 may be applied to the second voltage line VL2.

The light blocking pattern BML may be disposed to cover at least a channel region of a semiconductor pattern ACT of the transistor from below. The light blocking pattern BML may be a light blocking layer that serves to protect the semiconductor pattern ACT of the transistor from external light. However, the disclosure is not limited thereto, and the light blocking pattern BML may be omitted.

The first pad electrode PE1 may form any one of the aforementioned pads PAD of the wires. For example, the first pad electrode PE1 may be the first electrode pad PE1 of any one of the first voltage pad VL1-PAD, the second voltage pad VL2-PAD, the data pad D-PAD, the initialization voltage pad I-PAD, and the scan pad S-PAD. To elaborate, the first pad electrode PE1 shown in FIG. 4 may be the first pad electrode PE1 of the first voltage pad VL1-PAD, the first pad electrode PE1 of the second voltage pad VL2-PAD, the first pad electrode PE1 of the data pad D-PAD, the first pad electrode PE1 of the initialization voltage pad I-PAD, or the first pad electrode PE1 of the scan pad S-PAD.

The first conductive layer 100 may be made of, as a material that blocks light, an opaque metal material that blocks transmission of light. In an embodiment, the first conductive layer 100 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof, but is not limited thereto. For example, the first conductive layer 100 may be formed of a Ti/Cu double layer in which a titanium layer and a copper layer are stacked on top of each other.

The buffer layer BL may be disposed on the first conductive layer 100. The buffer layer BL may be disposed to cover the entire surface of the substrate SUB on which the first conductive layer 100 is disposed. The buffer layer BL may be disposed in the display area DA and the pad area PDA of the non-display area NDA. The buffer layer BL may constitute the first contact hole CNT11 exposing a part of the first conductive layer 100 together with the gate insulating layer GI in the display area DA. The buffer layer BL may constitute a pad contact hole CTP in the pad area PDA together with a passivation layer to be described later.

The buffer layer BL may serve to protect the transistors from moisture permeating through the substrate SUB that is susceptible to moisture permeation. In an embodiment, the buffer layer BL may include an inorganic insulating material such as silicon oxide ($SiO_x$), silicon nitride ($SiN_x$), or silicon oxynitride ($SiO_xN_y$), but is not limited thereto.

The semiconductor layer 200 is disposed on the buffer layer BL. The semiconductor layer 200 may include the semiconductor pattern ACT of the transistor disposed in the display area DA. The semiconductor pattern ACT of the transistor may be disposed to overlap the light blocking pattern BML as described above.

The semiconductor layer 200 may include polycrystalline silicon, monocrystalline silicon, an oxide semiconductor, or the like within the spirit and the scope of the disclosure. In an embodiment, in case that the semiconductor layer 200 may include polycrystalline silicon, the polycrystalline silicon may be formed by crystallizing amorphous silicon, and in case that the semiconductor layer 200 may include polycrystalline silicon, the semiconductor pattern ACT of the transistor may include doped regions doped with impurities and a channel region therebetween. In an embodiment, the semiconductor layer 200 may contain an oxide semiconductor. The oxide semiconductor may be, by way of non-limiting example, indium-tin oxide (ITO), indium-zinc oxide (IGZO), indium-gallium-tin oxide (IGTO), indium-gallium-zinc-tin oxide (IGZTO), or the like within the spirit and the scope of the disclosure.

The gate insulating layer GI may be disposed on the buffer layer BL on which the semiconductor layer 200 is disposed. The gate insulating layer GI may be formed in a same pattern as the second conductive layer 300 to be described later. In an embodiment, the sidewall of the gate insulating layer GI may be generally aligned with the sidewall of the second conductive layer 300, but is not limited thereto. The gate insulating layer GI may be formed as a multilayer in which inorganic layers including an inorganic material, for example, at least one of silicon oxide ($SiO_x$), silicon nitride ($SiN_x$) or silicon oxynitride ($SiO_xN_y$) may be alternately stacked each other.

The second conductive layer 300 may be disposed on the gate insulating layer GI. The second conductive layer 300 may include a gate electrode GE, a drain electrode DE, a source electrode SE, a first conductive pattern CDP1, and a second pad electrode PE2 of the transistor disposed in the display area DA. Although not illustrated in the drawings, the first voltage line VL1, the second voltage line VL2, and the like extending in the aforementioned first direction DR1 may be formed of the second conductive layer 300.

The gate electrode GE may be disposed to overlap the channel region of the semiconductor pattern ACT in the third direction DR3 which is the thickness direction of the substrate SUB.

The drain electrode DE may be spaced apart from the gate electrode GE. The drain electrode DE may be in contact with and electrically connected to one end region or an end region of the semiconductor pattern ACT through the first contact hole CNT11 formed through the gate insulating layer GI to expose one end region or an end region of the semiconductor pattern ACT. The drain electrode DE may be in contact with and electrically connected to the first voltage line VL1 through the second contact hole CNT12 formed through the gate insulating layer GI and the buffer layer BL to expose a partial region of the first voltage line VL1. The first voltage line VL1 may be electrically connected to the one end region or an end region of the semiconductor pattern ACT through the drain electrode DE.

The source electrode SE may be spaced apart from the drain electrode DE and the gate electrode GE. The source electrode SE may be in contact with and electrically connected to the other end region of the semiconductor pattern ACT through the first contact hole CNT11 formed through the gate insulating layer GI to expose the other end region of the semiconductor pattern ACT. Although it is illustrated in the drawings that the source electrode SE is not in contact with the light blocking pattern BML, disposed below, but the disclosure is not limited thereto. For example, the source electrode SE may be in contact with and electrically connected to the light blocking pattern BML disposed below through a contact hole formed through the gate insulating layer GI and the buffer layer BL.

The first conductive pattern CDP1 may overlap the second voltage line VL2. The first conductive pattern CDP1 may be in contact with and electrically connected to the second voltage line VL2 through the second contact hole CNT12 formed through the gate insulating layer GI and the buffer layer BL to expose a partial region of the second voltage line VL2. The first conductive pattern CDP1 may be a connection pattern that electrically connects the second voltage line VL2 formed of a first conductive layer to the second alignment electrode RME2 to be described later.

The second pad electrode PE2 may be disposed in the pad area PDA of the non-display area NDA. The second pad electrode PE2 may be disposed on the gate insulating layer GI. The second pad electrode PE2 may be disposed to be spaced apart from the buffer layer BL with the gate insulating layer GI interposed therebetween in a region other than a portion in contact with the first pad electrode PE1. The second pad electrode PE2 may overlap the first pad electrode PE1 in the third direction DR3. The second pad electrode PE2 may have substantially a same width as the first pad electrode PE1. Accordingly, since the second pad electrode PE2 is not disposed outside the first pad electrode PE1, a step may not be formed at the second pad electrode PE2 near the outskirt of the first pad PAD. Accordingly, in case that etching a via insulating material layer VIA' disposed in the pad area PDA in a display device manufacturing process to be described later, the passivation layer PVX may be etched together so that the second pad electrode PE2 may not be exposed. A detailed description thereof will be given later in conjunction with FIGS. 23 to 28.

The second pad electrode PE2 may constitute any one of the aforementioned pads PAD of the wires. By way of example, the second pad electrode PE2 may be the second pad electrode PE2 of any one of the first voltage pad VL1-PAD, the second voltage pad VL2-PAD, the data pad D-PAD, the initialization voltage pad I-PAD, and the scan pad S-PAD. For example, the second pad electrode PE2 shown in FIG. 4 may be the second pad electrode PE2 of the first voltage pad VL1-PAD, the second pad electrode PE2 of the second voltage pad VL2-PAD, the second pad electrode PE2 of the initialization voltage pad I-PAD, or the second pad electrode PE2 of the scan pad S-PAD.

The second pad electrode PE2 may be electrically connected to the first pad electrode PE1 through the pad contact hole CTP formed through the gate insulating layer GI and the buffer layer BL to expose a partial region of the first pad electrode PE1. Pad contact holes CTP may be disposed (see FIG. 7).

As will be described later, the first contact hole CNT11, the second contact hole CNT12, and the pad contact hole CTP formed through the buffer layer BL and the gate insulating layer GI may be simultaneously formed through a single mask process.

The second conductive layer 300 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The passivation layer PVX may be disposed on the buffer layer BL on which the second conductive layer 300 is formed. The passivation layer PVX may cover the second conductive layer 300 for protection. For example, the passivation layer PVX may be disposed on the second pad electrode PE2 of the pad area PDA in the display device manufacturing process to protect the second pad electrode PE2 from a process of etching the alignment electrode RME to be described later. A detailed description thereof will be given later.

The passivation layer PVX may be formed in the display area DA in a same pattern as the via insulating layer VIA to be described later. For example, the sidewall of the passivation layer PVX may be generally aligned with the sidewall of the via insulating layer VIA.

The passivation layer PVX may be disposed on the second pad electrode PE2 in the pad area PDA to form a pad opening exposing the second pad electrode PE2 in the third direction DR3, thus allowing the third pad electrode PE3 to be described later to be in contact with and electrically connected to the second pad electrode PE2.

In an embodiment, the passivation layer PVX may include an inorganic insulating material such as silicon oxide ($SiO_x$), silicon nitride ($SiN_x$), or silicon oxynitride ($SiO_xN_y$), but is not limited thereto.

The via insulating layer VIA may be disposed on the passivation layer PVX. The via insulating layer VIA may be disposed to cover the top surface of the passivation layer PVX in the display area DA. The via insulating layer VIA may be disposed in the display area DA, but may not be disposed in at least the pad area PDA of the non-display area NDA. This may be because the via insulating material layer VIA' (see FIGS. 23 to 26) disposed on the pad area PDA is removed in the display device manufacturing process to be described later.

As described above, the pattern of the via insulating layer VIA in the display area DA may be the same as the pattern of the passivation layer PVX disposed below. For example, the sidewall of the via insulating layer VIA constituting the first electrode contact hole CTD and the second electrode contact hole CTS and the sidewall of the passivation layer PVX may overlap and be aligned with each other. As will be described later, an additional mask for forming the passivation layer PVX may not be necessary by patterning the passivation layer PVX using the patterned via insulating layer VIA as an etching mask during the display device manufacturing process (see FIG. 29). Accordingly, the number of masks for manufacturing the display device 1 is reduced, thereby securing economic feasibility of the manufacturing process of the display device 1. A detailed description thereof will be given later.

The via insulating layer VIA may have a generally flat surface regardless of the shape or the presence or absence of the pattern disposed below. For example, the via insulating layer VIA may serve to planarize the top of the passivation layer PVX. The via insulating layer VIA may include an organic insulating material, for example, an organic material such as polyimide (PI).

The alignment electrode layer RME may be disposed on the via insulating layer VIA in the display area DA. The alignment electrode layer RME may be disposed on or directly disposed on the top surface of the via insulating layer VIA. The alignment electrode layer RME may not be disposed in the pad area PDA of the non-display area NDA. This may be due to the result of etching an alignment electrode material layer disposed in the pad area PDA in the display device manufacturing process to be described later. The alignment electrode layer RME may include the first alignment electrode RME1 and the second alignment electrode RME2.

The first alignment electrode RME1 may be in contact with and electrically connected to the source electrode SE of the transistor through the first electrode contact hole CTD which is formed through the via insulating layer VIA and the passivation layer PVX to expose the source electrode SE.

The second alignment electrode RME2 may be in contact with and electrically connected to the first conductive pattern CDP1 through the second electrode contact hole CTS which is formed through the via insulating layer VIA and the passivation layer PVX to expose the first conductive pattern CDP1. The second alignment electrode RME2 may be electrically connected to the second voltage line VL2 through the first conductive pattern CDP1.

The alignment electrode layer RME may include a conductive material having high reflectivity. In an embodiment, the alignment electrode layer RME may include, as a material having high reflectivity, a metal such as silver (Ag), copper (Cu), aluminum (Al), molybdenum (Mo) or titanium (Ti), or an alloy including aluminum (Al), nickel (Ni), lanthanum (La), or the like, but is not limited thereto. For example, the alignment electrode layer RME may further include a transparent conductive material. In other words, the alignment electrode layer RME may include a material such as ITO, IZO, ITZO, or the like within the spirit and the scope of the disclosure. In an embodiment, the alignment electrode layer RME may have a structure in which at least one transparent conductive material and at least one metal layer having high reflectivity may be stacked each other, or may be formed as one layer or a layer including them. For example, the alignment electrode layer RME may have a stacked structure of ITO/Ag/ITO, ITO/Ag/IZO, ITO/Ag/ITZO/IZO, or the like within the spirit and the scope of the disclosure.

The first insulating layer PAS1 may be disposed in the display area DA and the pad area PDA of the non-display area NDA. The first insulating layer PAS1 may be disposed on the via insulating layer VIA on which the alignment electrode layer RME is formed, and the first insulating layer PAS1 may be disposed on the passivation layer PVX in the pad area PDA.

The first insulating layer PAS1 may be disposed to cover the first alignment electrode RME1 and the second alignment electrode RME2 in the display area DA. The first insulating layer PAS1 may serve to protect the first alignment electrode RME1 while insulating the first alignment electrode RME1 and the second alignment electrode RME2 from each other.

The first insulating layer PAS1 may include the first contact portion CT1 and the second contact portion CT2 penetrating the first insulating layer PAS1 in the sub-region SA of the display area DA to expose at least a part of the first alignment electrode RME1 and at least a part of the second alignment electrode RME2, respectively.

The first connection electrode CNE1 to be described later and the first alignment electrode RME1 may be electrically connected to each other through the first contact portion CT1 penetrating the first insulating layer PAS1, and the second connection electrode CNE2 and the second alignment electrode RME2 may be electrically connected to each other through the second contact portion CT2 penetrating the first insulating layer PAS1.

As described above, the first insulating layer PAS1 may be disposed on the passivation layer PVX in the pad area PDA. The first insulating layer PAS1 may be disposed on or directly disposed on the top surface of the passivation layer PVX in the pad area PDA. The first insulating layer PAS1 may constitute the pad opening exposing the second pad electrode PE2 together with the passivation layer PVX and a second insulating layer PAS2 to be described later in the pad area PDA. The sidewalls of the passivation layer PVX, the first insulating layer PAS1, and the second insulating layer PAS2 constituting the pad opening may be aligned with each other, but are not limited thereto.

The inner bank BP and the outer bank BNL may be disposed on the first insulating layer PAS1. The inner bank BP and the outer bank BNL may be disposed on the first insulating layer PAS1 to have a height. The inner bank BP may include the first inner bank BP1 and the second inner bank BP2.

As the outer bank BNL is disposed to surround the emission area EMA while having the height, the ink in which the light emitting elements ED are dispersed in an inkjet printing process for aligning the light emitting elements ED during the manufacturing process of the display device 1 may be ejected into the emission area EMA, but may not be ejected into the sub-region SA.

The first inner bank BP1 and the second inner bank BP2 may be disposed in the emission area EMA partitioned by the outer bank BNL. The height of the first inner bank BP1 and the second inner bank BP2 may be lower than or equal to the height of the outer bank BNL The first inner bank BP1 and the second inner bank BP2 may serve to guide the light emitting elements ED to be arranged between the first alignment electrode RME1 and the second alignment electrode RME2 in a process of aligning the light emitting elements ED during the manufacturing process of the display device 1. The space between the first inner bank BP1 and the second inner bank BP2 may provide an area in which the light emitting elements ED are arranged.

The first inner bank BP1 and the second inner bank BP2 may include inclined side surfaces, and thus serve to change the traveling direction of the light heading toward the side surfaces of the first inner bank BP1 and the second inner bank BP2 after being emitted from the light emitting element ED to an upward direction. For example, the first inner bank BP1 and the second inner bank BP2 may also serve as a reflective partition wall that changes the traveling direction of light emitted from the light emitting element ED to the upward direction while providing the space in which the light emitting element ED is disposed.

In the drawings, the side surface of each of the inner bank BP and the outer bank BNL is illustrated to be inclined in a linear shape, but the disclosure is not limited thereto. For example, the side surface of the inner bank BP and the side surface of the outer bank BNL may have a semi-circular or semi-elliptical shape. In an embodiment, the inner bank BP and the outer bank BNL may include, but are not limited to, an organic insulating material such as polyimide (PI).

The light emitting elements ED may be disposed on the first insulating layer PAS1 in the emission area EMA. The light emitting elements ED may be arranged in the emission area EMA, but may not be arranged in the sub-region SA. The light emitting elements ED may be disposed between the first inner bank BP1 and the second inner bank BP2 in the emission area EMA. The light emitting element ED may be disposed such that both ends thereof are disposed on the first alignment electrode RME1 and the second alignment electrode RME2, respectively.

Referring to FIG. 5, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity in case that an electric field is formed in a given direction between two electrodes facing each other.

The light emitting element ED according to one embodiment may have a shape elongated in one direction or a direction. In an embodiment, the light emitting element ED may have a shape such as a cylinder, a rod, a wire, a tube, or the like, but is not limited thereto.

The light emitting element ED may include a light emitting semiconductor layer doped with any conductivity type (for example, p-type or n-type) dopant. The light emitting semiconductor layer may emit light of a given wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 of the light emitting element ED may be an n-type semiconductor. The first semiconductor layer 31 may include a semiconductor material having a chemical formula of AlxGayIn1−x−yN ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like within the spirit and the scope of the disclosure.

The second semiconductor layer 32 of the light emitting element ED is disposed on the first semiconductor layer 31 with the light emitting layer 36 therebetween. The second semiconductor layer 32 may be a p-type semiconductor, and the second semiconductor layer 32 may include a semiconductor material having a chemical formula of AlxGayIn1−x−yN ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like within the spirit and the scope of the disclosure.

Although it is illustrated in the drawing that the first semiconductor layer 31 and the second semiconductor layer 32 are one layer or a layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 of the light emitting element ED is disposed between the first semiconductor layer 31 and the second semiconductor layer 32. The light emitting layer 36 may include a material having a single or multiple quantum well structure. In case that the light emitting layer 36 may include a material having a multiple quantum well structure, quantum layers and well layers may be stacked alternately each other. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. By way of example, in case that the light emitting layer 36 has a multiple quantum well structure in which quantum layers and well layers may be alternately stacked each other, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked each other, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 of the light emitting element ED may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 1, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 of the light emitting element ED may perform a function of protecting the semiconductor layers 200 and the electrode layers of the light emitting element ED. The insulating film 38 may prevent an electrical short circuit that is likely to occur at the light emitting layer 36 in case that an electrode to which an electrical signal is transmitted is in direct contact with the light emitting element ED. The insulating film 38 may prevent a decrease in luminous efficiency of the light emitting element ED.

The insulating film 38 is arranged to surround the outer surfaces of the semiconductor layers 200 and electrode layers described above. For example, the insulating film 38 may be disposed to surround at least the outer surface of the light emitting layer 36, and may be formed to expose both ends of the light emitting element ED in the longitudinal direction. Further, in cross-sectional view, the insulating film 38 may have a top surface, which is rounded in a region adjacent to at least one end or an end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the disclosure is not limited thereto. In an embodiment, the insulating film 38 may be formed in a multilayer structure having layers stacked therein.

Referring back to FIG. 4, the second insulating layer PAS2 may be disposed in the display area DA and the pad area PDA of the non-display area NDA. The second insulating layer PAS2 may be disposed on the inner bank BP, the outer bank BNL, and the first insulating layer PAS1 on which the light emitting element ED is disposed, and may expose both ends of the light emitting element ED. The second insulating layer PAS2 may be disposed on the first insulating layer PAS1 in the pad area PDA of the non-display area NDA.

The second insulating layer PAS2 may include a pattern portion disposed on the light emitting element ED in the emission area EMA of the display area DA. The pattern portion may be disposed to partially surround the outer surface of the light emitting element ED while exposing both ends of the light emitting element ED. In a plan view (see FIG. 3), the pattern portion may be disposed in the second direction DR2 on the first insulating layer PAS1 and the light emitting element ED, thus forming a linear or island-shaped pattern in each pixel PX. The pattern portion of the second insulating layer PAS2 may protect the light emitting element ED and fix the light emitting elements ED during the manufacturing process of the display device 1. The second insulating layer PAS2 may be disposed to fill a space between the light emitting element ED and the first insulating layer PAS1 below it in the emission area EMA of the display area DA.

The second insulating layer PAS2 may form the first contact portion CT1 and the second contact portion CT2 penetrating the second insulating layer PAS2 in the sub-region SA of the display area DA to expose at least a part of the first alignment electrode RME1 and at least a part of the second alignment electrode RME2, respectively. For example, the second insulating layer PAS2 may constitute the first contact portion CT1 and the second contact portion CT2 together with the first insulating layer PAS1 in the sub-region SA of the display area DA.

The second insulating layer PAS2 may be disposed on the first insulating layer PAS1 in the pad area PDA. The second insulating layer PAS2 may be disposed on or directly disposed on the top surface of the first insulating layer PAS1 in the pad area PDA. As stated above, the second insulating layer PAS2 may constitute the pad opening exposing the second pad electrode PE2 together with the passivation layer PVX and the first insulating layer PAS1 in the pad area PDA. The sidewalls of the passivation layer PVX, the first insulating layer PAS1, and the second insulating layer PAS2 constituting the pad opening may be aligned with each other, but are not limited thereto.

The connection electrode layer CNE may be disposed on the second insulating layer PAS2. The connection electrode layer CNE may be disposed in the display area DA and the pad area PDA of the non-display area NDA. The connection electrode layer CNE may include the first connection electrode CNE1, the second connection electrode CNE2, and the third pad electrode PE3. For example, the connection electrode layer CNE may include the first and second connection electrodes CNE1 and CNE2 disposed in the display area DA, and the third pad electrode PE3 disposed in the pad area PDA.

The first connection electrode CNE1 may be in contact with a first electrode exposed by the first contact portion CT1 penetrating the first insulating layer PAS1 and the second insulating layer PAS2 in the sub-region SA, and may be in contact with one end or an end of the light emitting element ED in the emission area EMA. For example, the first connection electrode CNE1 may serve to connect the first alignment electrode RME1 to one end or an end of the light emitting element ED.

The second connection electrode CNE2 may be disposed on the second alignment electrode RME2 in the emission area EMA. The second connection electrode CNE2 may be in contact with the second alignment electrode RME2 and the other end of the light emitting element ED disposed on the second alignment electrode RME2.

The second alignment electrode RME2 may be in contact with the second alignment electrode RME2 exposed by the second contact portion CT2 penetrating the first insulating layer PAS1 and the second insulating layer PAS2 in the sub-region SA, and may be in contact with the other end of the light emitting element ED in the emission area EMA. For example, the second connection electrode CNE2 may serve to electrically connect the second alignment electrode RME2 to the other end of the light emitting element ED.

The first connection electrode CNE1 and the second connection electrode CNE2 may be spaced apart from each other on the light emitting element ED. For example, the first connection electrode CNE1 and the second connection electrode CNE2 may be spaced apart from each other with the second insulating layer PAS2 therebetween. The first connection electrode CNE1 and the second connection electrode CNE2 may be electrically insulated from each other.

The third pad electrode PE3 may be disposed in the pad area PDA of the non-display area NDA. The third pad electrode PE3 may be disposed on the second insulating layer PAS2 in the pad area PDA. The third pad electrode PE3 may overlap the first pad electrode PE1 and the second pad electrode PE2 in the third direction DR3 in the pad area PDA.

The third pad electrode PE3 may constitute any one of the aforementioned pads PAD of the wires described above. For example, the third pad electrode PE3 may be the third pad electrode PE3 of any one of the first voltage pad PAD, the second voltage pad PAD, the data pad D-PAD, the initialization voltage pad PAD, and the scan pad S-PAD. For example, the third pad electrode PE3 shown in FIG. 4 may be the third pad electrode PE3 of the first voltage pad PAD, the third pad electrode PE3 of the second voltage pad PAD, the third pad electrode PE3 of the data pad D-PAD, the third pad electrode PE3 of the initialization voltage pad PAD, or the third pad electrode PE3 of the scan pad S-PAD.

The third pad electrode PE3 may be in contact with and electrically connected to the second pad electrode PE2 through the pad opening formed by the passivation layer PVX, the first insulating layer PAS1, and the second insulating layer PAS2.

As the first connection electrode CNE1, the second connection electrode CNE2, and the third pad electrode PE3 may be made of the connection electrode layer CNE, they may be formed on a same layer. The first connection electrode CNE1, the second connection electrode CNE2, and the third pad electrode PE3 may include a same material. For example, the first connection electrode CNE1, the second connection electrode CNE2, and the third pad electrode PE3 may be simultaneously formed through a single mask process. The connection electrode layer CNE may include a conductive material. In an embodiment, the connection electrode layer CNE may include ITO, IZO, ITZO, aluminum (Al), or the like within the spirit and the scope of the disclosure.

FIG. 6 provides an enlarged view of a region in which the light emitting element ED is disposed between the first alignment electrode RME1 and the second alignment electrode RME2.

For example, the light emitting element ED may be disposed such that the extension direction of the light emitting element ED is parallel to one surface or a surface of the substrate SUB (or the via insulating layer VIA). The semiconductor layers 200 included in the light emitting element ED may be sequentially arranged along the direction parallel to the top surface of the via insulating layer VIA. For example, the first semiconductor layer 31, the light emitting layer 36, the second semiconductor layer 32, and the electrode layer 37 of the light emitting element ED may be sequentially formed in the direction parallel to the top surface of the via insulating layer VIA.

The second insulating layer PAS2 may be disposed on the light emitting element ED. The second insulating layer PAS2 may be disposed to surround the outer surface of the light emitting element ED. The second insulating layer PAS2 may be disposed to surround the outer surface of the light emitting element ED in a region where the light emitting element ED is disposed, and the second insulating layer PAS2 may be disposed on the inner bank BP, the outer bank BNL, or the first insulating layer PAS1 exposed by the light emitting element ED.

The first connection electrode CNE1 may be in contact with one end or an end of the light emitting element ED exposed by the second insulating layer PAS2. For example, the first connection electrode CNE1 may be disposed to surround one end surface or an end surface of the light emitting element ED exposed by the second insulating layer PAS2. The first connection electrode CNE1 may be in contact with the insulating film 38 and the electrode layer 37 of the light emitting element ED.

The second connection electrode CNE2 may be in contact with the other end of the light emitting element ED exposed by the second insulating layer PAS2. For example, the second connection electrode CNE2 may be disposed to surround the other end surface of the light emitting element ED exposed by the second insulating layer PAS2. The second connection electrode CNE2 may be in contact with the insulating film 38 and the first semiconductor layer 31 of the light emitting element ED.

The first connection electrode CNE1 and the second connection electrode CNE2 may be spaced apart from each other with the second insulating layer PAS2 therebetween. The first connection electrode CNE1 and the second connection electrode CNE2 may expose at least a part of the top surface of the second insulating layer PAS2.

Hereinafter, the arrangement and structure of the data pad D-PAD and the scan pad S-PAD in the pad area PDA disposed in the non-display area NDA of the display device 1 will be described.

Figure 7:
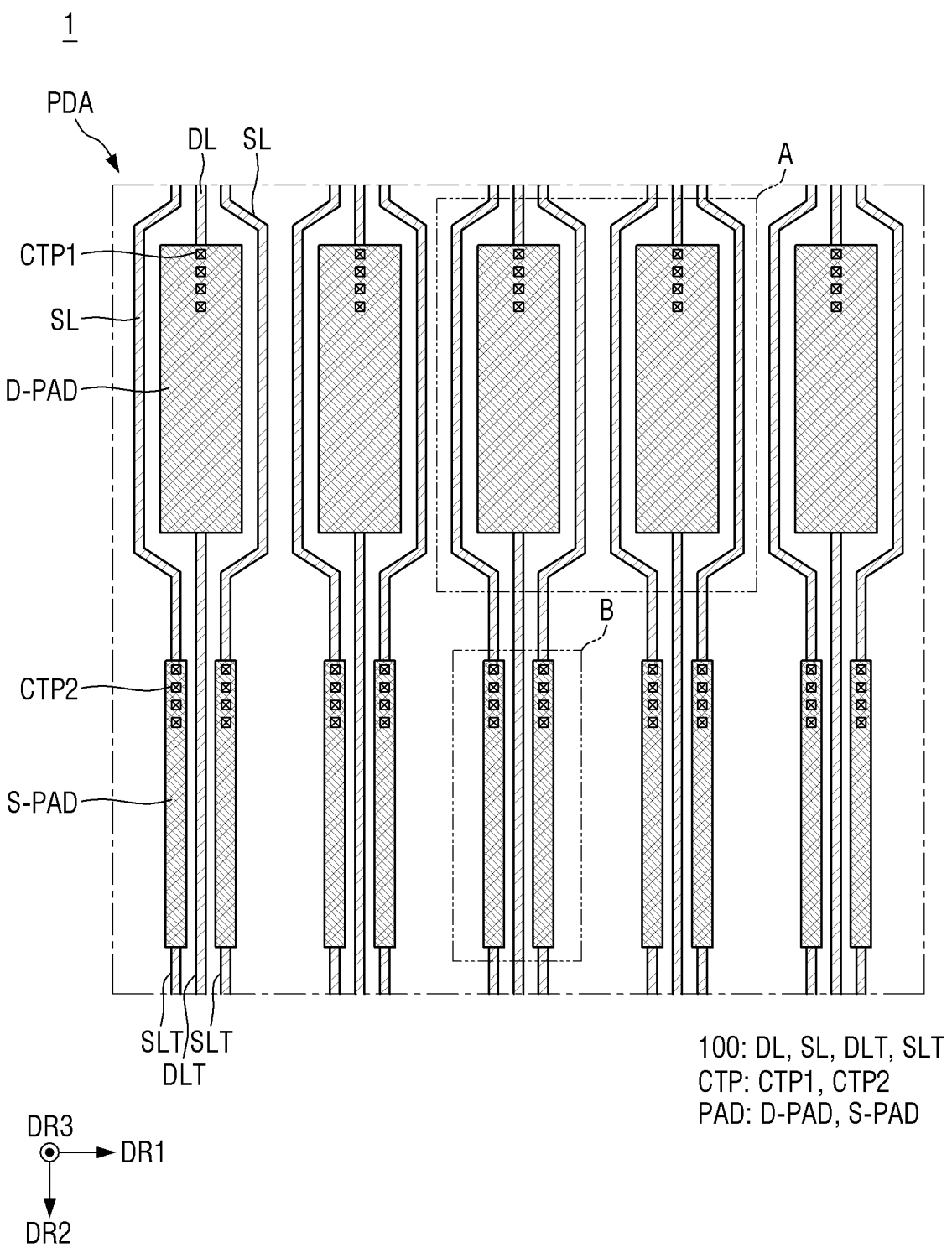
FIG. 7 is a plan diagram schematically illustrating pads disposed in a pad area of a display device according to the embodiment of FIG. 1.
Figure 8:
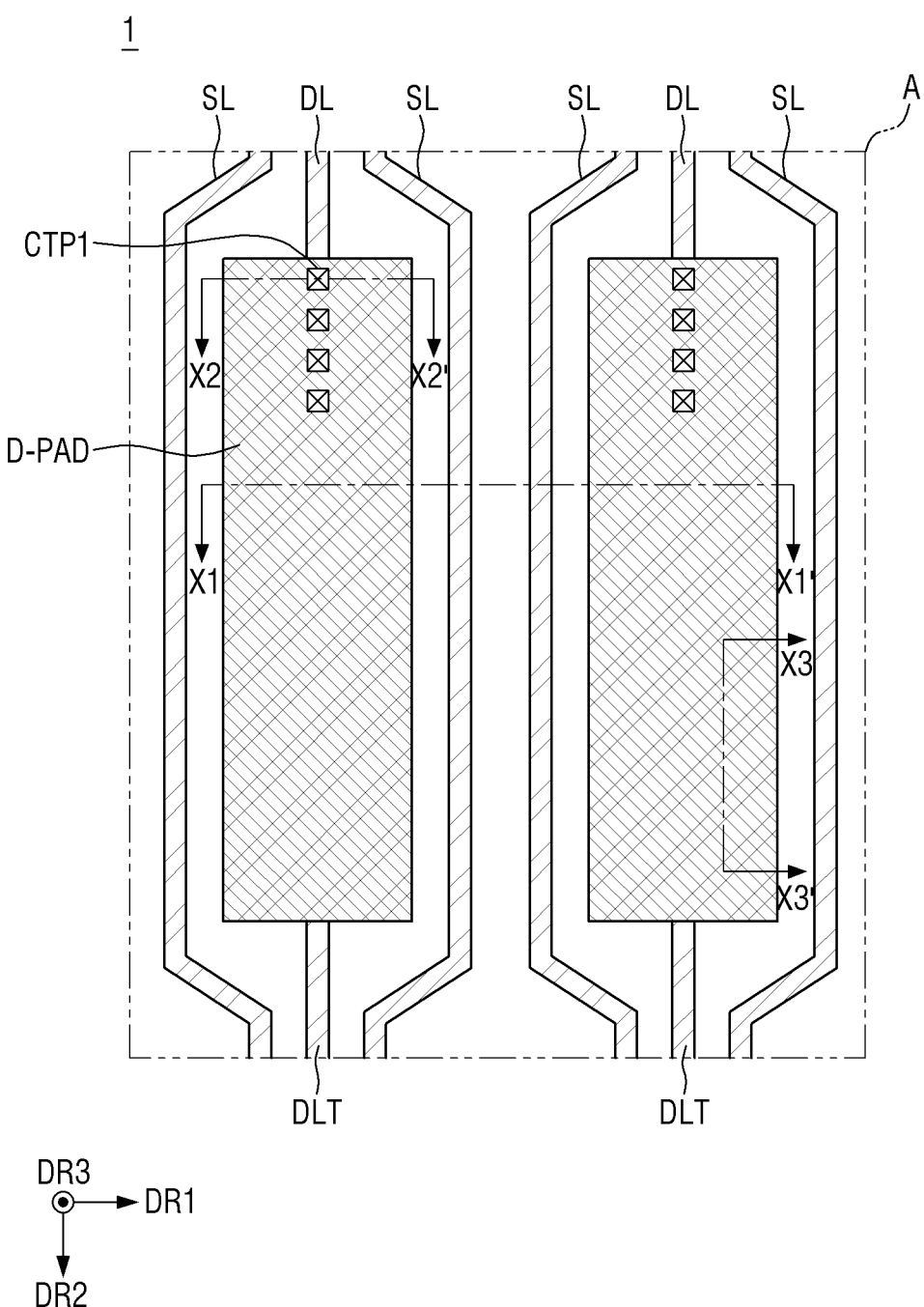
FIG. 8 is an enlarged view of area A of FIG. 7.
Figure 9:
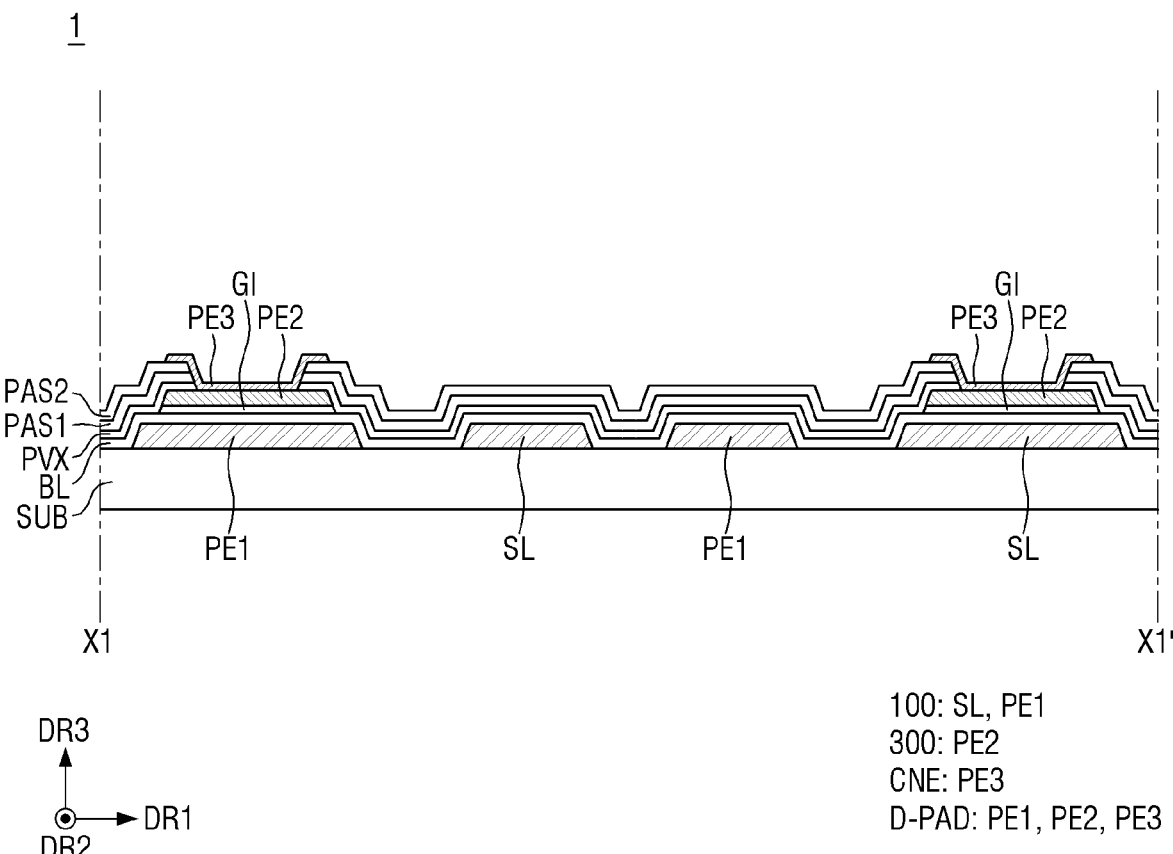
FIG. 9 is a schematic cross-sectional view schematically illustrating a cross section taken along line X1-X1' of FIG. 8.
Figure 10:
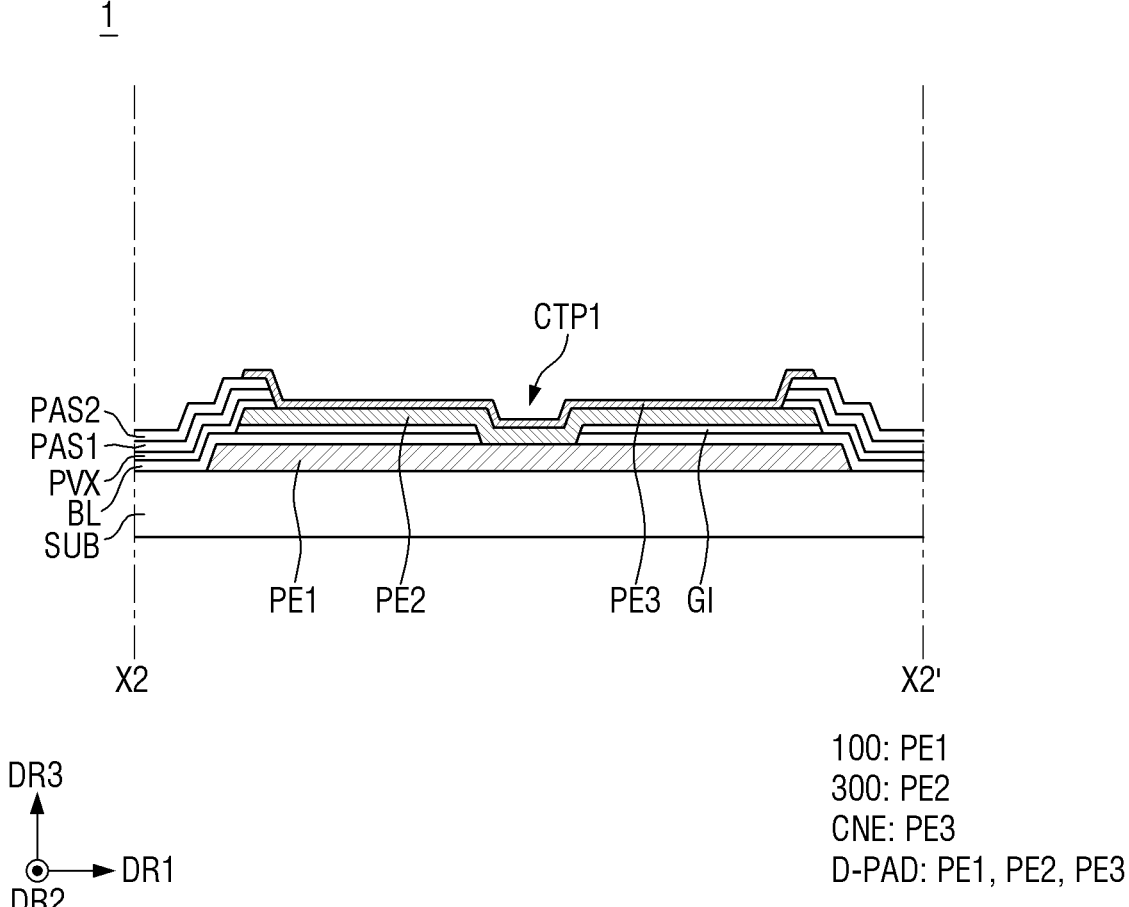
FIG. 10 is a schematic cross-sectional view schematically illustrating a cross section taken along line X2-X2' of FIG. 8.
Figure 11:
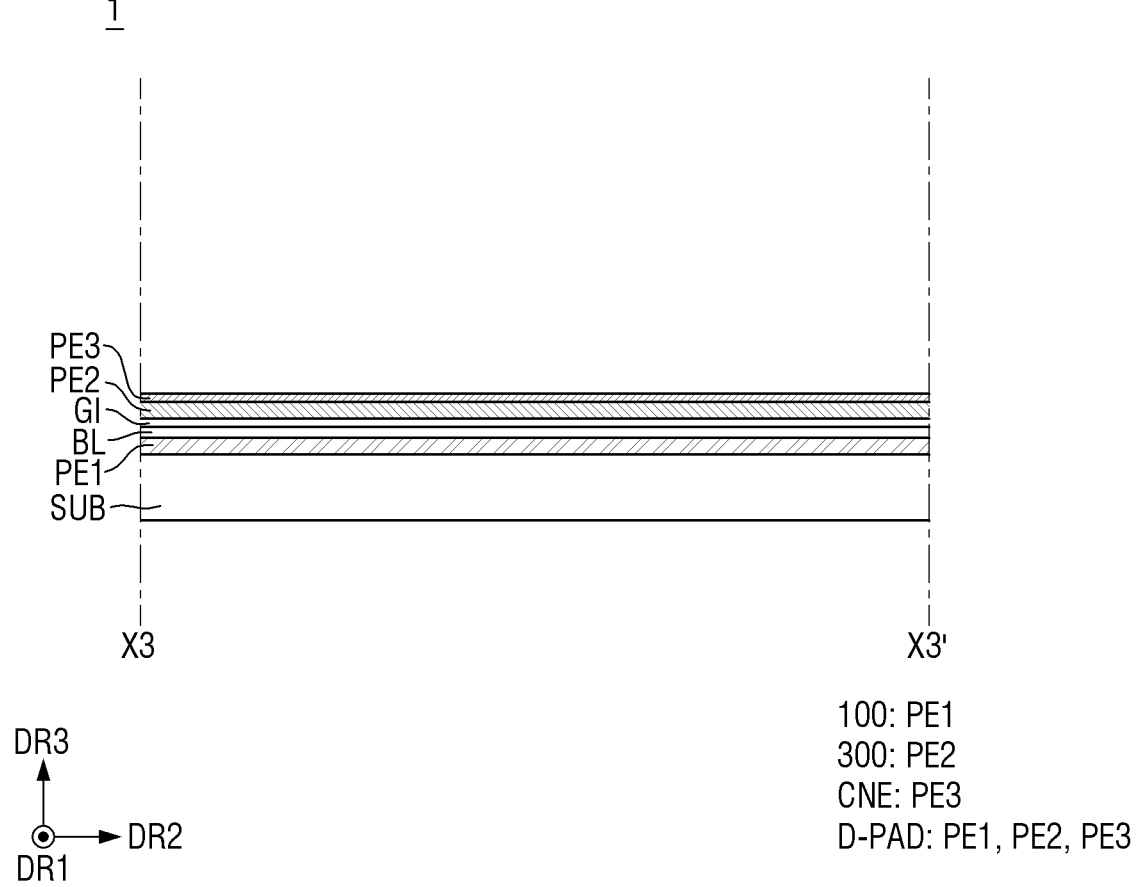
FIG. 11 is a schematic cross-sectional view schematically illustrating a cross section taken along line X3-X3' of FIG. 8.
Figure 12:
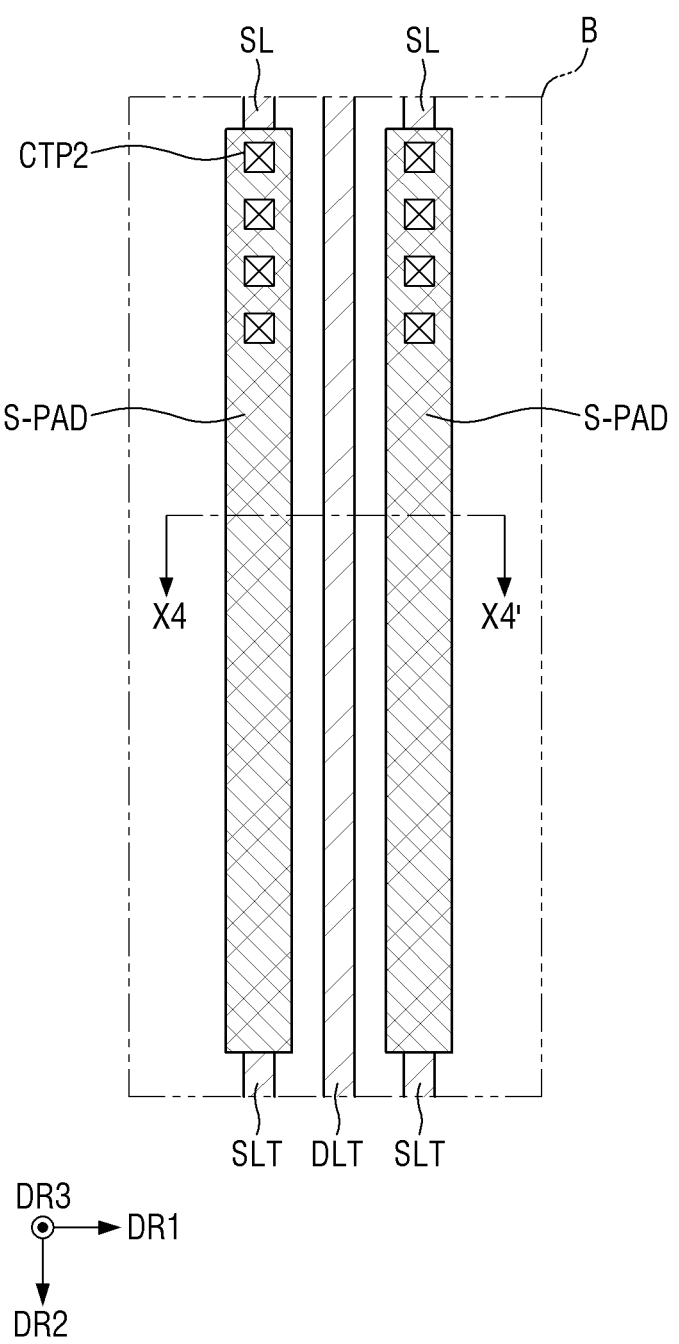
FIG. 12 is an enlarged view of area B of FIG. 7.
Figure 13:
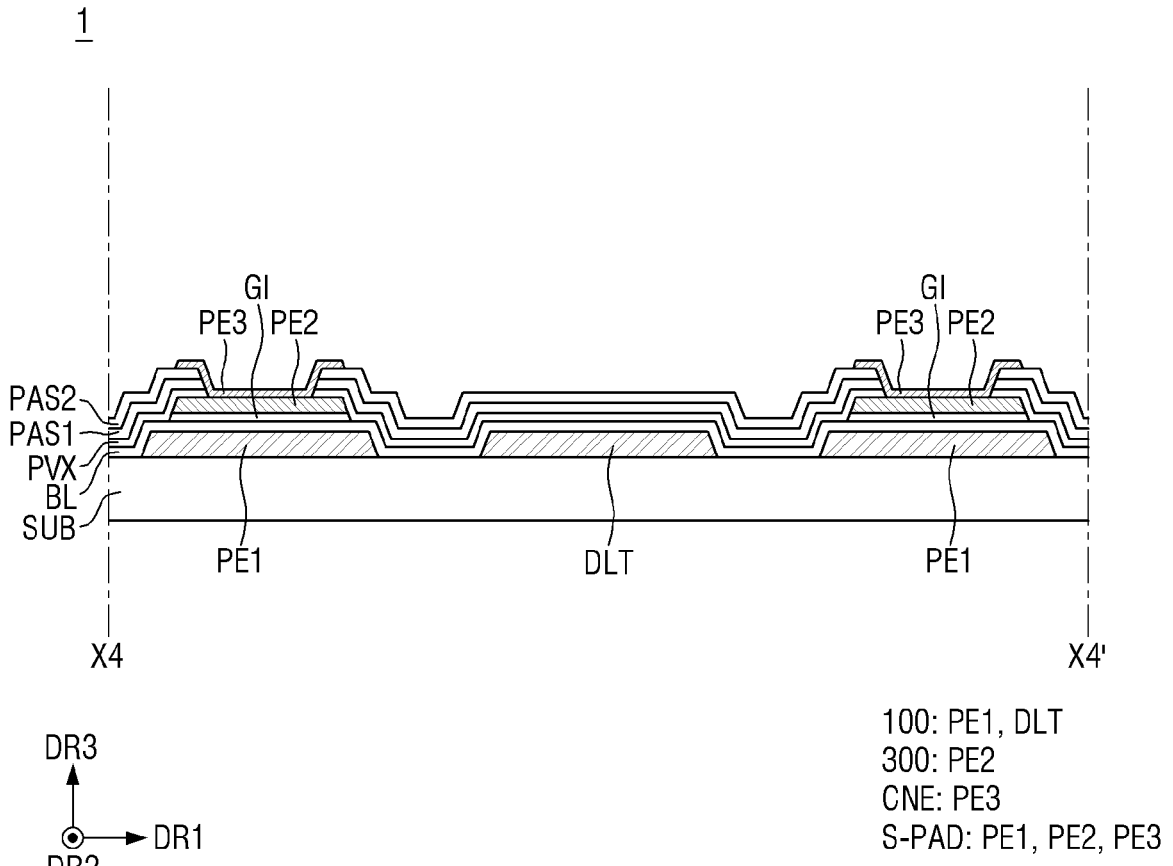
FIG. 13 is a schematic cross-sectional view schematically illustrating a cross section taken along line X4-X4' of FIG. 12.

FIG. 7 is a plan diagram schematically illustrating pads disposed in a pad area of a display device according to the embodiment of FIG. 1. FIG. 8 is an enlarged view of area A of FIG. 7. FIG. 9 is a schematic cross-sectional view schematically illustrating a cross section taken along line X1-X1' of FIG. 8. FIG. 10 is a schematic cross-sectional view schematically illustrating a cross section taken along line X2-X2' of FIG. 8. FIG. 11 is a cross-sectional view schematically illustrating a cross section taken along line X3-X3' of FIG. 8. FIG. 12 is an enlarged view of area B of FIG. 7. FIG. 13 is a schematic cross-sectional view schematically illustrating a cross section taken along line X4-X4' of FIG. 12.

Referring to FIGS. 7 to 13, in the pad area PDA of the display device 1 according to one embodiment, data pads D-PAD may be disposed on the other side of the scan pads S-PAD in the second direction DR2 and arranged side by side in the first direction DR1, and the scan pads S-PAD may be disposed on one side or a side of the data pads D-PAD in the second direction DR2 and arranged side by side in the first direction DR1. The number of the scan pads S-PAD may be larger than the number of the data pads D-PAD.

The first conductive layer 100 may include the data line DL, the scan line SL, a data check line DLT, a scan check line SLT, the first pad electrode PE1 of the data pad D-PAD, and the first pad electrode PE1 of the scan pad S-PAD. The data line DL and the data check line DLT may be connected to the data pad D-PAD, and the scan line SL and the scan check line SLT may be connected to the scan pad S-PAD. The data line DL may serve to transmit the data signal of the driver (see FIG. 2) to the pixel PX (or transistor), and the scan line SL may serve to transmit the scan signal of the driver to the pixel PX (or transistor). The data check line DLT may be a wire to which an inspection pad PAD for inspecting whether the data pad D-PAD operates properly during the display device manufacturing process is connected, and the scan check line SLT may be a wire to which an inspection pad PAD for inspecting whether the scan pad S-PAD operates properly during the display device manufacturing process is connected.

Figure 15:
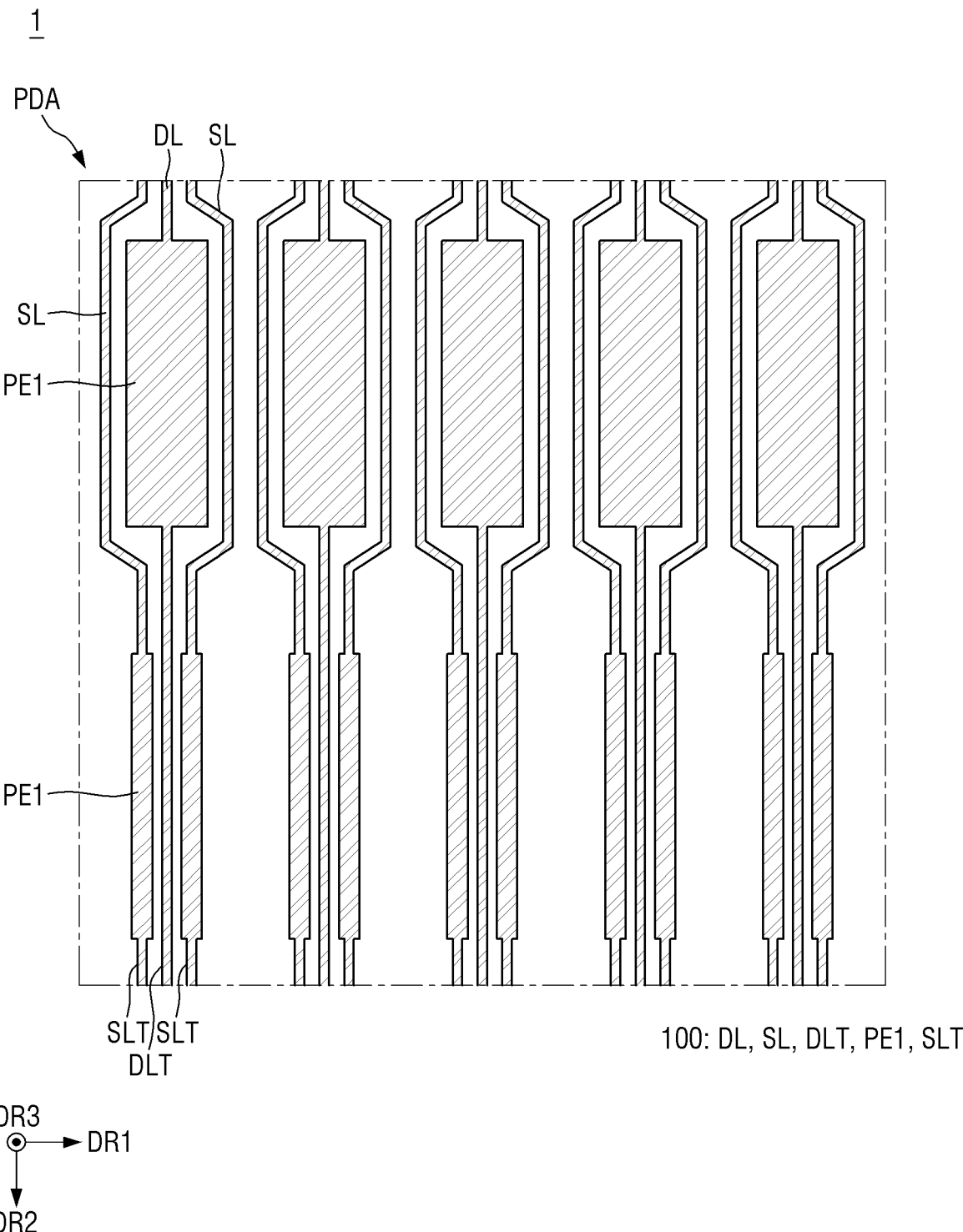

In an embodiment, the data line DL may be connected to the other side of the data pad D-PAD in the second direction DR2, and the data check line DLT may be connected to one side or a side of the data pad D-PAD in the second direction DR2. The data line DL may be a wire extending to the other side of the first pad electrode PE2 of the data pad D-PAD in the second direction DR2, and the data check line DLT may be a wire extending to one side or a side of the first pad electrode PE1 of the data pad D-PAD in the second direction DR2. The data line DL, the data check line DLT, and the first pad electrode PE1 of the data pad D-PAD may be integral with each other as shown in FIG. 15. The scan line SL may be spaced apart from the data line DL to surround both edges of the data pad D-PAD in the first direction DR1. In other words, the scan line SL may be disposed on both sides of the data pad D-PAD in the first direction DR1, and may cross or intersect, in the second direction DR2, a space between the data pads D-PADs that are spaced apart from each other, in the second direction DR2.

The scan line SL may be connected to the other side of the scan pad S-PAD in the second direction DR2, and the scan check line SLT may be connected to one side or a side of the scan pad S-PAD in the second direction DR2. The scan line SL may be a wire extending to the other side of the first pad electrode PE1 of the scan pad S-PAD in the second direction DR2, and the scan check line SLT may be a wire extending to one side or a side of the first pad electrode PE1 of the scan pad S-PAD in the second direction DR2. The scan line SL, the scan check line SLT, and the first pad electrode PE1 of the scan pad S-PAD may be integral with each other as shown in FIG. 15. The data check line DLT may be disposed in a space between the scan pads S-PAD to cross or intersect this space in the second direction DR2. Through the above-described configuration, as the arrangement of the scan pads S-PAD and the data pads D-PAD is concentrated to one side or a side, the display area DA of the display device 1 may be enlarged.

As described above, the data pad D-PAD and the scan pad S-PAD may include the first pad electrode PE1, the second pad electrode PE2, and the third pad electrode PE3 (see FIG.

4). As the first pad electrode PE1 is a part of the first conductive layer 100, the second pad electrode PE2 is a part of the second conductive layer 300, and the third pad electrode PE3 is a part of the connection electrode layer CNE, the second pad electrode PE2 may be disposed on the first pad electrode PE1, and the third pad electrode PE3 may be disposed on the second pad electrode PE2.

The first pad electrode PE1 and the second pad electrode PE2 of the data pad D-PAD and the scan pad S-PAD may be in contact with each other through the pad contact hole CTP to be electrically connected to each other, and the second pad electrode PE2 and the third pad electrode PE3 may be electrically connected to each other through the pad opening. The first pad electrode PE1 and the second pad electrode PE2 of the data pad D-PAD and the scan pad S-PAD may be spaced apart from each other in a region other than the pad contact hole CTP.

For example, the first pad electrode PE1 of the data pad D-PAD may be in contact with and electrically connected to the second pad electrode PE2 of the data pad D-PAD through a first pad contact hole CTP1, whereas in portions other than the first contact hole CTP1, the first pad electrode PE1 and the second pad electrode PE2 may be spaced apart from each other with the buffer layer BL and the gate insulating layer GI therebetween as shown in FIGS. 9 and 11. The first pad electrode PE1 of the scan pad S-PAD may be in contact with and electrically connected to the second pad electrode PE2 of the scan pad S-PAD through a second pad contact hole CTP2, whereas in portions other than the second pad contact holes CPT2, the first pad electrode PE1 and the second pad electrode PE2 may be spaced apart from each other with the buffer layer BL and the gate insulating layer GI therebetween as shown in FIG. 13.

Pad contact holes CTP may be disposed. For example, the first pad contact hole CTP1 and the second pad contact hole CTP2 may be arranged side by side in the second direction DR2. Accordingly, the electrical connection between the first pad electrode PE1 and the second pad electrode PE2 may be improved. In the drawings, it is illustrated that four pad contact holes CTP are formed for each pad PAD.

The second pad electrode PE2 and the third pad electrode PE3 of the data pad D-PAD may be in contact with each other through the pad opening to be electrically connected to each other. The pad opening may refer to an opening that exposes most of the top surface of the second pad electrode PE2 of the data pad D-PAD. Accordingly, as illustrated in FIGS. 9 to 11, the second pad electrode PE2 and the third pad electrode PE3 of the data pad D-PAD may be in contact with and electrically connected to each other in most portions on the second pad electrode PE2 of the data pad D-PAD. Like the data pad D-PAD, the second pad electrode PE2 and the third pad electrode PE3 of the scan pad S-PAD may also be in contact with each other through the pad opening to be electrically connected to each other. The pad opening may refer to an opening that exposes most of the top surface of the second pad electrode PE2 of the scan pad S-PAD. Accordingly, the same as in the case of the data pad D-PAD, the second pad electrode PE2 and the third pad electrode PE3 of the scan pad S-PAD may be in contact with and electrically connected to each other in most portions on the second pad electrode PE2 of the scan pad S-PAD.

In a plan view, the first pad electrode PE1 of the data pad D-PAD and the scan pad S-PAD may have a rectangular shape with a short side in the first direction DR1 and a long side in the second direction DR2, as illustrated in FIG. 15. Referring to FIG. 7 in conjunction with FIG. 15, the second pad electrode PE2 of the data pad D-PAD and the scan pad S-PAD may have, in a plan view, a rectangular shape with a short side in the first direction DR1 and a long side in the second direction DR2, similarly to the first pad electrode PE1 of the data pad D-PAD and the scan pad S-PAD.

The width of the first pad electrode PE1 of the data pad D-PAD in the first direction DR1 and the width thereof in the second direction DR2 may be substantially the same as the width of the second pad electrode PE2 of the data pad D-PAD in the first direction DR1 and the width thereof in the second direction DR2, respectively. In a plan view, the area of the first pad electrode PE1 may be substantially the same as the area of the second pad electrode PE2. Accordingly, the second pad electrode PE2 of the data pad D-PAD may be disposed on the first pad electrode PE1 without a step.

For example, the second pad electrode PE2 of the data pad D-PAD may overlap the first pad electrode PE1 in the third direction DR3, and the width of the first pad electrode PE1 of the data pad D-PAD in the first direction DR1 and the width thereof in the second direction DR2 may be the same as the width of the second pad electrode PE2 of the data pad D-PAD in the first direction DR1 and the width thereof in the second direction DR2, respectively. As the second pad electrode PE2 is disposed so as not to surround the side surface of the first pad electrode PE1 of the data pad D-PAD, a step may not be formed at the second pad electrode PE2. Thus, the first pad electrode PE1 and the second pad electrode PE2 of the data pad D-PAD may not overlap in the first direction DR1 or in the second direction DR2.

In other words, the buffer layer BL may include a first portion covering the top surface of the first pad electrode PE1 of the data pad D-PAD, a second portion covering the side surface of the first pad electrode PE1 of the data pad D-PAD and thus given an inclination, and a third portion covering the top surface of the substrate SUB. The second pad electrode PE2 of the data pad D-PAD may be disposed on the first portion of the buffer layer BL to overlap the first portion in the third direction DR3, whereas the second pad electrode PE2 of the data pad D-PAD may not overlap the second portion and the third portion of the buffer layer BL in the third direction DR3 as it is not disposed on the second portion and the third portion of the buffer layer BL.

Likewise, the width of the first pad electrode PE1 of the scan pad S-PAD in the first direction DR1 and the width thereof in the second direction DR2 may be substantially the same as the width of the second pad electrode PE2 of the scan pad S-PAD in the first direction DR1 and the width thereof in the second direction DR2, respectively. For example, in a plan view, the area of the first pad electrode PE1 may be substantially the same as the area of the second pad electrode PE2. Accordingly, the second pad electrode PE2 of the scan pad S-PAD may be disposed on the first pad electrode PE1 without a step.

For example, the second pad electrode PE2 of the scan pad S-PAD may overlap the first pad electrode PE1 in the third direction DR3, and the width of the first pad electrode PE1 of the scan pad S-PAD in the first direction DR1 and the width thereof in the second direction DR2 may be substantially the same as the width of the second pad electrode PE2 of the scan pad S-PAD in the first direction DR1 and the width thereof in the second direction DR2, respectively. As the second pad electrode PE2 is disposed not to surround the side surface of the first pad electrode PE1 of the scan-pad S-PAD, a step may not be formed at the second pad electrode PE2. Thus, the first pad electrode PE1 and the second pad electrode PE2 of the scan pad S-PAD may not overlap in the first direction DR1 or in the second direction DR2.

In other words, the buffer layer BL may include a first portion covering the top surface of the first pad electrode PE1 of the scan pad S-PAD, a second portion covering the side surface of the first pad electrode PE1 of the scan pad S-PAD and thus given an inclination, and a third portion covering the top surface of the substrate SUB. The second pad electrode PE2 of the scan pad S-PAD may be disposed on the first portion of the buffer layer BL to overlap the first portion in the third direction DR3, whereas the second pad electrode PE2 of the scan pad S-PAD may not overlap the second portion and the third portion of the buffer layer BL in the third direction DR3 as it is not disposed on the second portion and the third portion of the buffer layer BL.

As described above, since the scan pad S-PAD and the data pad D-PAD have substantially the same structure, the following description will focus on the data pad D-PAD, and a description of the scan pad S-PAD will be omitted.

Through the above-described configuration, a step may not be formed at the second pad electrode PE2. Thus, in case that the process of removing the via insulating material layer VIA' disposed in the pad area PDA is performed in the display device manufacturing process to be described later, the top surface of the second pad electrode PE2 may not be exposed. A detailed description thereof will be described below in conjunction with FIGS. 14 to 37.

Figure 27:
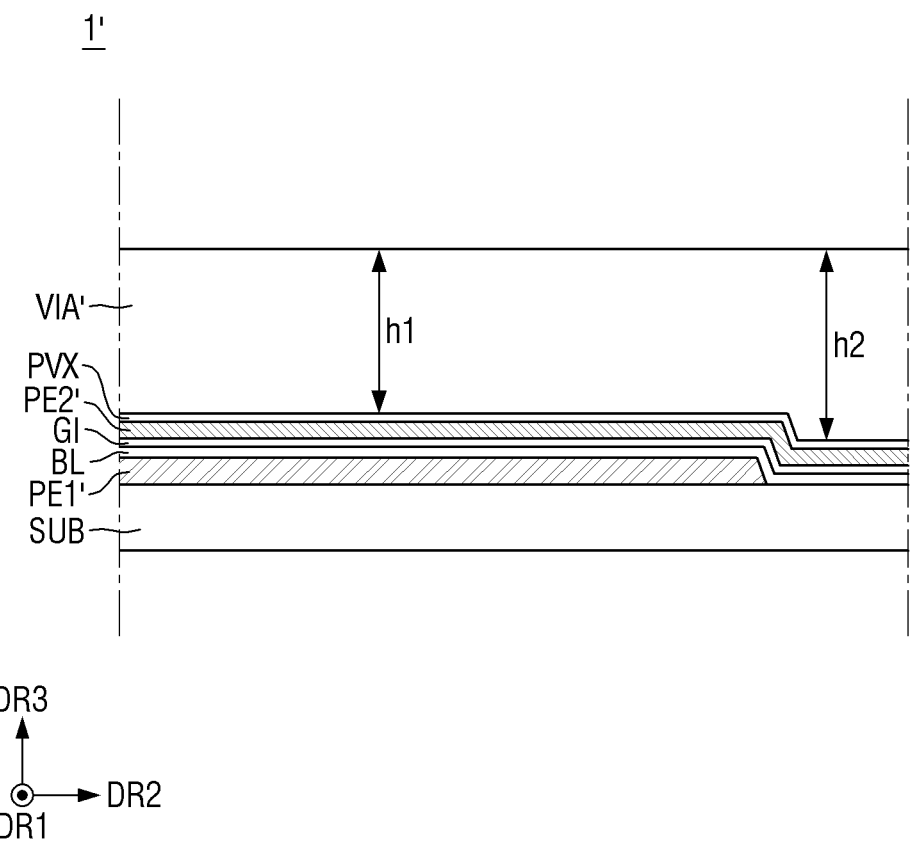
Figure 28:
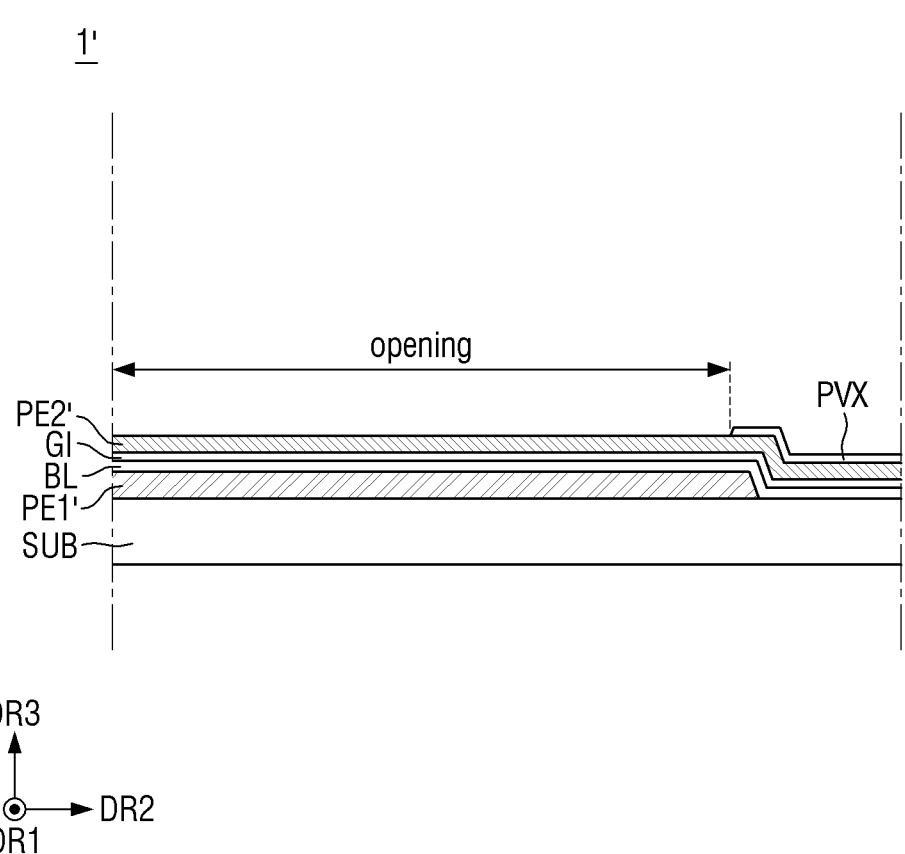

FIGS. 14 to 37 are diagrams illustrating processes of manufacturing a display device according to one embodiment. For example, FIGS. 14, 17 to 20, 22 to 24, 29 to 34, and 36 are schematic cross-sectional views illustrating individual processes of manufacturing the structure of FIG. 4 to produce the display device 1 according to one embodiment; FIG. 15 is a plan view illustrating the shapes of the scan line SL, the data line DL, the first pad electrode PE1, the second pad electrode PE2, the scan check line SLT, and the data check line DLT formed by a process of forming the first conductive layer 100; FIGS. 16, 21, 25, 26, and 35 are schematic cross-sectional views illustrating individual processes, taken along line X3-X3' of FIG. 8; and FIGS. 27 and 28 are schematic cross-sectional views schematically illustrating a cross section of the pad area PDA of the display device 1' according to a comparative example. The display device 1' according to the comparative example is different from the display device 1 according to one embodiment in that the second pad electrode PE2' is disposed to surround the side surface or a side surface of the first pad electrode PE1' to form a step.

Referring to FIGS. 14 to 37, a method of manufacturing the display device 1 according to one embodiment may include a step of forming the first conductive layer 100, a step of forming the buffer layer BL, a step of forming the semiconductor layer 200, a step of forming the gate insulating layer GI, a step of forming the second conductive layer 300, a step of forming the passivation layer PVX, a step of forming the via insulating layer VIA, a step of forming the alignment electrode layer RME, a step of forming the first insulating layer PAS1, a step of forming the inner bank BP and the outer bank BNL, a step of disposing the light emitting element ED, a step of forming the second insulating layer PAS2, and a step of forming the connection electrode layer CNE. Hereinafter, the above-described steps will be described in sequence.

Figure 14:
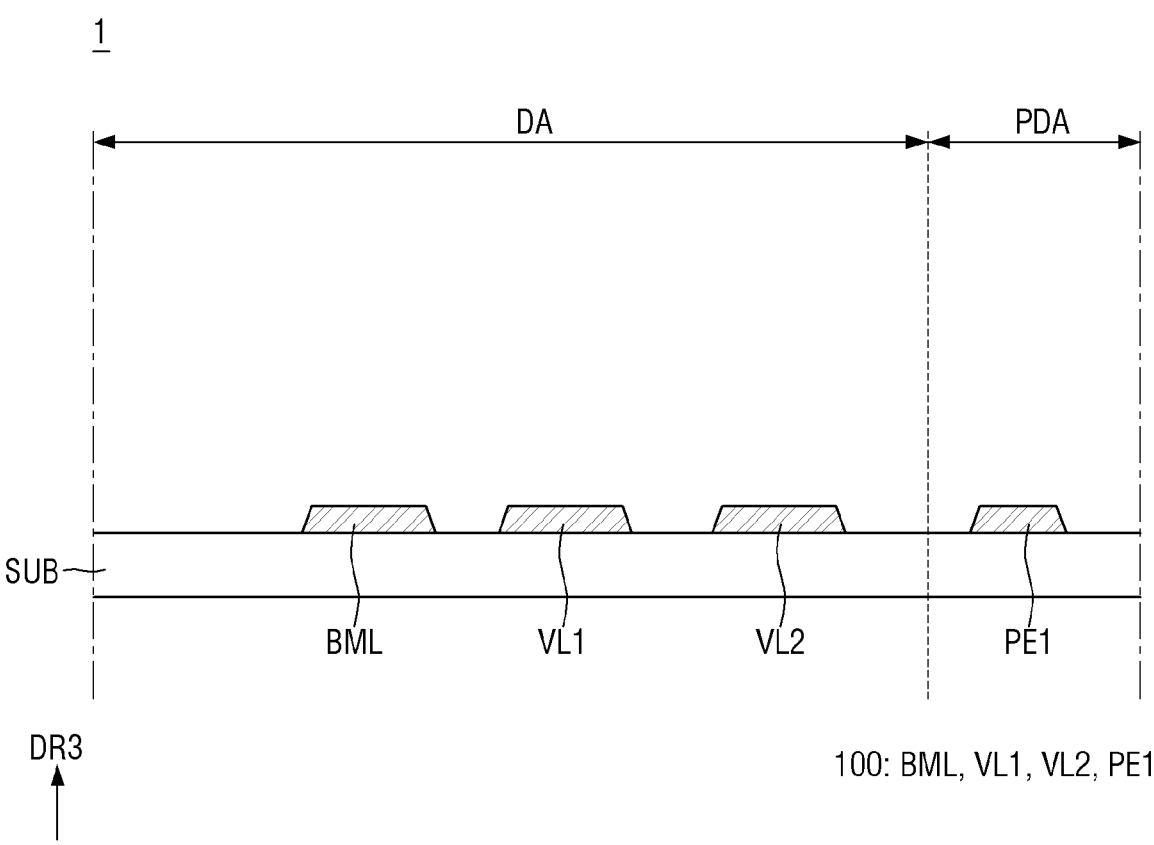
FIGS. 14 to 37 are diagrams illustrating processes of manufacturing a display device according to one embodiment.
Figure 16:
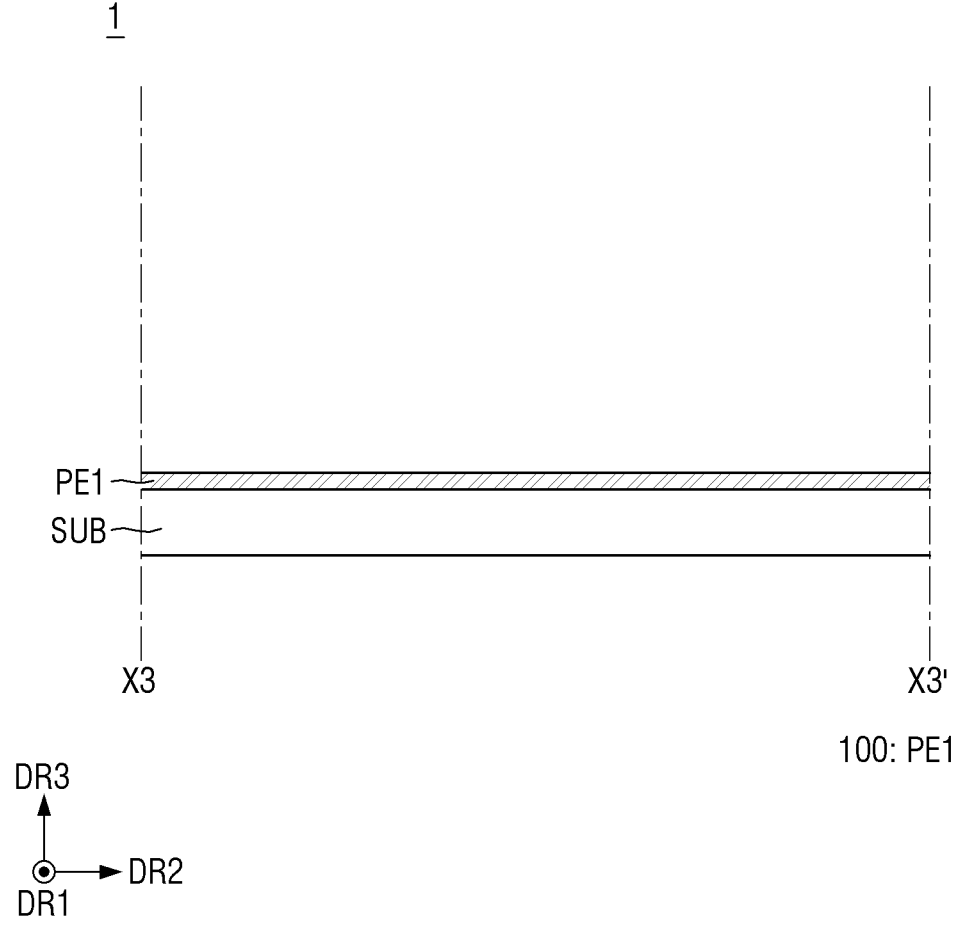

First, referring to FIGS. 14 to 16, the patterned first conductive layer 100 is formed on the substrate SUB. The patterned first conductive layer 100 may be formed by a mask process. For example, after a first conductive material layer is deposited on the entire substrate SUB, the first conductive material layer may be patterned through a photolithography process, so that the patterned first conductive layer 100 as shown in FIGS. 14 to 16 may be obtained. For example, the first conductive layer 100 may include the first voltage line VL1, the second voltage line VL2, and the light blocking pattern BML, disposed in the display area DA, include the first pad electrode PE1, the data check line DLT, and the scan check line SLT disposed in the pad area PDA, and include the scan line SL and the data line DL crossing or intersecting the pad area PDA and the display area DA.

Figure 17:
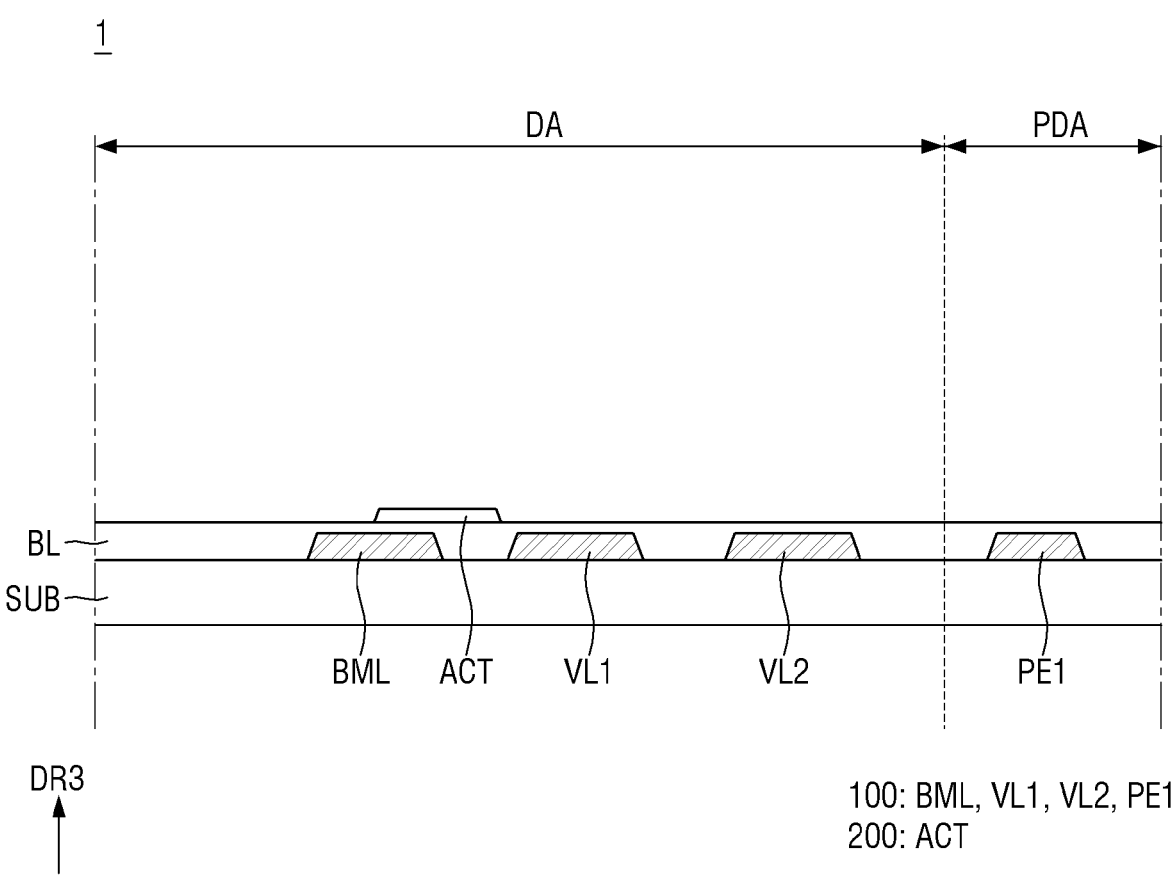

Now, referring to FIG. 17, the buffer layer BL is formed on the entire substrate SUB on which the first conductive layer 100 is formed, and the semiconductor layer 200 is formed on the buffer layer BL. The buffer layer BL may completely cover the first conductive layer 100. For example, the buffer layer BL may completely cover the first voltage line VL1, the second voltage line VL2 and the light blocking pattern BML disposed in the display area DA, and the first pad electrode PE1 disposed in the pad area PDA. The semiconductor layer 200 may be formed by a mask process. For example, after a semiconductor is deposited on the entire surface of the buffer layer BL, it is patterned through a photolithography process, so that the semiconductor layer 200 as shown in FIG. 17 may be obtained.

Figure 18:
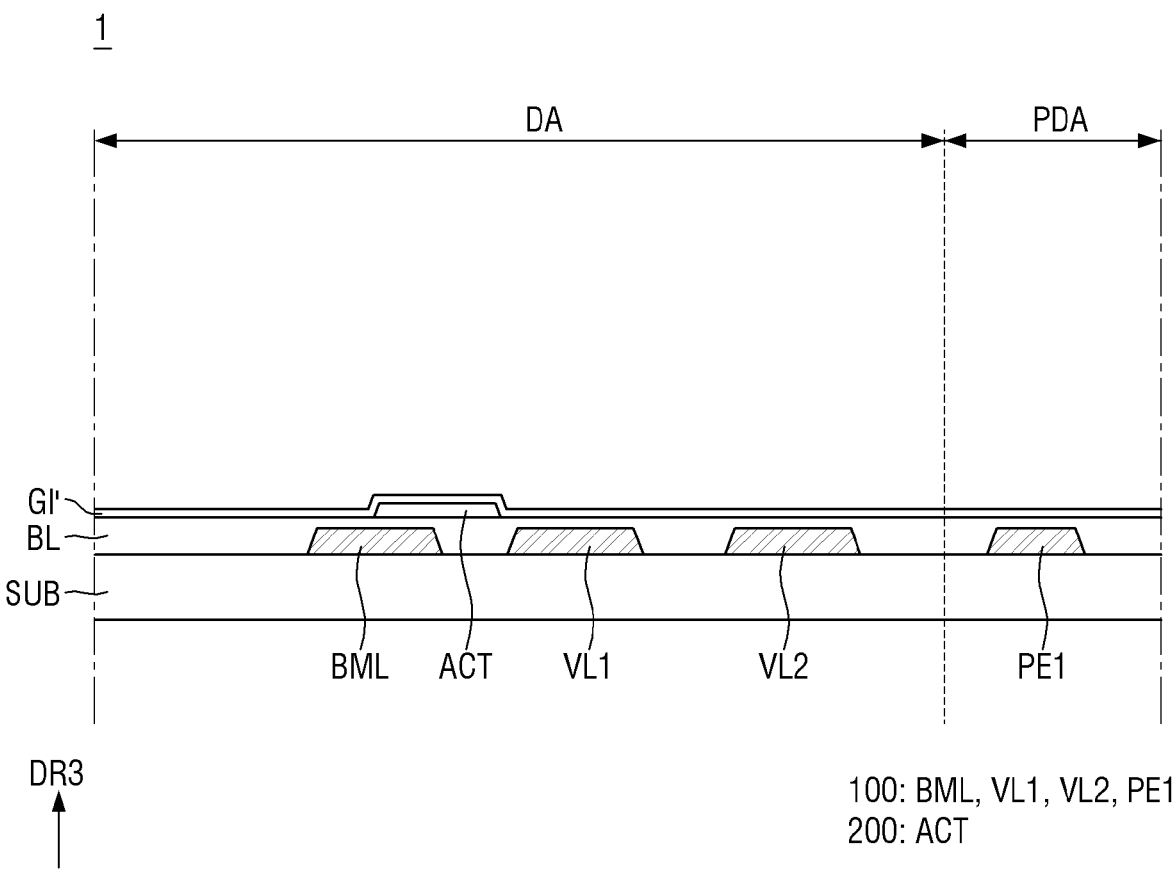
Figure 19:
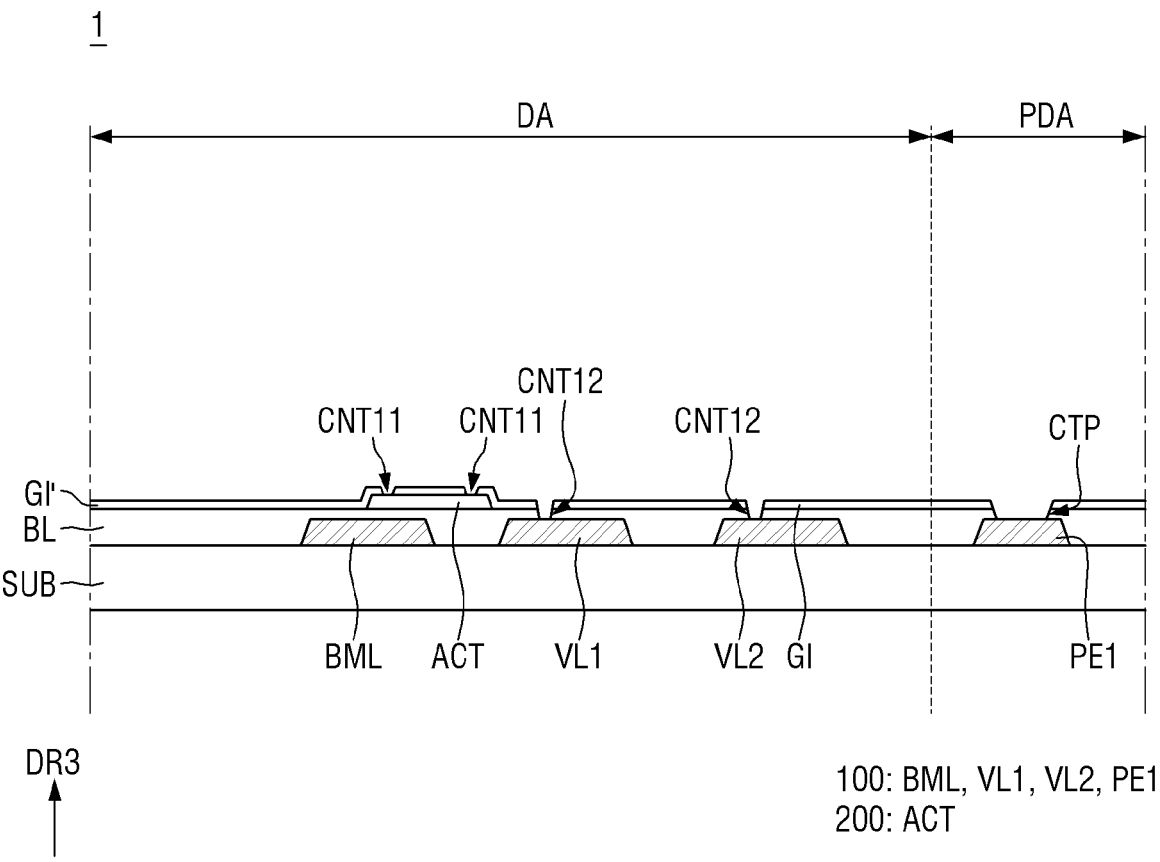

Referring to FIGS. 18 and 19, a gate insulating material layer GI' is formed on the buffer layer BL on which the semiconductor layer 200 is formed, and first contact holes CNT11 and second contact holes CNT12 exposing the first conductive layer 100 or the semiconductor layer 200 are formed. The process of forming the first contact holes CNT11 and second contact holes CNT12 may be implemented by a mask process.

For example, the gate insulating material layer GI' completely covering the semiconductor layer 200 is formed on the entire buffer layer BL on which the semiconductor layer 200 is formed, as shown in FIG. 18, and the first contact hole CNT11 exposing a part of the semiconductor layer 200 and the second contact hole CNT12 exposing a part of the first conductive layer 100 are formed, as shown in FIG. 19. The first contact hole CNT11 exposing a part of the semiconductor layer 200 may penetrate the gate insulating material layer GI', and the second contact hole CNT12 exposing a part of the first conductive layer 100 may penetrate the gate insulating material layer GI' and the buffer layer BL. As described above, the process of forming the first contact hole CNT11 and the second contact hole CNT12 may be implemented by a mask process.

Figure 20:
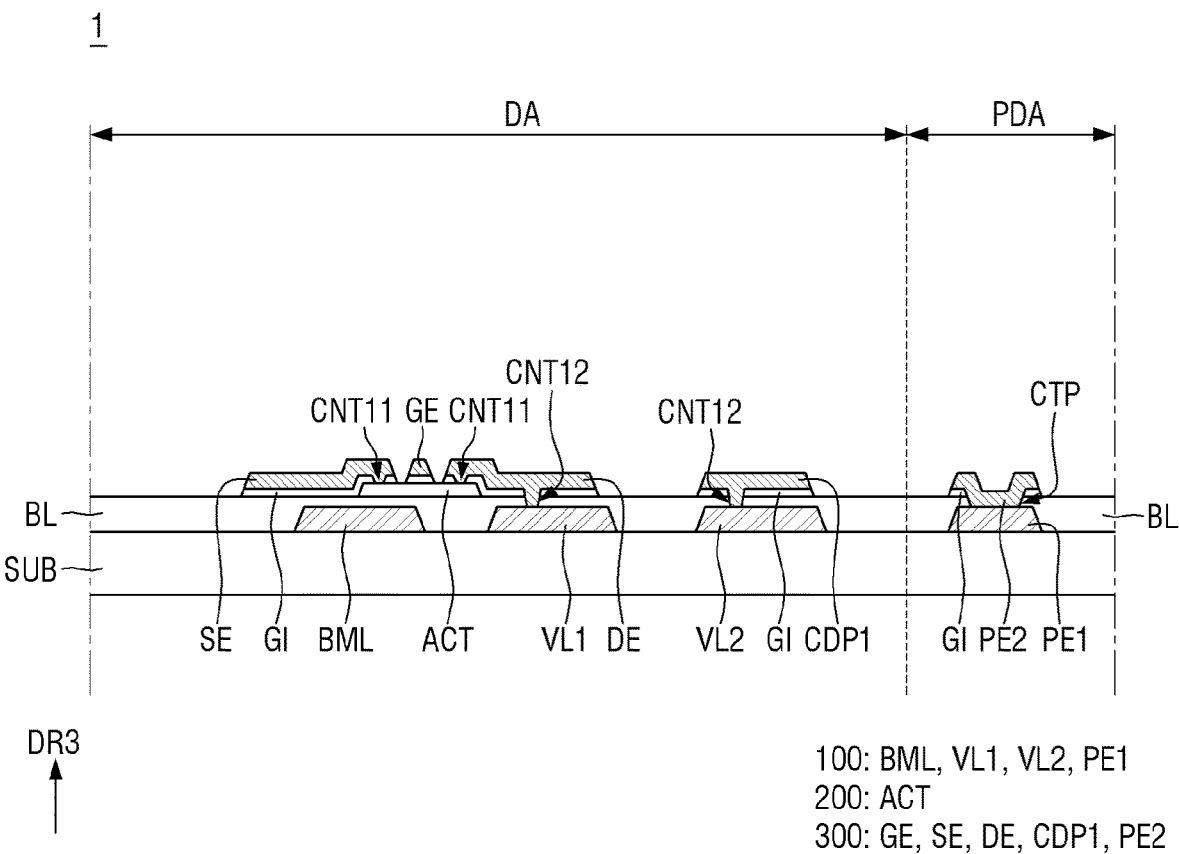
Figure 21:
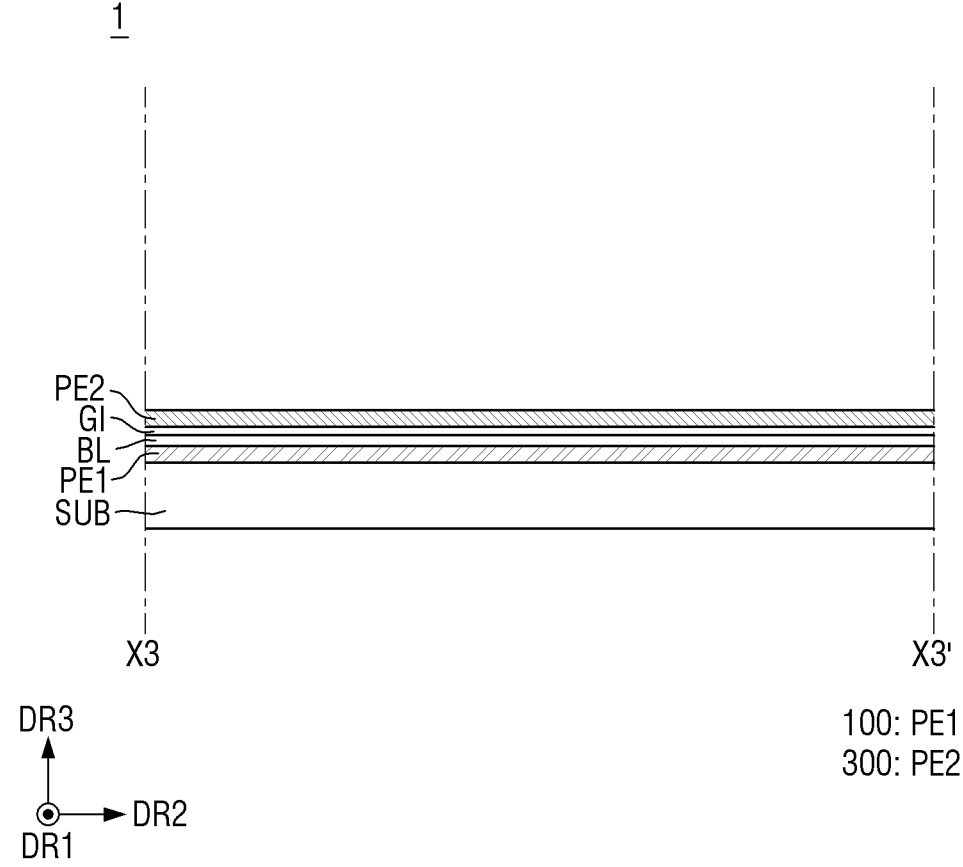
Figure 22:
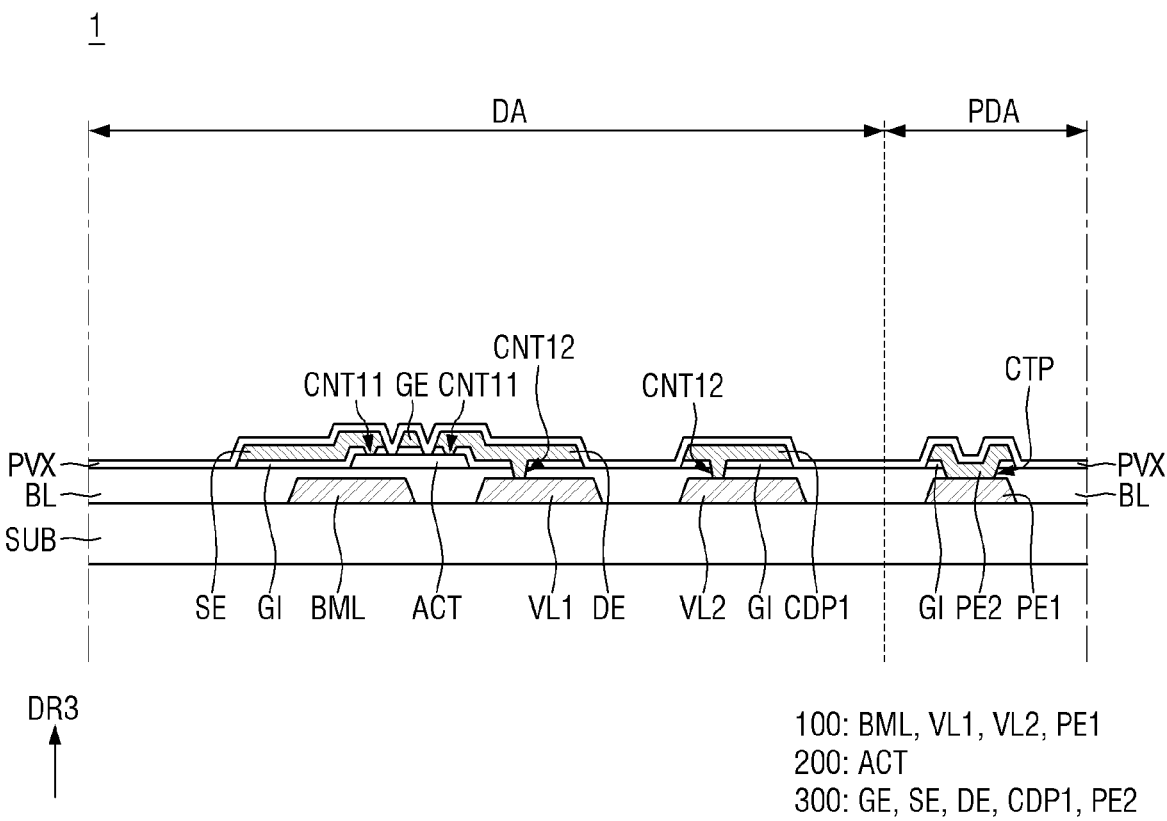
Figure 23:
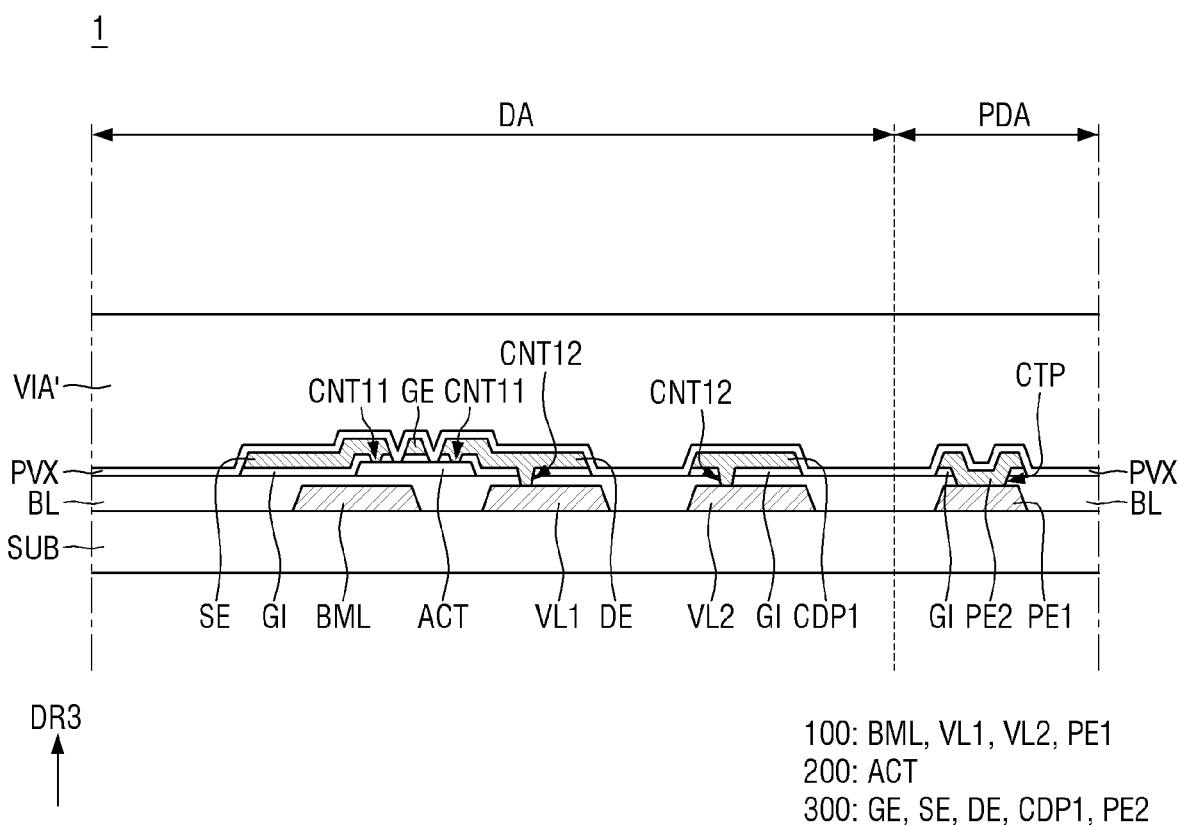
Figure 24:
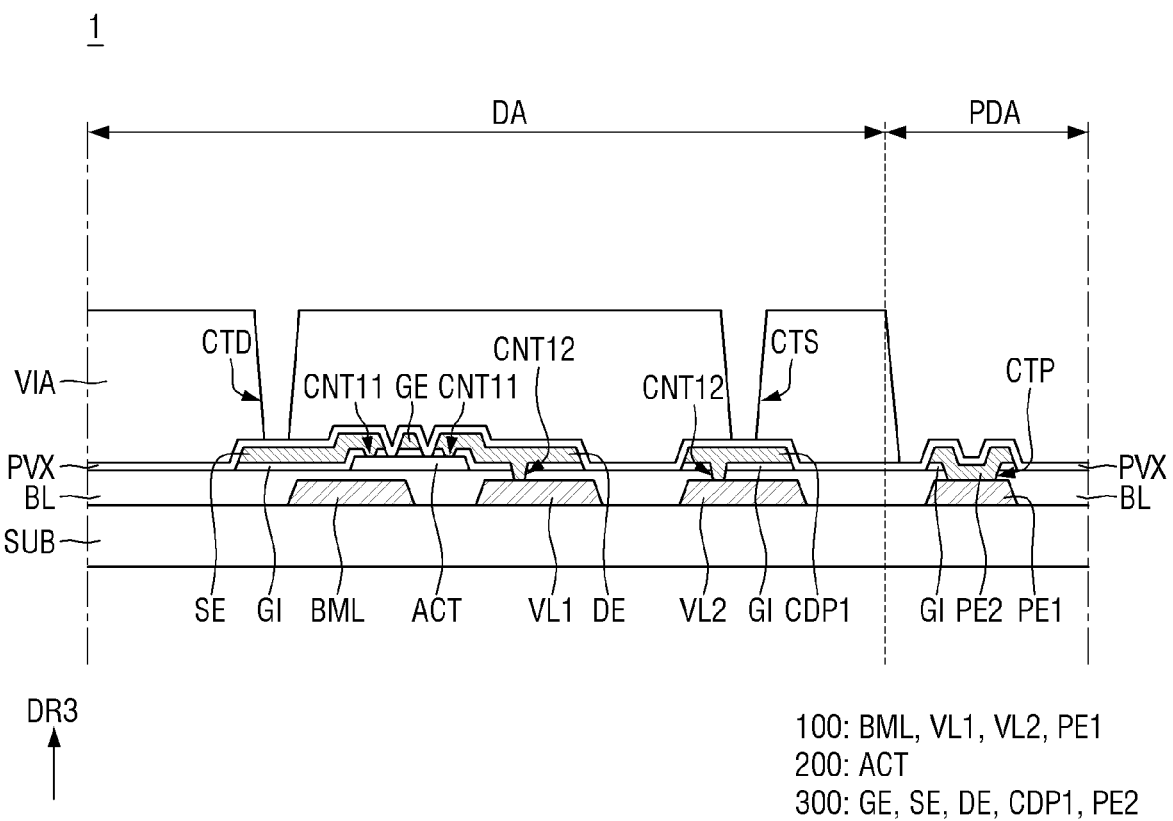
Figure 25:
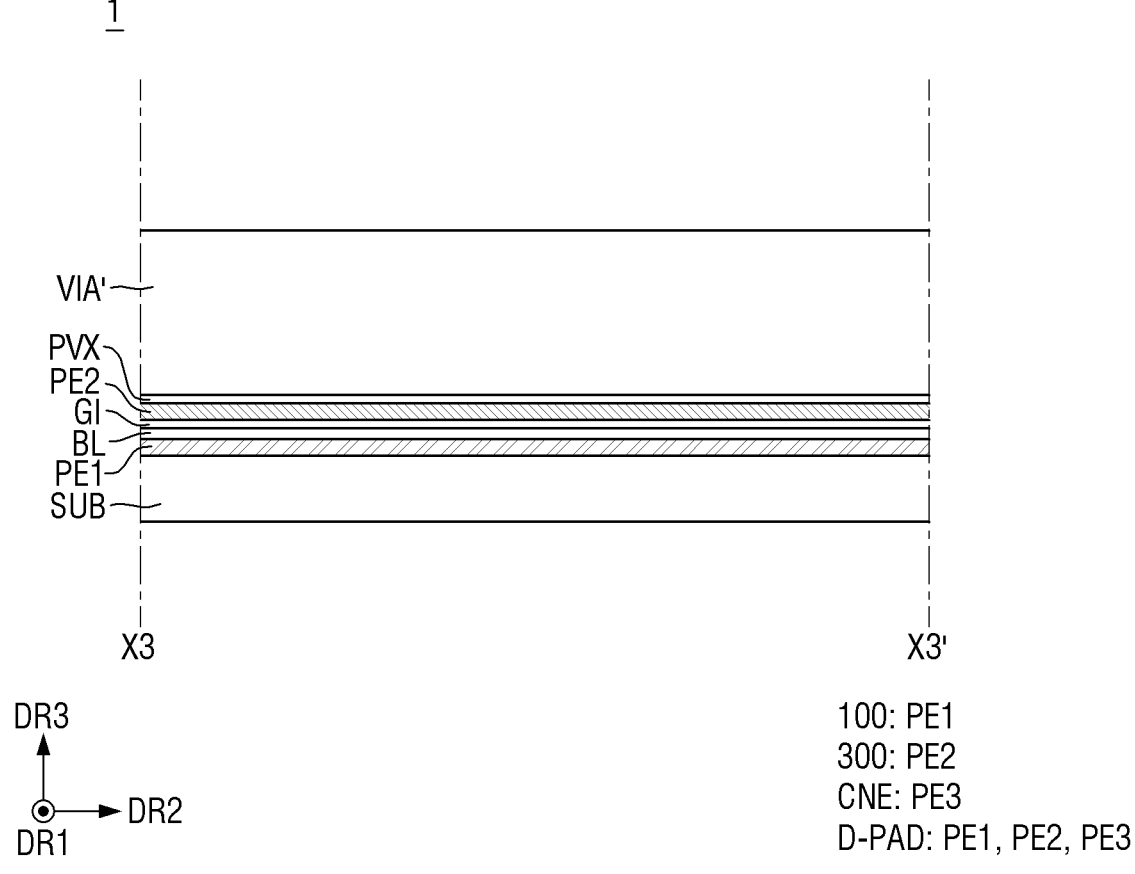
Figure 26:
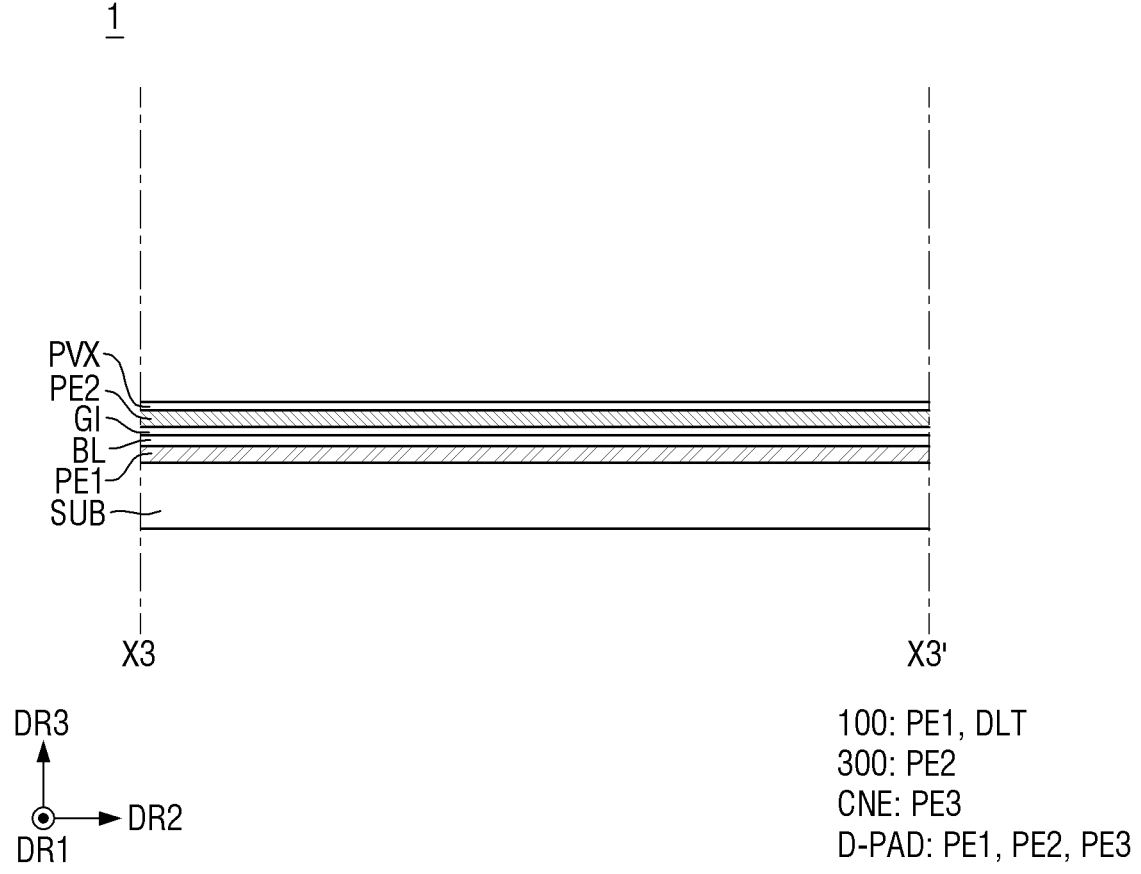

Subsequently, referring to FIGS. 20 and 21, the patterned gate insulating layer GI and the patterned second conductive layer 300 are formed on the buffer layer BL in which the second contact hole CNT12 is formed. The patterned gate insulating layer GI and the patterned second conductive layer 300 may be formed by one mask process. Through this process, the sidewall of the second conductive layer 300 and the sidewall of the gate insulating layer GI may be aligned with each other. For example, after a second conductive material layer is deposited on the entire gate insulating material layer GI' in which the first contact hole CNT11 is formed, a photoresist layer is applied on the second conductive material layer, and a photoresist pattern is formed through exposure and development. By using this photoresist pattern as an etching mask, the second conductive material layer and the gate insulating material layer GI' in which the first contact hole CNT11 is formed are sequentially etched to form the gate insulating layer GI and the second conductive layer 300. Thereafter, a process of removing the photoresist pattern may be additionally performed. As described above, the second conductive layer 300 may include the gate electrode GE, the drain electrode DE, the source electrode SE, the first conductive pattern CDP1, and the second pad electrode PE2. The pad area PDA shown in FIG. 15 may be the same as illustrated in FIG. 7.

Referring to FIGS. 22 to 26, the passivation layer PVX is stacked on the buffer layer BL on which the second conductive layer 300 is formed, and the patterned via insulating layer VIA is formed.

The passivation layer PVX is disposed entirely over the display area DA and the non-display area NDA, and may completely cover the patterned second conductive layer 300. The patterned via insulating layer VIA may be disposed in the display area DA, but may not be disposed in the pad area PDA. Accordingly, the patterned via insulating layer VIA may expose the passivation layer PVX formed in the pad area PDA of the non-display area NDA.

The patterned via insulating layer VIA may be disposed in the display area DA, and may include the first electrode contact hole CTD overlapping the source electrode SE and the second electrode contact hole CTS overlapping the first conductive pattern CDP1. The first electrode contact hole CTD may expose a part of the passivation layer PVX overlapping the source electrode SE, and the second electrode contact hole CTS may expose a part of the passivation layer PVX overlapping the first conductive pattern CDP1.

The patterned via insulating layer VIA may be formed by a mask process. For example, after the passivation layer PVX is deposited on the entire buffer layer BL on which the second conductive layer 300 is formed, the via insulating material layer VIA' is applied on the passivation layer PVX. The via insulating material layer VIA' disposed in the pad area PDA of the non-display area NDA is removed through exposure and development to form the first electrode contact hole CTD and the second electrode contact hole CTS, so that the patterned via insulating layer VIA is obtained.

As the via insulating material layer VIA' is removed from the pad area PDA, the passivation layer PVX disposed on the second pad electrode PE2 may be exposed. In case that the via insulating material layer VIA' is removed from the pad area PDA, the second pad electrode PE2 may be covered by the passivation layer PVX and may not be exposed to the outside. Accordingly, an etchant for use in etching the alignment electrode layer RME to be described later may not permeate into the second pad electrode PE2, so that the second pad electrode PE2 may be prevented from being etched in the etching process of the alignment electrode layer RME.

However, in the case of the display device 1 according to the comparative example in which the second pad electrode PE2 is disposed to surround the side surface of the first pad electrode PE1 to form the step, the thickness of the via insulating material layer VIA' disposed on the passivation layer PVX may vary depending on regions, as illustrated in FIGS. 27 and 28. Thus, in a region overlapping the first pad electrode PE1 and the second pad electrode PE2, the passivation layer PVX may be removed together with the via insulating material layer VIA', so that the second pad electrode PE2 may be exposed.

For example, in the case of the display device 1 according to the comparative example, since the width of the first pad electrode PE1 in the second direction DR2 is smaller than the width of the second pad electrode PE2 in the second direction DR2, the second pad electrode PE2 may surround the side surface of the first pad electrode PE1 in the second direction DR2 as well as the top surface thereof. For example, the first pad electrode PE1 may overlap the second pad electrode PE2 in the first direction DR1 or the second direction DR2 as well as in the third direction DR3. In other words, the second pad electrode PE2 may have the region overlapping the first pad electrode PE1 and the region not overlapping the first pad electrode PE1, and a step may or may not be formed at the second pad electrode PE2 depending on the presence or absence of the first pad electrode PE1. Due to the step of the second pad electrode PE2, the via insulating material layer VIA' may have a first thickness h1 in the region overlapping the first pad electrode PE1, and may have a second thickness h2 larger than the first thickness in the region not overlapping the first pad electrode PE1. Accordingly, in case that the via insulating material layer VIA' is removed from the pad area PDA, the via insulating material layer VIA' and the passivation layer PVX may be removed together in the region overlapping the first pad electrode PE1 having the relatively smaller thickness, so that an opening through which the second pad electrode PE2 is exposed may be formed. Since the second pad electrode PE2 is exposed to the etchant for use in the etching process of the alignment electrode layer RME to be described later, the second pad electrode PE2 may also be etched, resulting in degradation of electrical connection to the driver (see FIG. 2).

Accordingly, by setting the width of the first pad electrode PE1 and the width of the second pad electrode PE2 to be substantially the same so that a step is not formed at the second pad electrode PE2, the second pad electrode PE2 may be prevented from being etched by the etchant to be used in the etching process of the alignment electrode layer RME.

Subsequently, referring to FIG. 29, by etching the passivation layer PVX using the via insulating layer VIA patterned in the display area DA as an etching mask, the first electrode contact hole CTD and the second electrode contact hole CTS are formed in the passivation layer PVX. For example, in case that the passivation layer PVX disposed below the via insulating layer VIA of FIG. 24 patterned in the display area DA is etched by using the patterned via insulating layer VIA as the etching mask, the passivation layer PVX exposed by the patterned via layer may be etched. Accordingly, an additional mask process may not be required for the process of forming the first electrode contact hole CTD and the second electrode contact hole CTS in the passivation layer PVX.

Figure 29:
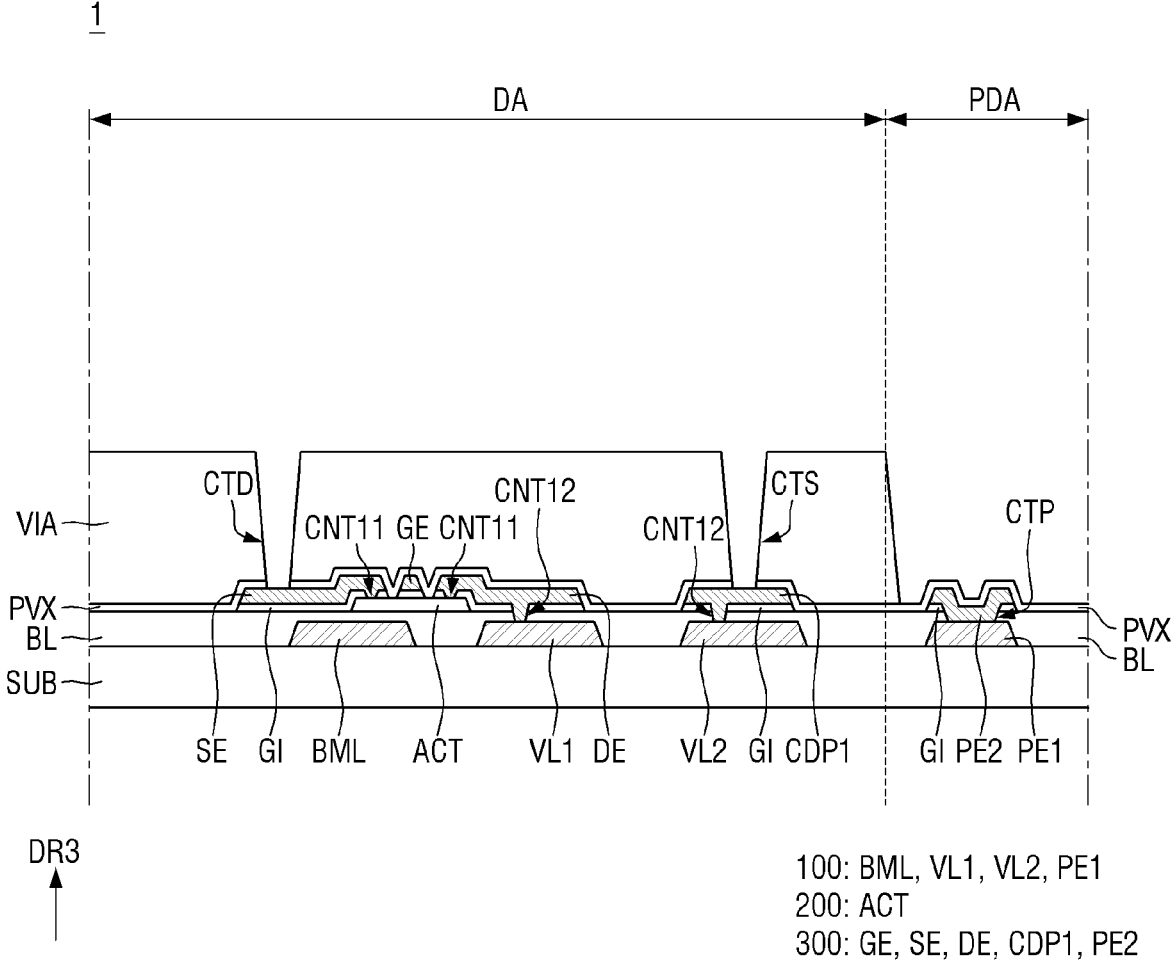

As illustrated in FIG. 29, the sidewall of the passivation layer PVX patterned in the display area DA may be aligned in parallel with the sidewall of the via insulation layer VIA through the process of forming the first electrode contact hole CTD and the second electrode contact hole CTS in the passivation layer PVX. Since the passivation layer PVX is not etched in the pad area PDA, the passivation layer PVX on the second pad electrode PE2 disposed in the pad area PDA may be left.

Figure 30:
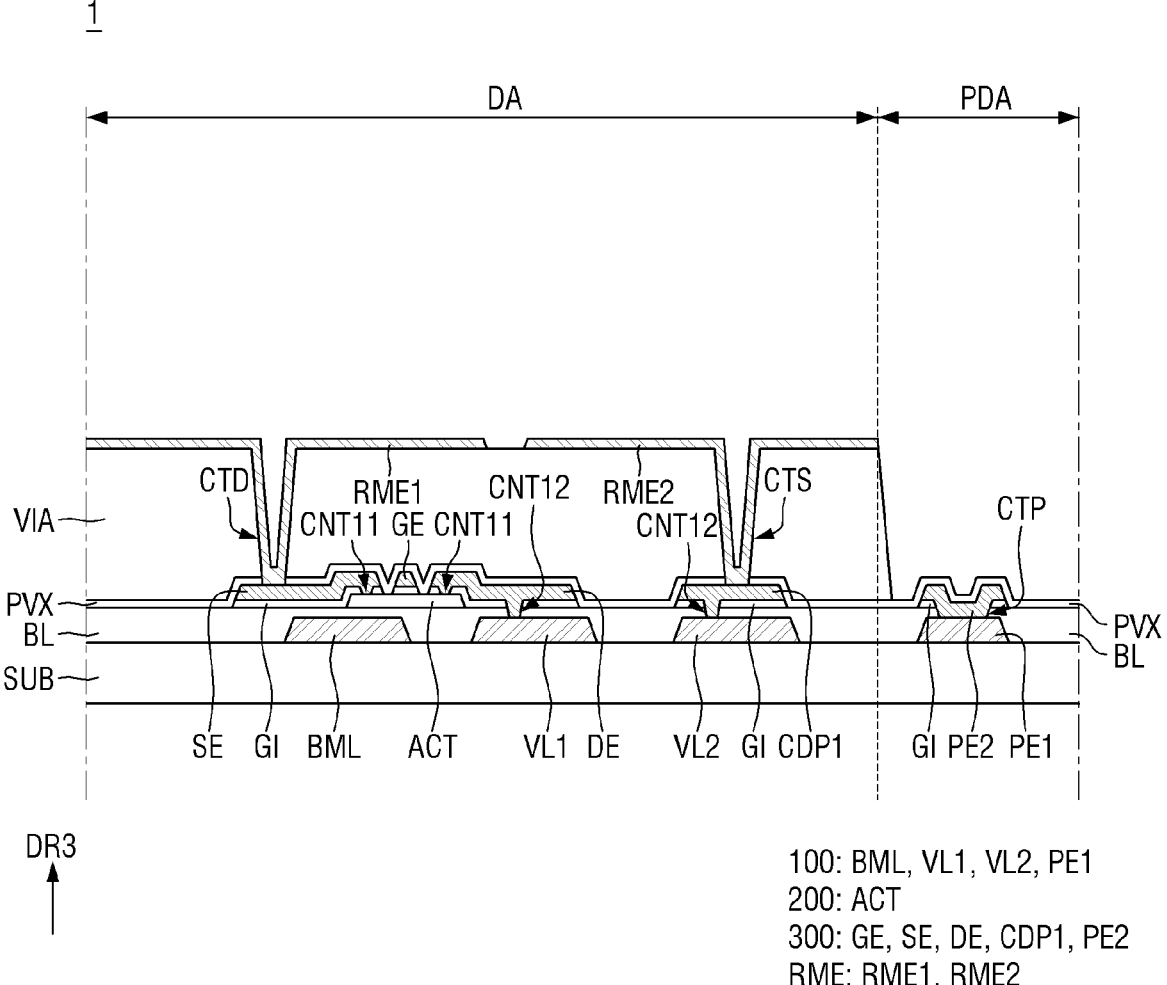

Subsequently, referring to FIG. 30, the patterned alignment electrode layer RME is formed on the via insulating layer VIA in which the first electrode contact hole CTD and the second electrode contact hole CTS are formed. The process of forming the patterned alignment electrode layer RME may be implemented by a mask process.

For example, in the process of forming the patterned alignment electrode layer RME, the alignment electrode material layer is deposited entirely on the via insulating layer VIA patterned in the display area DA and on the passivation layer PVX in the pad area PDA. By patterning the deposited alignment electrode material through a photolithography process, the patterned alignment electrode layer RME as shown in FIG. 30 may be obtained. In an embodiment, the patterning of the alignment electrode layer RME may be performed by wet etching using an etchant. The passivation layer PVX disposed on the second pad electrode PE2 in the pad area PDA may prevent the etchant from reaching the second pad electrode PE2, thus preventing the second pad electrode PE2 from being etched.

The patterned alignment electrode layer RME may include the first alignment electrode RME1 and the second alignment electrode RME2. In the display area DA, the first alignment electrode RME1 may be deposited to the inside of the first electrode contact hole CTD to be in contact with and electrically connected to the source electrode SE, and the second alignment electrode RME2 may be deposited to the inside of the second electrode contact hole CTS to be in contact with and electrically connected to the first conductive pattern CDP1.

Figure 31:
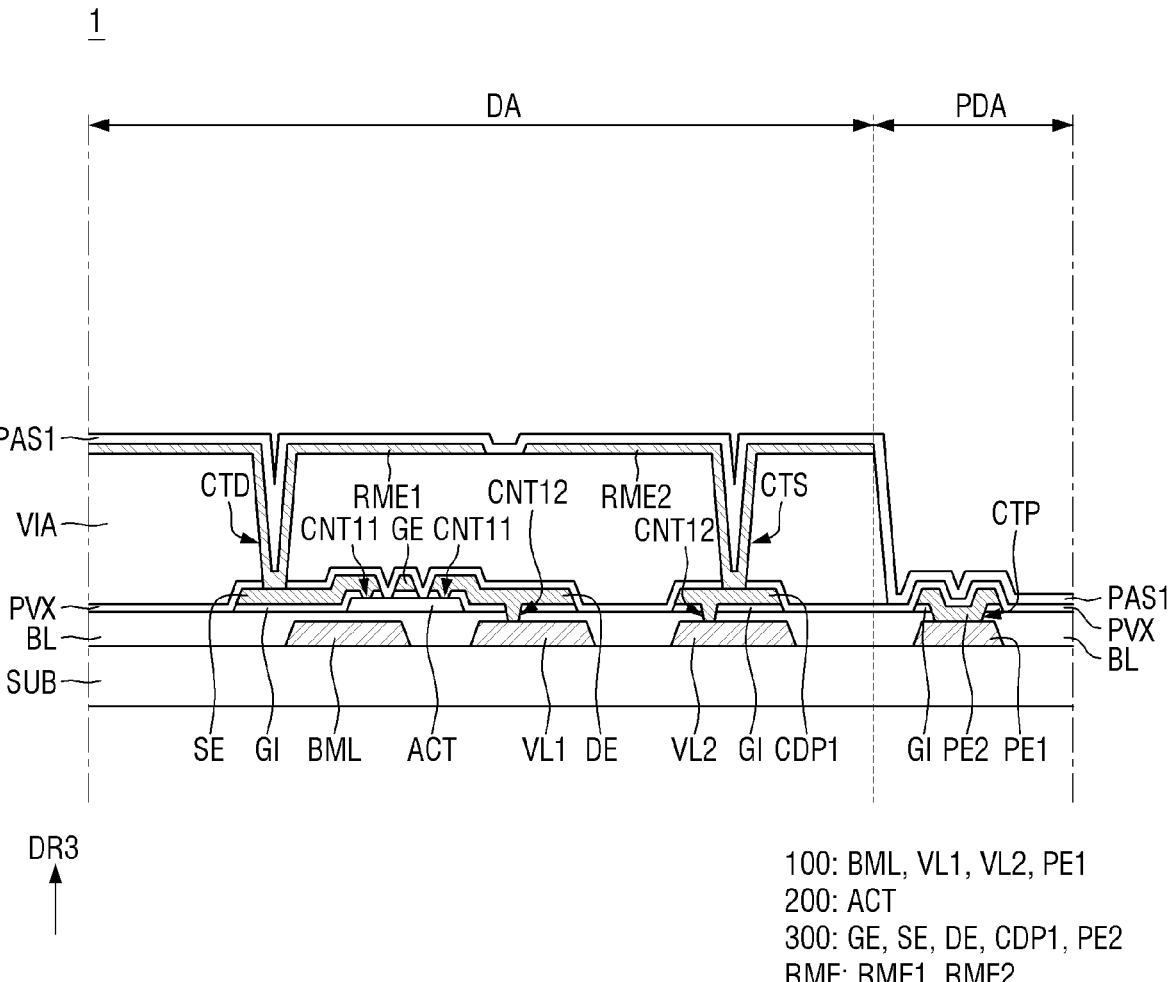
Figure 32:
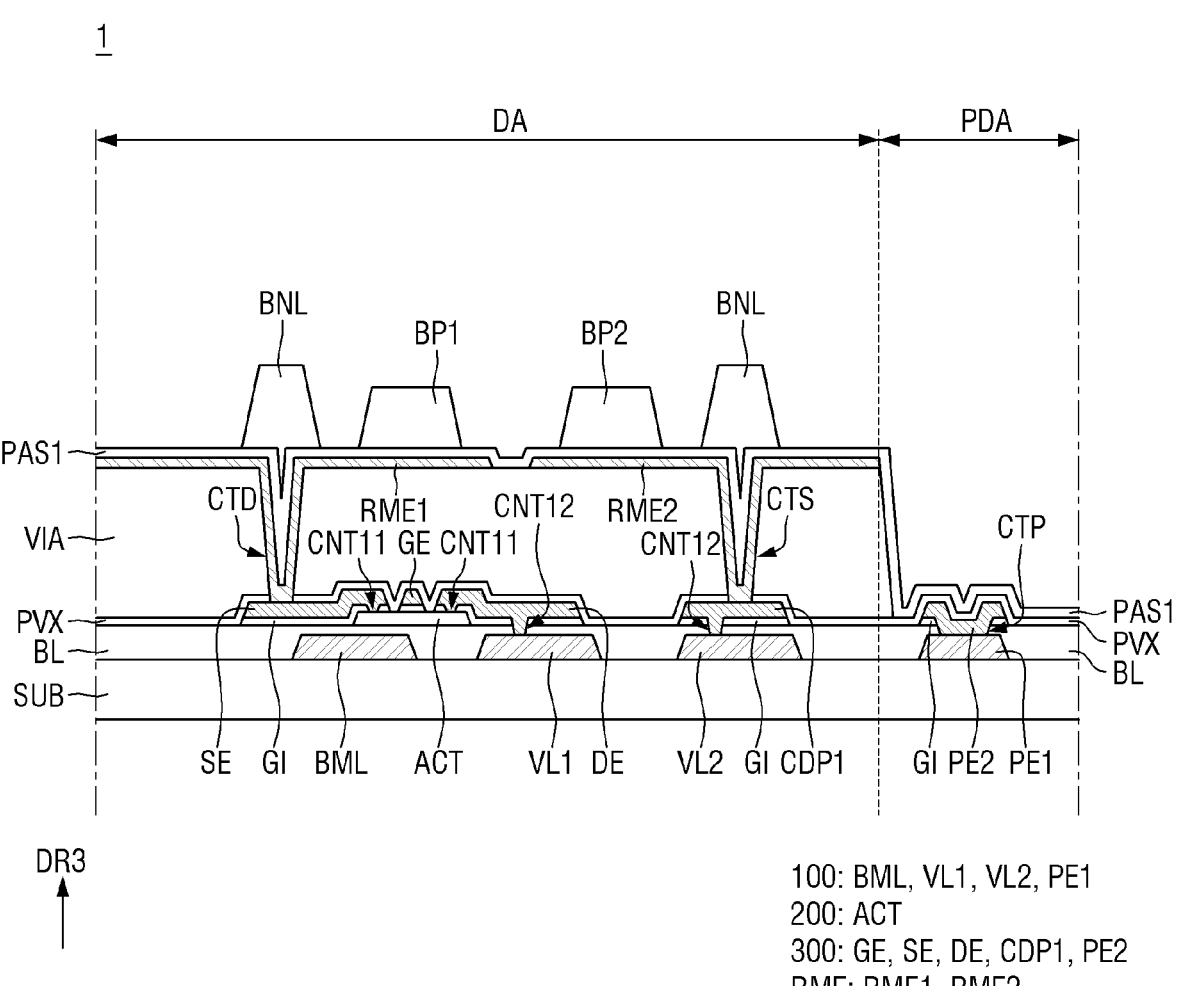

Referring to FIGS. 31 and 32, the first insulating layer PAS1 is formed entirely over the display area DA and the non-display area NDA, and the inner bank BP and the outer bank BNL are formed on the first insulating layer PAS1.

Since the first insulating layer PAS1 is formed entirely in the display area DA and the non-display area NDA, it may be formed not only in the display area DA but also in the pad area PDA. Accordingly, the first insulating layer PAS1 may be disposed on the passivation layer PVX disposed on the second pad electrode PE2 of the pad area PDA.

The inner bank BP and the outer bank BNL may be formed by a mask process. For example, after applying an organic material layer for a bank layer on the first insulating layer PAS1, exposure and development may be performed to form the inner bank BP and the outer bank BNL as shown in FIG. 32. The inner bank BP and the outer bank BNL may have different thicknesses, which may be formed using a halftone mask or a slit mask. As stated above, the inner bank BP may include the first inner bank BP1 and the second inner bank BP2.

Since the first insulating layer PAS1 is formed to cover the alignment electrode layer RME before forming the inner bank BP and the outer bank BNL, the alignment electrode layer RME may be prevented from being damaged by the process of forming the inner bank BP and the outer bank BNL.

Figure 33:
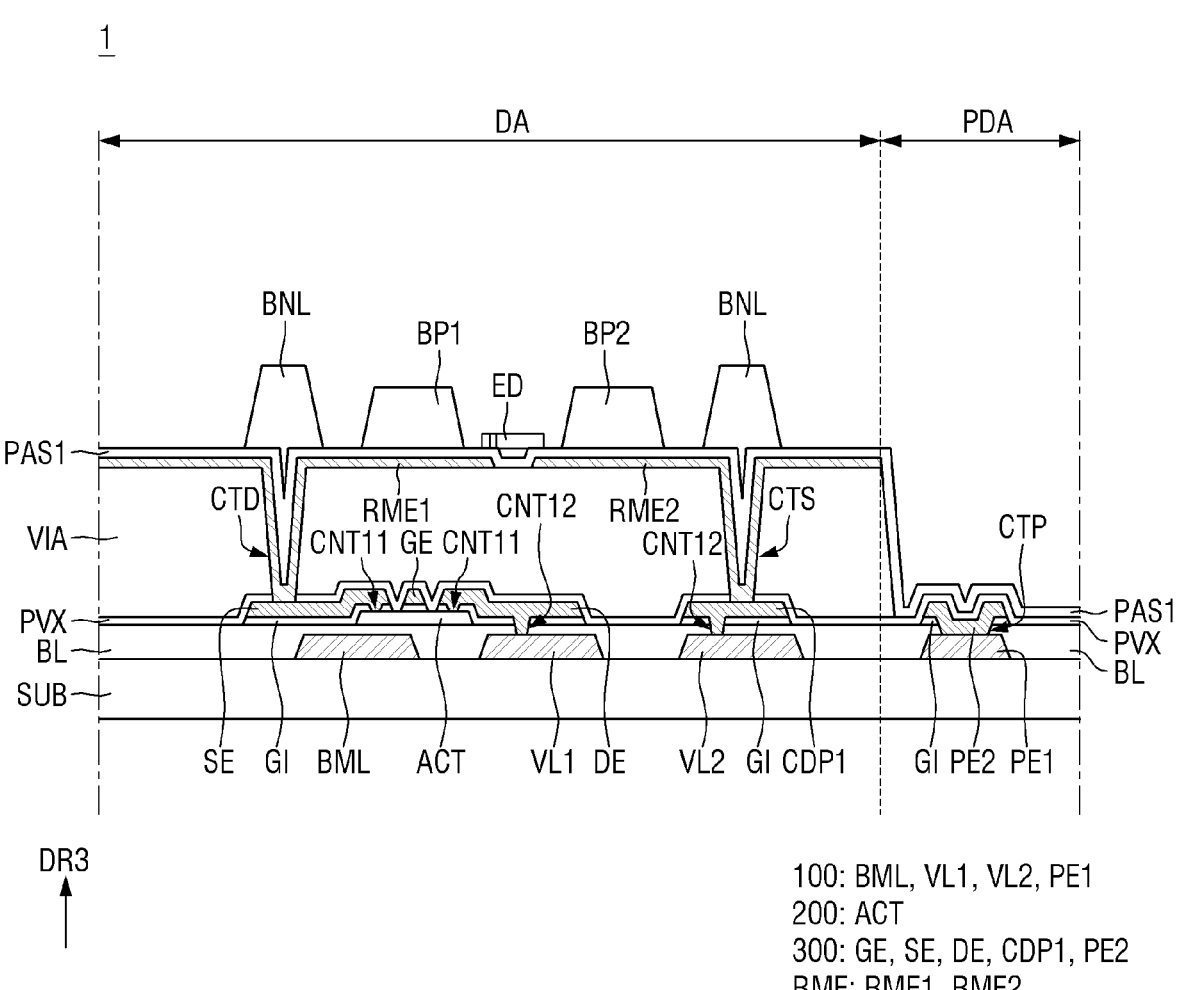

Subsequently, referring to FIG. 33, the light emitting elements ED are disposed in the space between the first inner bank BP1 and the second inner bank BP2. Through an inkjet printing process, the light emitting elements ED may be disposed on the first insulating layer PAS1 positioned in the space between the first inner bank BP1 and the second inner bank BP2.

For example, if an alignment signal is applied to the first alignment electrode RME1 and the second alignment electrode RME2 after an ink in which the light emitting elements ED are dispersed is ejected into the emission area EMA (see FIG. 4) partitioned by the outer bank BNL, the light emitting elements ED may be seated on the first insulating layer PAS1 between the first alignment electrode RME1 and the second alignment electrode RME2 while the positions and orientation directions of the light emitting elements ED in the ink are changed.

Figure 34:
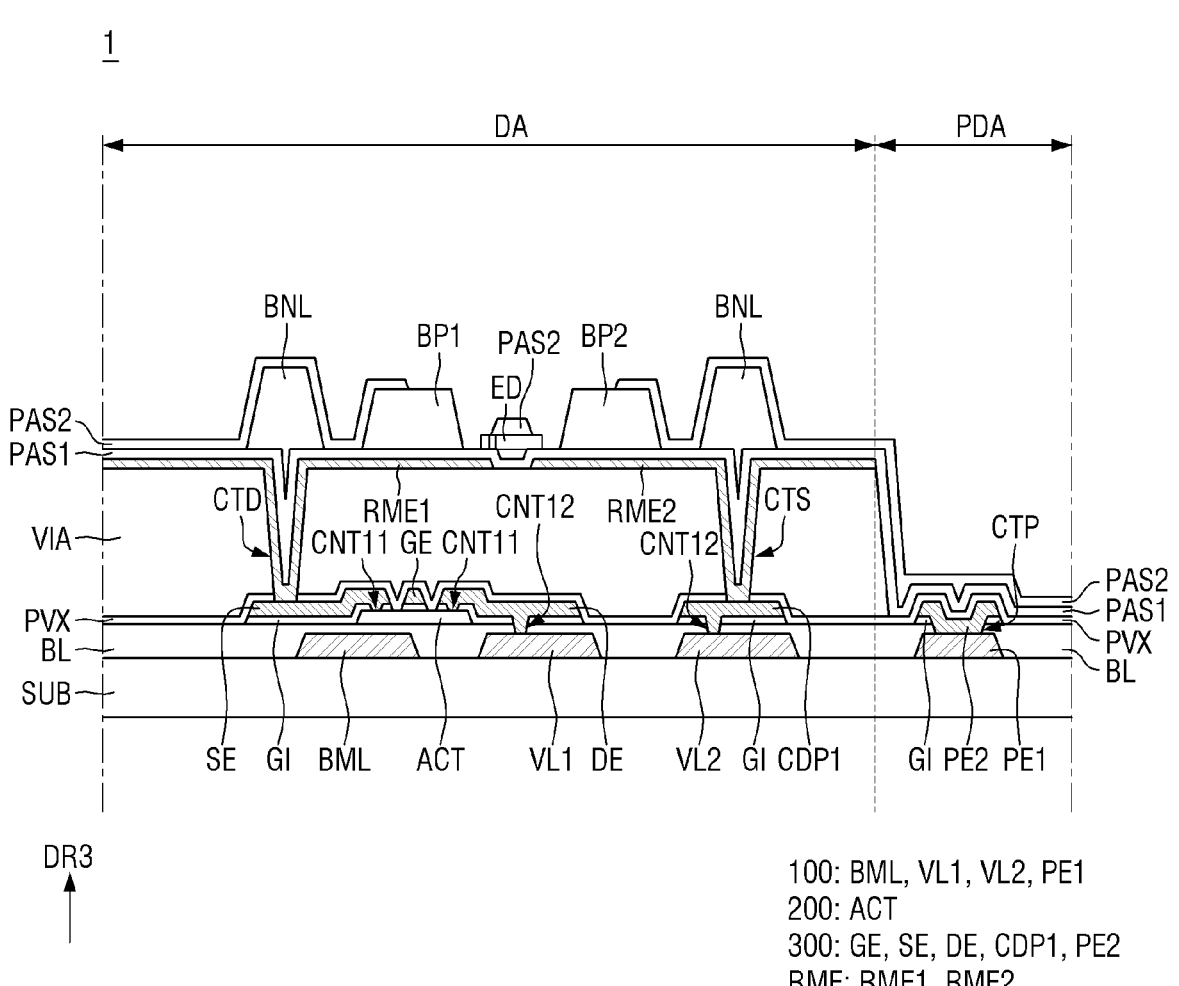
Figure 35:
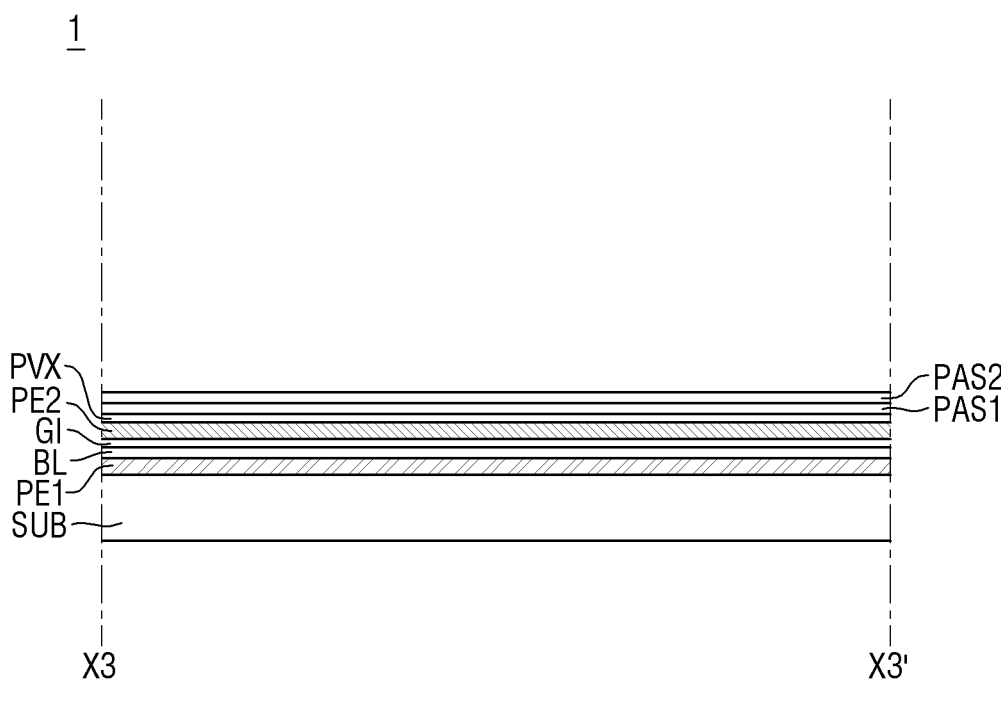
Figure 35:
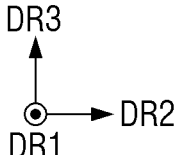

Referring to FIGS. 34 and 35, the patterned second insulating layer PAS2 is formed on the first insulating layer PAS1 in which the light emitting elements ED, the outer bank BNL, and the inner bank BP are disposed. The patterned second insulating layer PAS2 may be formed by a mask process.

For example, after a second insulating material layer is deposited on the entire first insulating layer PAS1 in which the light emitting elements ED, the outer bank BNL, and the inner bank BP are formed, a photoresist pattern exposing a part of the alignment electrode layer RME in the display area DA is formed on the second insulating material layer. Using this photoresist pattern as an etching mask, the second insulating material layer is etched to form the patterned second insulating layer PAS2 as shown in FIG. 34.

The patterned second insulating layer PAS2 may include a pattern portion exposing both ends of the light emitting element ED in the display area DA. The pattern portion may be disposed on the light emitting element ED to expose both ends of the light emitting element ED. The patterned second insulating layer PAS2 may be disposed on the first insulating layer PAS1 in the pad area PDA.

Figure 36:
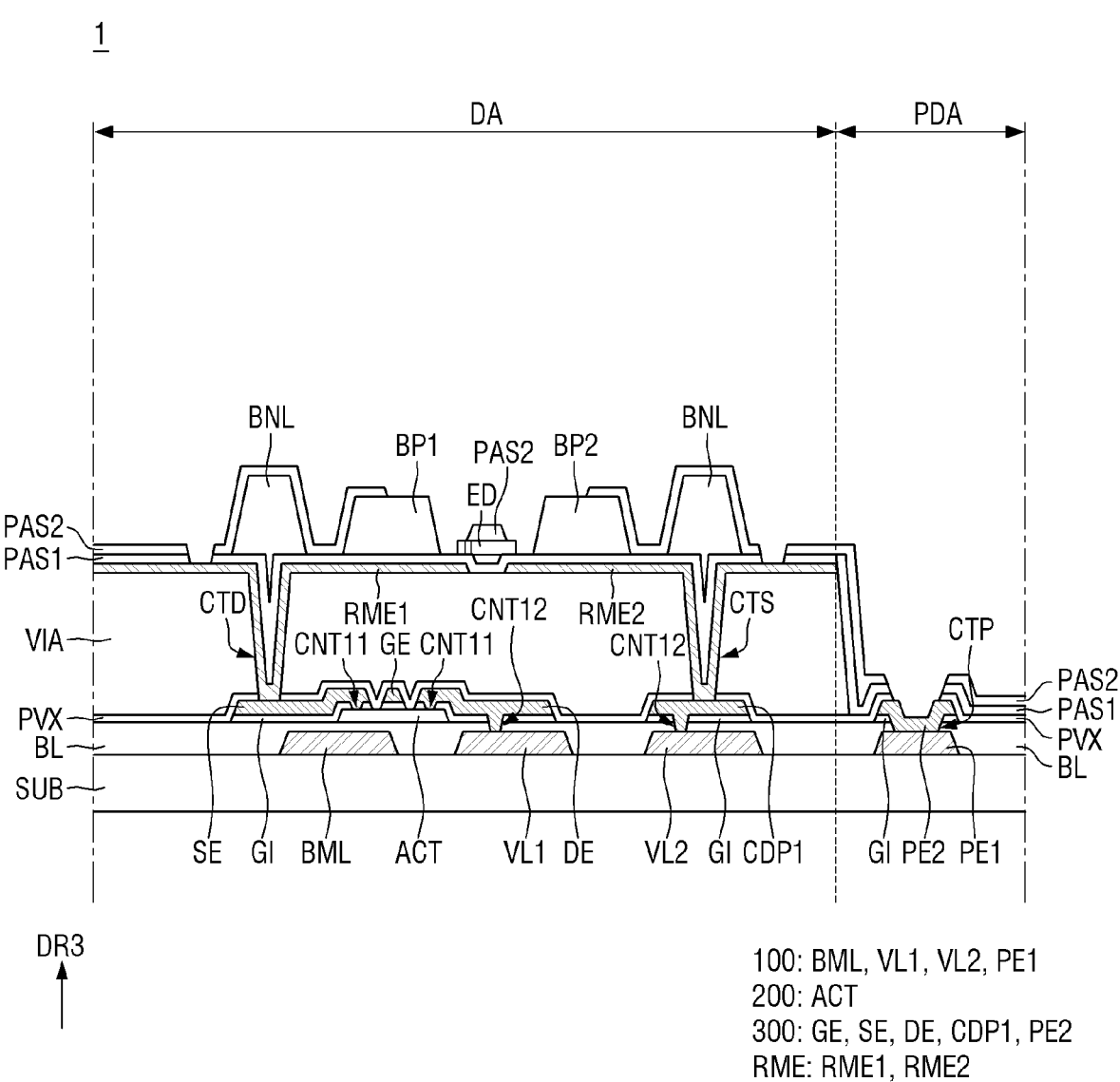
Figure 37:
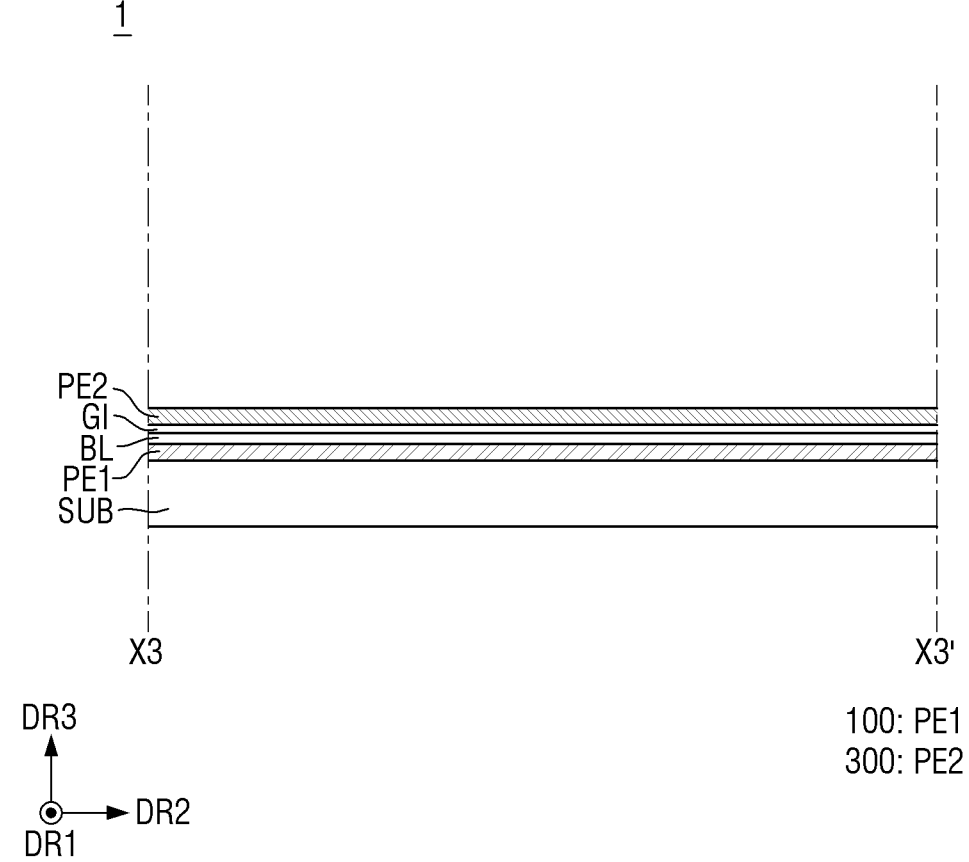

Subsequently, referring to FIGS. 36 and 37, the first contact portion CT1 and the second contact portion CT2 penetrating the first insulating layer PAS1 and the second insulating layer PAS2 are formed in the display area DA, and the pad opening penetrating the first insulating layer PAS1, the second insulating layer PAS2 and the passivation layer PVX is formed in the pad area PDA. The process of forming the first contact portion CT1, the second contact portion CT2, and the pad opening may be implemented by a mask process.

For example, the first contact portion CT1, the second contact portion CT2, and the pad opening may be formed by patterning, through a photolithography process, portions on the second insulating layer PAS2 except the portions corresponding to the first contact portion CT1, the second contact portion CT2, and the pad opening.

In the pad area PDA, the pad opening may expose the top portion of the second pad electrode PE2, thus allowing the second pad electrode PE2 to be in contact with and electrically connected to the third pad electrode PE3 of the connection electrode layer CNE in the subsequent process of disposing the connection electrode layer CNE.

Thereafter, the connection electrode layer CNE is formed on the second insulating layer PAS2 to arrange the first connection electrode CNE1 and the second connection electrode CNE2 in the display area DA, and the third pad electrode PE3 is disposed in the pad area PDA. Thus, the display device 1 according to the embodiment of FIG. 4 may be manufactured.

Hereinafter, other embodiments of the display device 1 will be described. In the following embodiments, description of the same components as those of the above-described embodiment, which are denoted by like reference numerals, will be omitted or simplified, and differences will be described.

Figure 38:
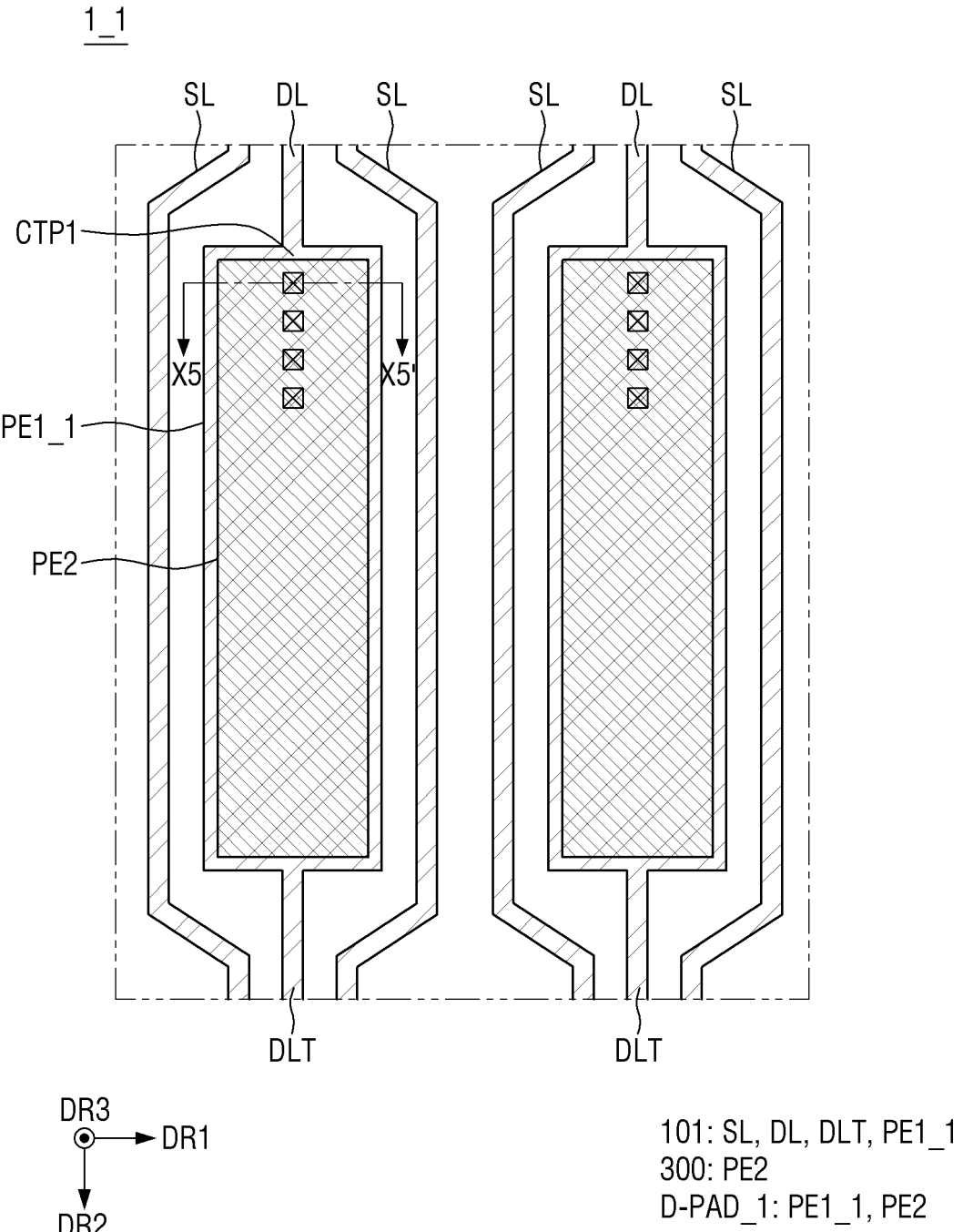
FIG. 38 is an enlarged view of a pad area of a display device according to an embodiment.
Figure 39:
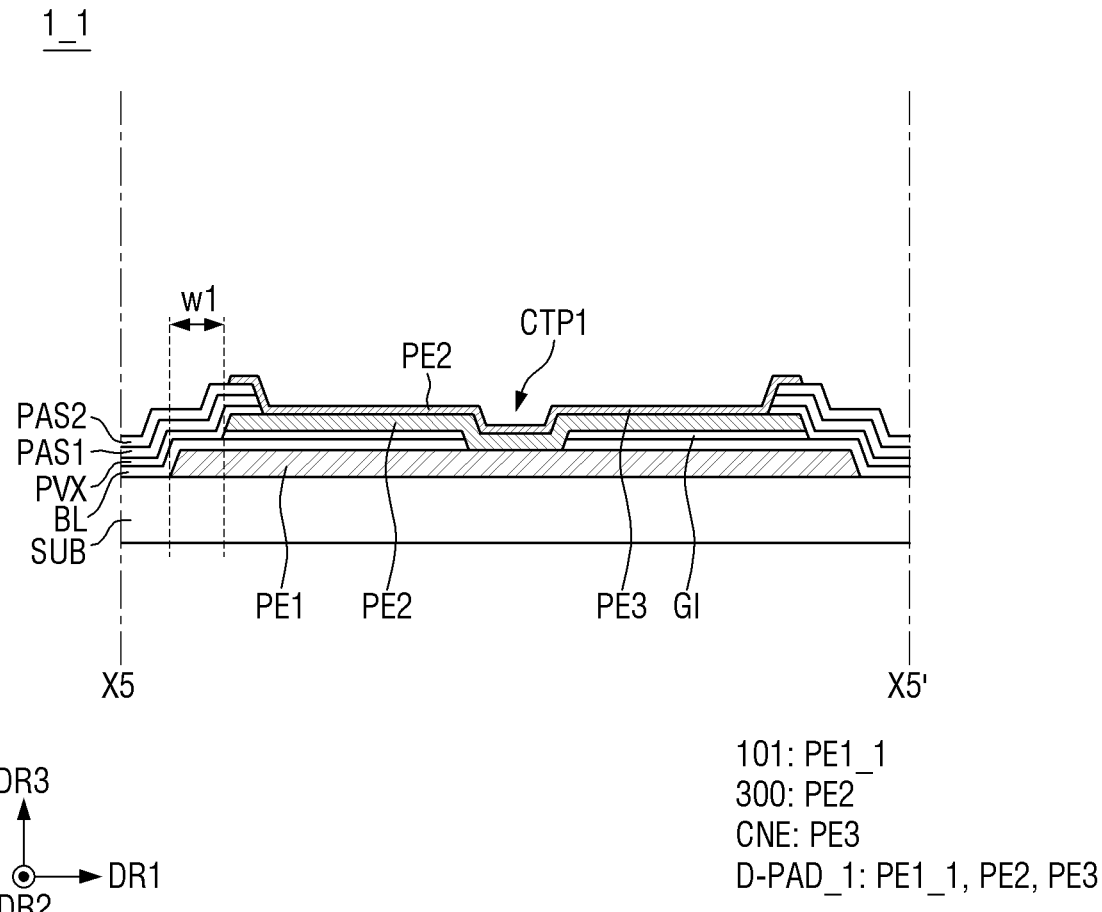
FIG. 39 is a schematic cross-sectional view schematically illustrating a cross section taken along line X5-X5' of FIG. 38.

FIG. 38 is an enlarged view of a pad area of a display device according to an embodiment. FIG. 39 is a schematic cross-sectional view schematically illustrating a cross section taken along line X5-X5' of FIG. 38.

Referring to FIGS. 38 and 39, it is illustrated that the area of a first pad electrode PE1_1 of a display device 1_1 according to an embodiment may be larger than the area of the second pad electrode PE2. For example, in case that viewed from the third direction DR3, the second pad electrode PE2 may be disposed to be overlapped on the first pad electrode PE1_1, and the first pad electrode PE1_1 may partially stick out from the edge of the second pad electrode PE2.

For example, the width of the first pad electrode PE1_1 in the first direction DR1 and the width thereof in the second direction DR2 may be larger than the width of the second pad electrode PE2 in the first direction DR1 and the width thereof in the second direction DR2, respectively, and the second pad electrode PE2 may be disposed on the first pad electrode PE1_1 so as not to extend beyond the edge of the first pad electrode PE1_1. Accordingly, as illustrated in FIG. 39, the width of the first pad electrode PE1_1 in the first direction DR1 may be different from the width of the second pad electrode PE2 in the first direction DR1 by a first width w1. For example, the second pad electrode PE2 may be disposed inwards by the first width w1 from the edge of the first pad electrode PE1_1. Due to the difference as much as the first width w1 as stated above, the second pad electrode PE2 may be stably disposed on the first pad electrode PE1_1 so as not to form a step, and may not be etched during the above-described display device manufacturing process. Data pad D-PAD 1 may also include PE1_1, PE2, and PE3.

Figure 40:
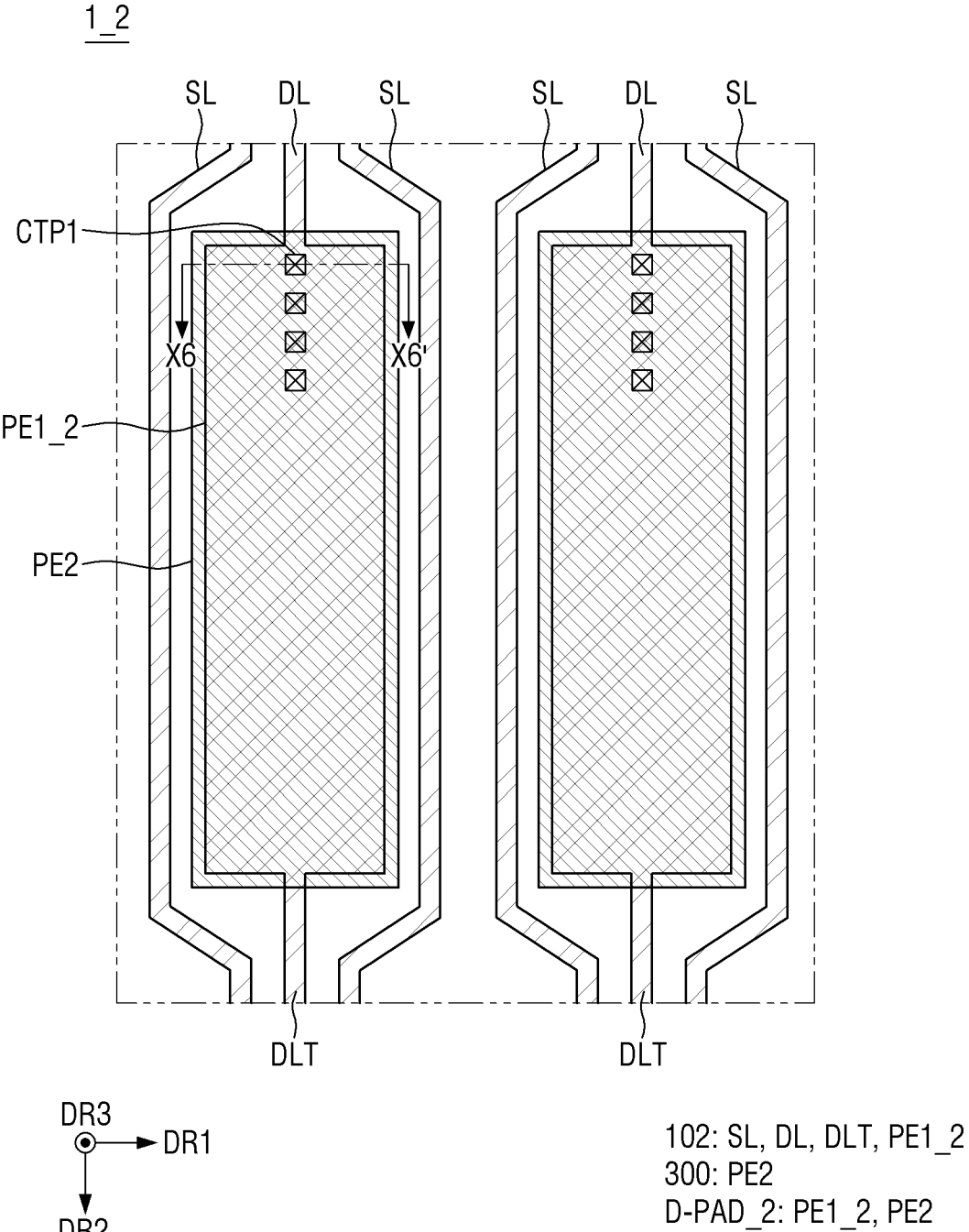
FIG. 40 is an enlarged view of a pad area of a display device according to an embodiment.
Figure 41:
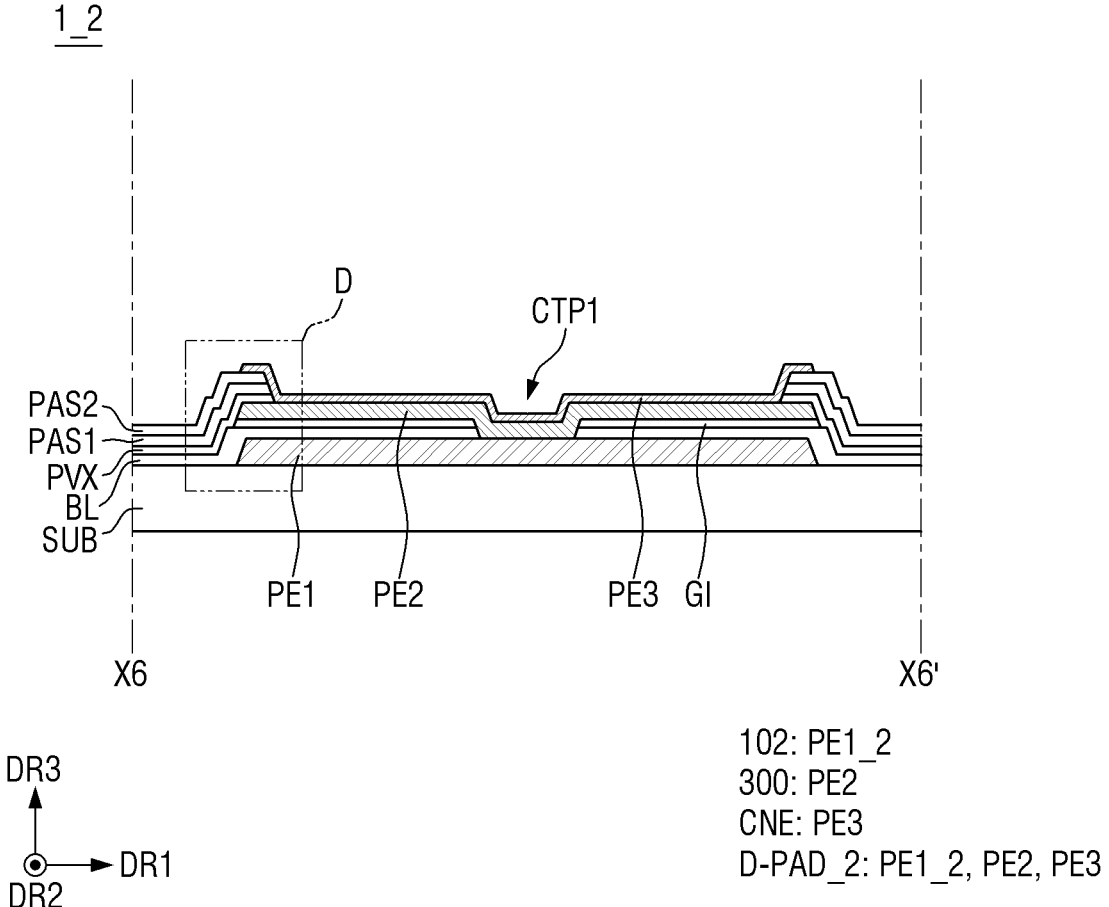
FIG. 41 is a schematic cross-sectional view schematically illustrating a cross section taken along line X6-X6' of FIG. 40.
Figure 42:
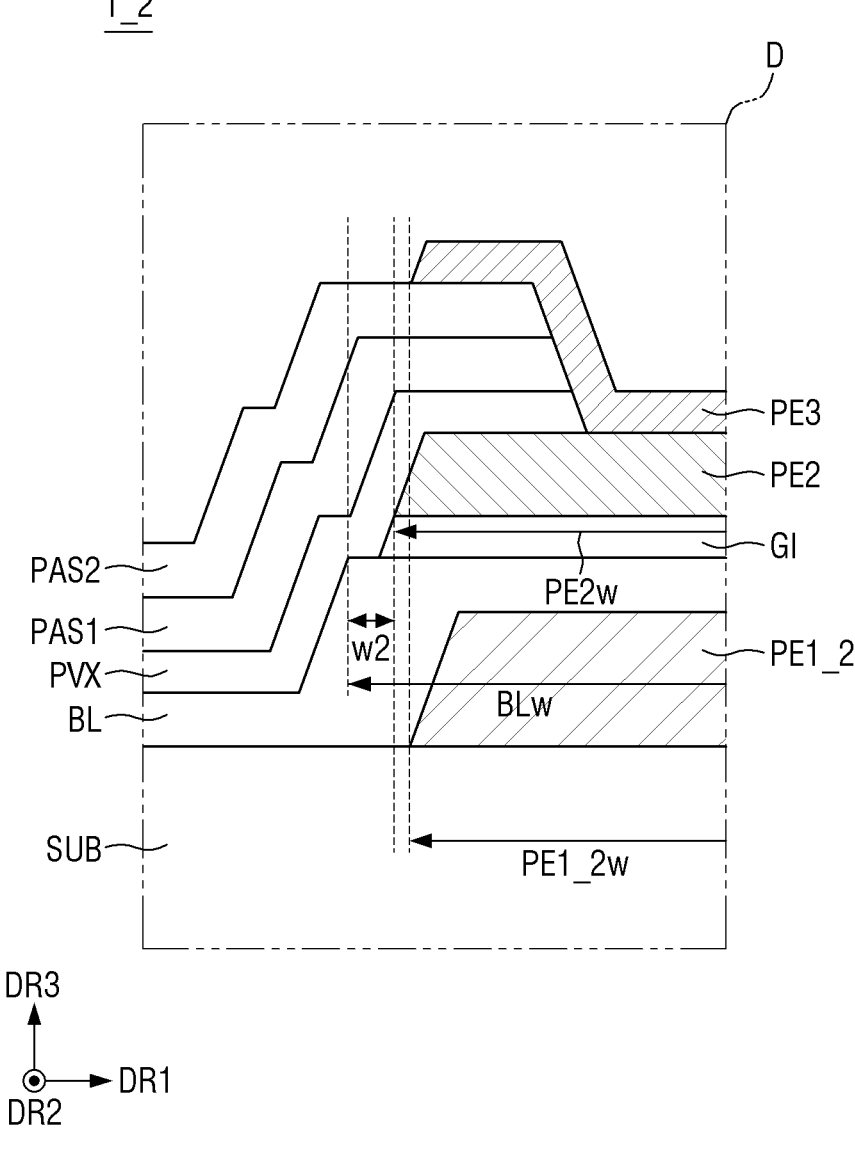
FIG. 42 is an enlarged view of area D of FIG. 41.

FIG. 40 is an enlarged view of a pad area of a display device according to an embodiment. FIG. 41 is a schematic cross-sectional view schematically illustrating a cross section taken along line X6-X6' of FIG. 40. FIG. 42 is an enlarged view of area D of FIG. 41.

Referring to FIGS. 40 to 42, it is illustrated that the area of a first pad electrode PE1_2 of a display device 1_2 according to an embodiment may be smaller than the area of the second pad electrode PE2. For example, in case that viewed from the third direction DR3, the second pad electrode PE2 may be disposed to be overlapped on the first pad electrode PE1_2, and the second pad electrode PE2 may partially stick out from the edge of the first pad electrode PE1_2.

The width of the first pad electrode PE1_2 in the first direction DR1 and the width thereof in the second direction DR2 may be smaller than the width of the second pad electrode PE2 in the first direction DR1 and the width thereof in the second direction DR2, respectively, but no step may be formed at the second pad electrode PE2 due to the buffer layer BL covering the top surface and the side surface of the first pad electrode PE1_2. For example, as illustrated in FIG. 42, the buffer layer BL may include a first portion covering the top surface of the first pad electrode PE1_2, a second portion covering the side surface of the first pad electrode PE1_2, and a third portion covering the top surface of the substrate SUB, and the second pad electrode PE2 may be disposed on the first portion of the buffer layer BL. A width PE1_2w of the first pad electrode PE1_2 in the first direction DR1 may be smaller than a width PE2w of the second pad electrode PE2 in the first direction DR1, and the width PE2w of the second pad electrode PE2 in the first direction DR1 may be smaller than a width BLw of the first portion of the buffer layer BL in the first direction DR1. Accordingly, there may be a difference as much as a second width w2 between the first portion of the buffer layer BL and the second pad electrode PE2, and the second pad electrode PE2 may be disposed inwards by the second width w2 on the first portion of the buffer layer BL so as not to form a step. Accordingly, the second pad electrode PE2 may not be etched during the above-described display device manufacturing process. Data pad D-PAD 2 may also include PE1_2, PE2, and PE3.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:
1. A display device comprising:
a substrate including a display area and a pad area;

a first conductive layer disposed on the substrate, the first conductive layer comprising a first signal line disposed in the display area and a first pad electrode disposed in the pad area;
a buffer layer disposed on the first conductive layer;
a semiconductor layer disposed on the buffer layer in the display area;
a gate insulating layer disposed on the semiconductor layer;
a second conductive layer disposed on the gate insulating layer, wherein the second conductive layer comprises:
a gate electrode overlapping the semiconductor layer in the display area;
a first electrode overlapping on a side of the semiconductor layer in the display area and electrically connected to the first signal line through a contact hole penetrating the buffer layer and the gate insulating layer;
a second electrode disposed on another side of the semiconductor layer in the display area; and
a second pad electrode disposed on the first pad electrode in the pad area, and
the first pad electrode and the second pad electrode overlap in a first direction that is a thickness direction, and do not overlap in a second direction perpendicular to the first direction.

2. The display device of claim 1, wherein a width of the first pad electrode in the second direction is substantially the same as a width of the second pad electrode in the second direction.

3. The display device of claim 2, wherein an area of the first pad electrode and an area of the second pad electrode are substantially the same in a plan view.

4. The display device of claim 1, wherein a width of the first pad electrode in the second direction is greater than a width of the second pad electrode in the second direction.

5. The display device of claim 4, wherein an area of the first pad electrode is larger than an area of the second pad electrode in a plan view.

6. The display device of claim 4, wherein
the semiconductor layer, the gate electrode, the first electrode, and the second electrode form a transistor,
the first pad electrode and the second pad electrode form pads,
the display device comprises a driver applying a data signal and a scan signal to the transistor, and
the pads comprise a data pad receiving the data signal from the driver and a scan pad receiving the scan signal from the driver.

7. The display device of claim 6, wherein
the first conductive layer comprises a data line transmitting the data signal from the data pad and a scan line transmitting the scan signal from the scan pad,
data pads of the pads being spaced apart from each other,
scan pads of the pads being spaced apart from each other, and
the scan line extends across a space between the data pads.

8. The display device of claim 7, wherein the scan line and the first pad electrode of the data pad are spaced apart from each other.

9. The display device of claim 7, wherein
the first conductive layer comprises a data check line extending from the first pad electrode of the data pad, and
the data check line extends across a space between the scan pads.

10. The display device of claim 9, wherein the data check line and the first pad electrode of the scan pad are spaced apart from each other.

11. The display device of claim 1, wherein the buffer layer is disposed between the first pad electrode and the second pad electrode in the pad area, and the first pad electrode and the second pad electrode are electrically connected through a pad contact hole penetrating the buffer layer.

12. The display device of claim 11, further comprising:

a via insulating layer disposed on the second conductive layer in the display area;

an electrode disposed on the via insulating layer in the display area;

a first insulating layer disposed on the electrode; and a light emitting element disposed on the first insulating layer in the display area.

13. The display device of claim 12, further comprising:

a connection electrode layer disposed on the light emitting element, the connection electrode layer comprising:

a connection electrode electrically connected to the light emitting element in the display area; and a third pad electrode disposed on the second pad electrode in the pad area.

14. The display device of claim 13, wherein the third pad electrode is electrically connected to the second pad electrode.

15. The display device of claim 11, wherein the pad contact hole is provided in plural.

16. A manufacturing method of a display device, comprising:

preparing a substrate including a display area and a pad area;

forming a first conductive layer disposed on the substrate, the first conductive layer comprising a first signal line disposed in the display area and a first pad electrode disposed in the pad area;

forming a buffer layer disposed on the first conductive layer;

forming a semiconductor layer disposed on the buffer layer in the display area;

forming a gate insulating layer disposed on the semiconductor layer; and forming a second conductive layer disposed on the gate insulating layer, wherein the second conductive layer comprises:

a gate electrode overlapping the semiconductor layer in the display area;

a first electrode overlapping a side of the semiconductor layer in the display area and electrically connected to the first signal line through a contact hole penetrating the buffer layer and the gate insulating layer;

a second electrode disposed on another side of the semiconductor layer in the display area; and a second pad electrode disposed on the first pad electrode in the pad area, and the first pad electrode and the second pad electrode overlap in a first direction that is a thickness direction, and do not overlap in a second direction perpendicular to the first direction.

17. The manufacturing method of claim 16, wherein a width of the first pad electrode in the second direction is substantially the same as a width of the second pad electrode in the second direction.

18. The manufacturing method of claim 17, wherein an area of the first pad electrode and an area of the second pad electrode are substantially the same in a plan view.

19. The manufacturing method of claim 16, wherein a width of the first pad electrode in the second direction is greater than a width of the second pad electrode in the second direction.

20. The manufacturing method of claim 19, wherein an area of the first pad electrode is larger than an area of the second pad electrode in a plan view.

* * * * *